US009343691B2

(12) United States Patent
Seo et al.

(10) Patent No.: US 9,343,691 B2
(45) Date of Patent: May 17, 2016

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Satoshi Seo, Kanagawa (JP); Toshiki Sasaki, Kanagawa (JP); Nobuharu Ohsawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/817,677

(22) Filed: Aug. 4, 2015

(65) Prior Publication Data
US 2016/0043338 A1 Feb. 11, 2016

(30) Foreign Application Priority Data

Aug. 8, 2014 (JP) .................. 2014-162234
Aug. 8, 2014 (JP) .................. 2014-162237

(51) Int. Cl.
H01L 27/15 (2006.01)
H01L 31/062 (2012.01)
(Continued)

(52) U.S. Cl.
CPC ............ *H01L 51/504* (2013.01); *H01L 27/322* (2013.01); *H01L 27/323* (2013.01); *H01L 27/3211* (2013.01); *H01L 51/5215* (2013.01);
(Continued)

(58) Field of Classification Search
CPC ............ H01L 2924/00; H01L 51/5012; H01L 51/5036; H01L 2924/12041; H01L 33/504; Y10S 428/917; G01N 2021/6421

USPC .......... 257/13, 79–84, 87–89, 184, 290, 414, 257/432, 436, 451; 438/22–29, 49, 57
See application file for complete search history.

(56) References Cited

U.S. PATENT DOCUMENTS 6,847,163 B1 1/2005 Tsutsui et al.
7,271,537 B2 9/2007 Matsuda et al.
(Continued)

FOREIGN PATENT DOCUMENTS

JP 2012-182127 A 9/2012

OTHER PUBLICATIONS

Kashiwabara.M et al., "29.5L: Late-News Paper: Advanced AM-OLED Display Based on White Emitter With Microcavity Structure", SID Digest '04 : SID International Symposium Digest of Technical Papers, 2004, vol. 35, pp. 1017-1019.

*Primary Examiner* — Hsien Ming Lee
(74) *Attorney, Agent, or Firm* — Fish & Richardson P.C.

(57) ABSTRACT

A novel light-emitting device is provided. A novel light-emitting device with high emission efficiency, low power consumption, and small viewing angle dependence of chromaticity is provided. The light-emitting device includes at least one light-emitting element and one optical element. A spectrum of light emitted from the light-emitting element through the optical element in a range of greater than 0° and less than or equal to 70° with respect to a normal vector of the light-emitting element has a first local maximum value in a wavelength range of greater than or equal to 400 nm and less than 480 nm and a second local maximum value located on a longer wavelength side than the first local maximum value. The intensity ratio of the second local maximum value to the first local maximum value is less than or equal to 15%.

21 Claims, 57 Drawing Sheets

(51) Int. Cl.
  *H01L 31/0232*  (2014.01)
  *H01L 21/00*    (2006.01)
  *H01L 51/50*    (2006.01)
  *H01L 27/32*    (2006.01)
  *H01L 51/52*    (2006.01)

(52) U.S. Cl.
  CPC ........ *H01L 51/5218* (2013.01); *H01L 51/5221* (2013.01); *H01L 51/5237* (2013.01); *H01L 51/5265* (2013.01); *H01L 2251/301* (2013.01)

(56) References Cited

U.S. PATENT DOCUMENTS

| | | |
|---|---|---|
| 7,462,883 B2 | 12/2008 | Kumaki et al. |
| 7,554,265 B2 | 6/2009 | Godo et al. |
| 7,564,052 B2 | 7/2009 | Kumaki et al. |
| 7,601,988 B2 | 10/2009 | Seo et al. |
| 7,851,989 B2 | 12/2010 | Noda |
| 7,893,427 B2 | 2/2011 | Kumaki et al. |
| 7,973,319 B2 | 7/2011 | Kashiwabara et al. |
| 8,080,934 B2 | 12/2011 | Kido et al. |
| 8,789,968 B2 | 7/2014 | Ohsawa et al. |
| 8,957,442 B2 | 2/2015 | Seo et al. |
| 9,000,458 B2 | 4/2015 | Seo et al. |
| 9,006,755 B2 | 4/2015 | Seo et al. |
| 2005/0082974 A1* | 4/2005 | Fukasawa ............ G03B 27/72 313/512 |
| 2005/0218799 A1 | 10/2005 | Hamada |
| 2006/0163597 A1 | 7/2006 | Noda et al. |
| 2006/0284204 A1 | 12/2006 | Yamazaki et al. |
| 2007/0001570 A1 | 1/2007 | Nomura et al. |
| 2007/0069996 A1 | 3/2007 | Kuba et al. |
| 2007/0176161 A1 | 8/2007 | Seo et al. |
| 2011/0062475 A1 | 3/2011 | Cho |
| 2011/0187259 A1 | 8/2011 | Fukuda et al. |
| 2011/0187260 A1 | 8/2011 | Fukuda et al. |
| 2012/0205701 A1 | 8/2012 | Sasaki et al. |
| 2012/0206675 A1 | 8/2012 | Seo et al. |
| 2012/0223346 A1 | 9/2012 | Ohsawa et al. |
| 2012/0235126 A1 | 9/2012 | Yamazaki et al. |
| 2012/0256208 A1 | 10/2012 | Hatano |
| 2015/0333229 A1 | 11/2015 | Seo et al. |

* cited by examiner

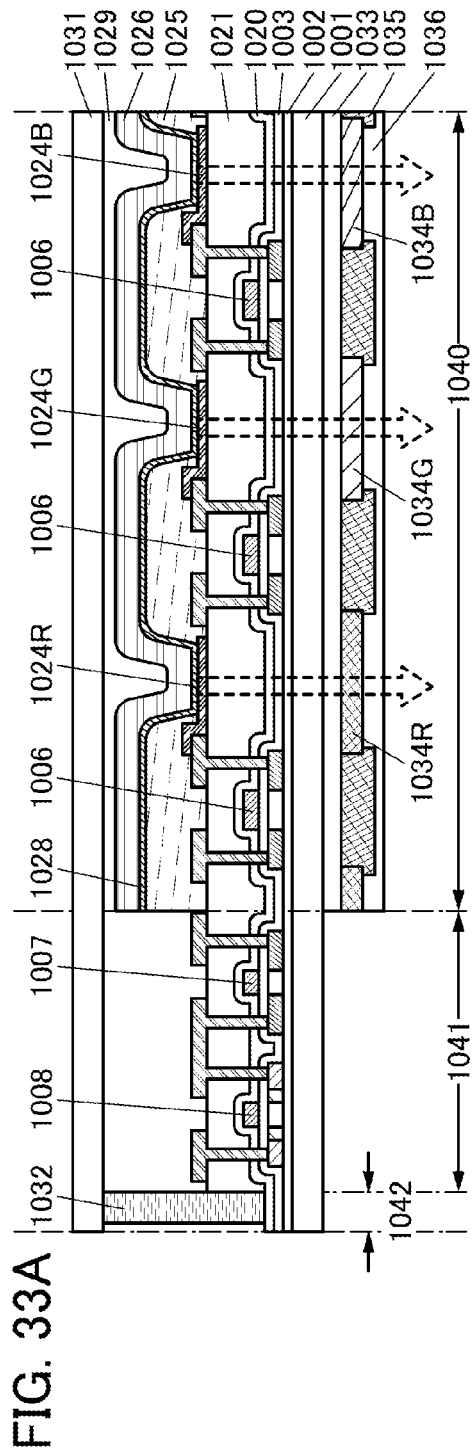
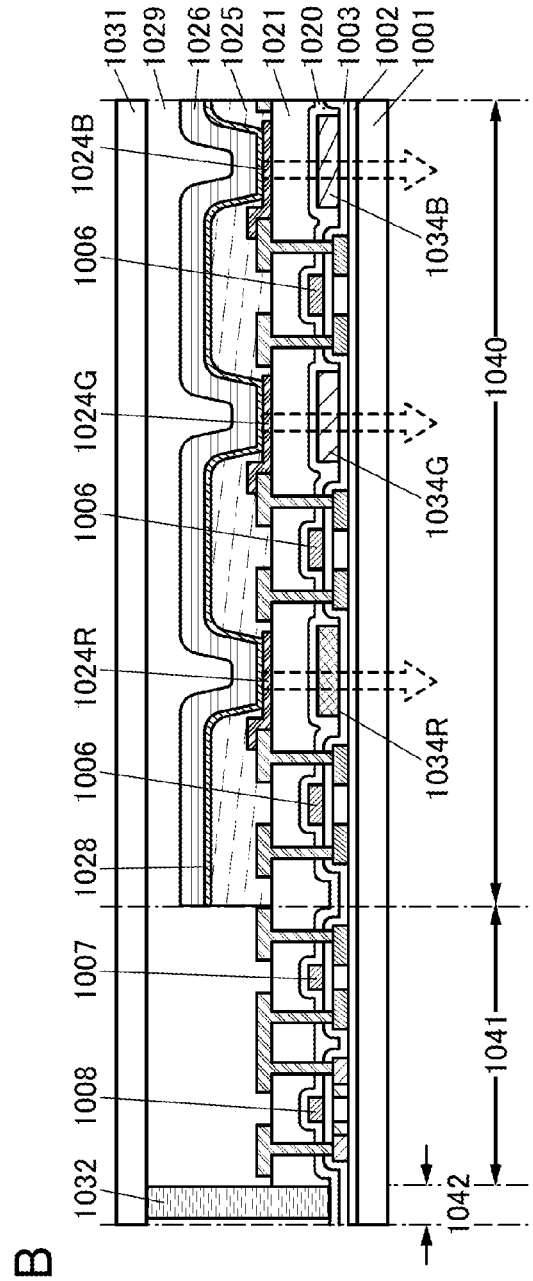
FIG. 33A
FIG. 33B

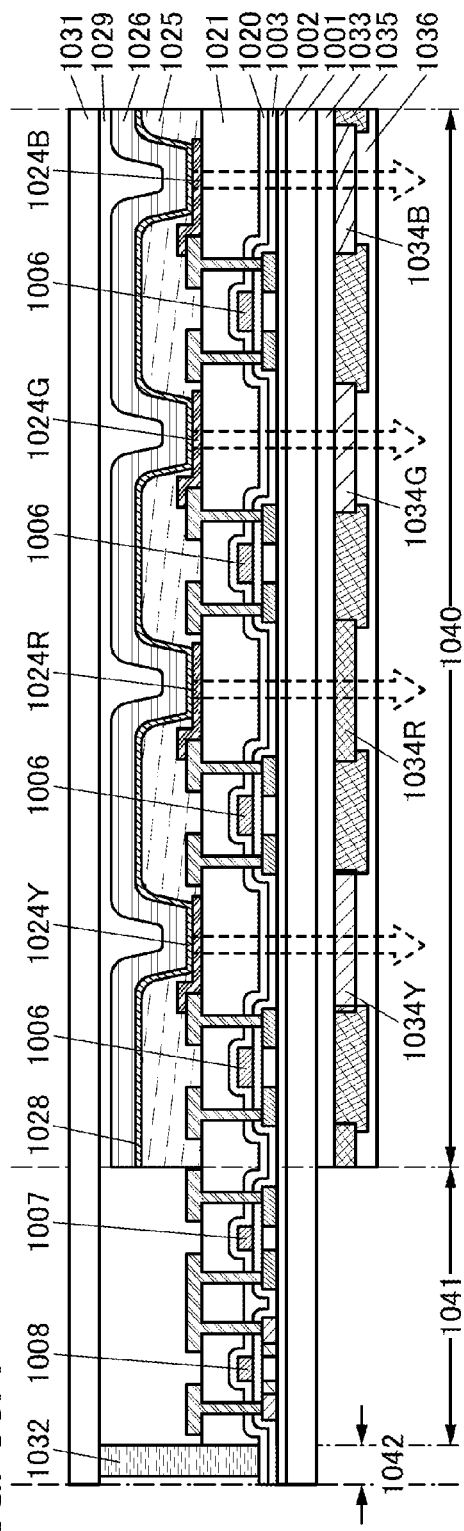
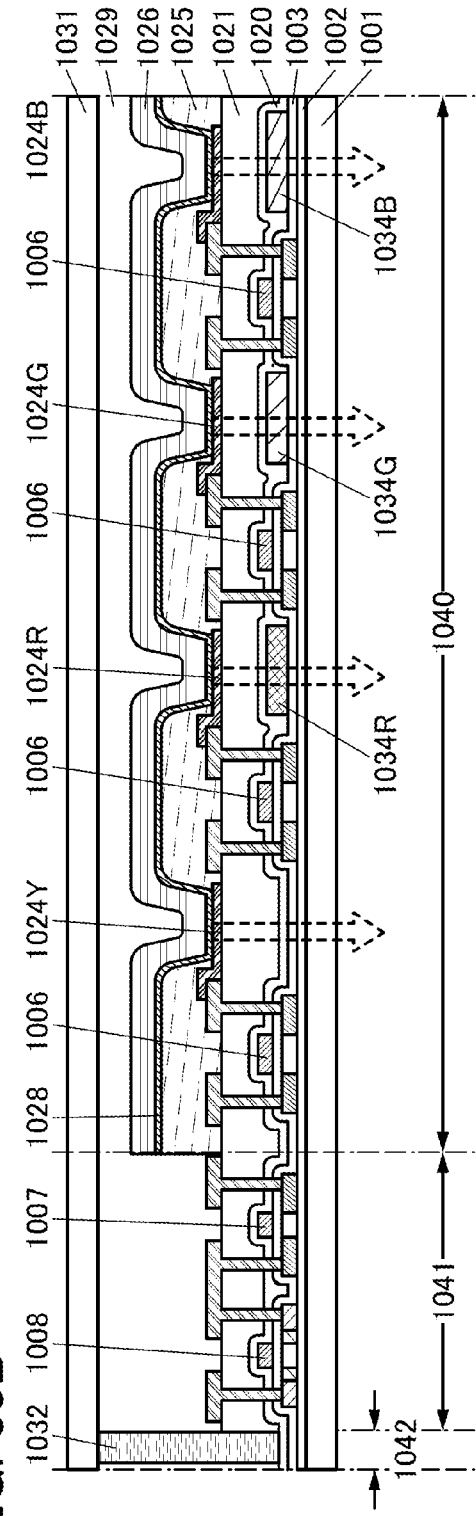
FIG. 35A
FIG. 35B

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

One embodiment of the present invention relates to a light-emitting element in which a light-emitting layer capable of providing light emission by application of an electric field is provided between a pair of electrodes, and also relates to a light-emitting device, an electronic device, and a lighting device each including such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By applying a voltage to this element, light emission from the light-emitting substance can be obtained.

Since the above light-emitting element is a self-luminous type, a light-emitting device using this light-emitting element has advantages such as high visibility, no necessity of a backlight, low power consumption, and the like. Further, such a light-emitting element also has advantages in that the element can be formed to be thin and lightweight, and that response time is high.

In order to improve the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 1).

REFERENCE

Patent Document

[Patent Document 1] Japanese Published Patent Application No. 2012-182127

SUMMARY OF THE INVENTION

In the case where a micro optical resonator structure (hereinafter referred to as a microcavity structure) utilizing a resonant effect of light between the pair of electrodes is used in a light-emitting element, desired light can be extracted in a direction parallel to the normal vector of the light-emitting element by the resonant effect. However, in some cases, light with a wavelength different from that of the desired light is extracted in a position shifted from the normal vector of the light-emitting element, i.e., in a position away from the normal vector of the light-emitting element. In a light-emitting device including such a light-emitting element, viewing angle dependence of chromaticity occurs in some cases.

In view of the above problems, an object of one embodiment of the present invention is to provide a novel light-emitting device. Another object is to provide a novel light-emitting device with high emission efficiency, low power consumption, and small viewing angle dependence of chromaticity. Another object is to provide a novel method for manufacturing a light-emitting device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a light-emitting device including at least one light-emitting element and at least one optical element. A spectrum of light emitted from the light-emitting element through the optical element in a range of greater than 0° and less than or equal to 70° with respect to a normal vector of the light-emitting element has a first local maximum value in a wavelength range of greater than or equal to 400 nm and less than 480 nm and a second local maximum value located on a longer wavelength side than the first local maximum value. The intensity ratio of the second local maximum value to the first local maximum value is less than or equal to 15%. Details of the light-emitting device are described below.

One embodiment of the present invention is a light-emitting device including a first light-emitting element, a second light-emitting element, a third light-emitting element, a first optical element, a second optical element, and a third optical element. A spectrum of light emitted from the first light-emitting element through the first optical element has a first local maximum value in a wavelength range of greater than or equal to 600 nm and less than or equal to 740 nm. A spectrum of light emitted from the second light-emitting element through the second optical element has a second local maximum value in a wavelength range of greater than or equal to 480 nm and less than 550 nm. A spectrum of light emitted from the third light-emitting element through the third optical element in a range of greater than 0° and less than or equal to 70° with respect to a normal vector of the third light-emitting element has a third local maximum value in a wavelength range of greater than or equal to 400 nm and less than 480 nm and a fourth local maximum value located on a longer wavelength side than the third local maximum value. An intensity ratio of the fourth local maximum value to the third local maximum value is less than or equal to 15%.

In the above-described structure, it is preferable that the first optical element have a region whose transmittance with respect to light with a wavelength of greater than or equal to 570 nm and less than or equal to 800 nm is greater than or equal to 50%, that the second optical element have a region whose transmittance with respect to light with a wavelength of greater than or equal to 480 nm and less than 570 nm is greater than or equal to 50%, and that the third optical element have a region whose transmittance with respect to light with a wavelength of greater than or equal to 400 nm and less than 480 nm is greater than or equal to 50% and a region whose transmittance with respect to light with a wavelength of greater than or equal to 530 nm and less than or equal to 680 nm is less than or equal to 20%.

In the above-described structures, it is preferable that the first light-emitting element include a first lower electrode, a first transparent conductive film over the first lower electrode, a first light-emitting layer over the first transparent conductive film, a second light-emitting layer over the first light-emitting layer, and an upper electrode over the second light-emitting layer, that the second light-emitting element include a second lower electrode, a second transparent conductive film over the second lower electrode, the first light-emitting layer over the second transparent conductive film, the second light-emitting layer over the first light-emitting layer, and the upper electrode over the second light-emitting layer, and that the third light-emitting element include a third lower electrode, a third transparent conductive film over the third lower electrode, the first light-emitting layer over the third transparent conductive film, the second light-emitting layer over the first light-emitting layer, and the upper electrode over the second light-emitting layer.

In the above-described structure, it is preferable that a charge-generation layer be provided between the first light-emitting layer and the second light-emitting layer.

In the above-described structures, it is preferable that the first light-emitting element include a first lower electrode, a first transparent conductive film over the first lower electrode, a first light-emitting layer over the first transparent conductive film, a second light-emitting layer over the first light-emitting layer, a third light-emitting layer over the second light-emitting layer, and an upper electrode over the third light-emitting layer, that the second light-emitting element include a second lower electrode, a second transparent conductive film over the second lower electrode, the first light-emitting layer over the second transparent conductive film, the second light-emitting layer over the first light-emitting layer, the third light-emitting layer over the second light-emitting layer, and the upper electrode over the third light-emitting layer, and that the third light-emitting element include a third lower electrode, a third transparent conductive film over the third lower electrode, the first light-emitting layer over the third transparent conductive film, the second light-emitting layer over the first light-emitting layer, the third light-emitting layer over the second light-emitting layer, and the upper electrode over the third light-emitting layer.

In the above-described structure, it is preferable that a charge-generation layer be provided between the first light-emitting layer and the second light-emitting layer, and that the second light-emitting layer and the third light-emitting layer be in contact with each other.

In the above-described structures, it is preferable that a spectrum of light emitted from the first light-emitting layer have a peak in a wavelength range of blue, and that a spectrum of light emitted from the second light-emitting layer have a peak in a wavelength range of yellow. In the above-described structures, it is preferable that a spectrum of light emitted from the first light-emitting layer have a peak in a wavelength range of blue, that a spectrum of light emitted from the second light-emitting layer have a peak in a wavelength range of green, and that a spectrum of light emitted from the third light-emitting layer have a peak in a wavelength range of red.

In the above-described structures, it is preferable that the first lower electrode, the second lower electrode, and the third lower electrode each have a function of reflecting visible light, and that the upper electrode have a function of reflecting visible light and a function of transmitting visible light. In the above-described structures, it is preferable that the first lower electrode, the second lower electrode, and the third lower electrode each contain silver.

In the above-described structures, it is preferable that a thickness of the third transparent conductive film be larger than a thickness of the first transparent conductive film and a thickness of the second transparent conductive film. In the above-described structures, it is preferable that a distance between the third lower electrode and the first light-emitting layer be longer than a distance between the first lower electrode and the first light-emitting layer and a distance between the second lower electrode and the first light-emitting layer.

In the above-described structures, it is preferable that an optical path length between the first lower electrode and the third light-emitting layer be around $3\lambda_R/4$ ($\lambda_R$ represents a wavelength of red light), that an optical path length between the second lower electrode and the second light-emitting layer be around $3\lambda_G/4$ ($\lambda_G$ represents a wavelength of green light), and that an optical path length between the third lower electrode and the first light-emitting layer be around $3\lambda_B/4$ ($\lambda_B$ represents a wavelength of blue light).

Another embodiment of the present invention is a light-emitting device including a first light-emitting element, a second light-emitting element, a third light-emitting element, a fourth light-emitting element, a first optical element, a second optical element, a third optical element, and a fourth optical element. A spectrum of light emitted from the first light-emitting element through the first optical element has a first local maximum value in a wavelength range of greater than or equal to 600 nm and less than or equal to 740 nm. A spectrum of light emitted from the second light-emitting element through the second optical element has a second local maximum value in a wavelength range of greater than or equal to 480 nm and less than 550 nm. A spectrum of light emitted from the third light-emitting element through the third optical element in a range of greater than 0° and less than or equal to 70° with respect to a normal vector of the third light-emitting element has a third local maximum value in a wavelength range of greater than or equal to 400 nm and less than 480 nm and a fourth local maximum value located on a longer wavelength side than the third local maximum value. A spectrum of light emitted from the fourth light-emitting element through the fourth optical element has a fifth local maximum value in a wavelength range of greater than or equal to 550 nm and less than 600 nm. An intensity ratio of the fourth local maximum value to the third local maximum value is less than or equal to 15%.

Another embodiment of the present invention is a light-emitting device including a first light-emitting element, a second light-emitting element, a third light-emitting element, a fourth light-emitting element, a first optical element, a second optical element, and a third optical element. A spectrum of light emitted from the first light-emitting element through the first optical element has a first local maximum value in a wavelength range of greater than or equal to 600 nm and less than or equal to 740 nm. A spectrum of light emitted from the second light-emitting element through the second optical element has a second local maximum value in a wavelength range of greater than or equal to 480 nm and less than 550 nm. A spectrum of light emitted from the third light-emitting element through the third optical element in a range of greater than 0° and less than or equal to 70° with respect to a normal vector of the third light-emitting element has a third local maximum value in a wavelength range of greater than or equal to 400 nm and less than 480 nm and a fourth local maximum value located on a longer wavelength side than the third local maximum value. Light emitted from the fourth light-emitting element does not pass through the first optical element, the second optical element, or the third optical element, and its spectrum has a fifth local maximum value in a wavelength range of greater than or equal to 550 nm and less than 600 nm. An intensity ratio of the fourth local maximum value to the third local maximum value is less than or equal to 15%.

In the above-described structures, it is preferable that the first optical element have a region whose transmittance with respect to light with a wavelength of greater than or equal to 570 nm and less than or equal to 800 nm is greater than or equal to 50%, that the second optical element have a region whose transmittance with respect to light with a wavelength of greater than or equal to 480 nm and less than 570 nm is greater than or equal to 50%, and that the third optical element have a region whose transmittance with respect to light with a wavelength of greater than or equal to 400 nm and less than 480 nm is greater than or equal to 50% and a region whose transmittance with respect to light with a wavelength of greater than or equal to 530 nm and less than or equal to 680 nm is less than or equal to 20%.

In the above-described structures, it is preferable that the first light-emitting element include a first lower electrode, a first transparent conductive film over the first lower electrode, a first light-emitting layer over the first transparent conductive film, a second light-emitting layer over the first light-emitting layer, and an upper electrode over the second light-emitting layer, that the second light-emitting element include a second lower electrode, a second transparent conductive film over the second lower electrode, the first light-emitting layer over the second transparent conductive film, the second light-emitting layer over the first light-emitting layer, and the upper electrode over the second light-emitting layer, that the third light-emitting element include a third lower electrode, a third transparent conductive film over the third lower electrode, the first light-emitting layer over the third transparent conductive film, the second light-emitting layer over the first light-emitting layer, and the upper electrode over the second light-emitting layer, and that the fourth light-emitting element include a fourth lower electrode, a fourth transparent conductive film over the fourth lower electrode, the first light-emitting layer over the fourth transparent conductive film, the second light-emitting layer over the first light-emitting layer, and the upper electrode over the second light-emitting layer.

In the above structure, it is preferable that a charge-generation layer be provided between the first light-emitting layer and the second light-emitting layer.

In the above-described structures, it is preferable that the first light-emitting element include a first lower electrode, a first transparent conductive film over the first lower electrode, a first light-emitting layer over the first transparent conductive film, a second light-emitting layer over the first light-emitting layer, a third light-emitting layer over the second light-emitting layer, and an upper electrode over the third light-emitting layer, that the second light-emitting element include a second lower electrode, a second transparent conductive film over the second lower electrode, the first light-emitting layer over the second transparent conductive film, the second light-emitting layer over the first light-emitting layer, the third light-emitting layer over the second light-emitting layer, and the upper electrode over the third light-emitting layer, that the third light-emitting element include a third lower electrode, a third transparent conductive film over the third lower electrode, the first light-emitting layer over the third transparent conductive film, the second light-emitting layer over the first light-emitting layer, the third light-emitting layer over the second light-emitting layer, and the upper electrode over the third light-emitting layer, and that the fourth light-emitting element include a fourth lower electrode, a fourth transparent conductive film over the fourth lower electrode, the first light-emitting layer over the fourth transparent conductive film, the second light-emitting layer over the first light-emitting layer, the third light-emitting layer over the second light-emitting layer, and the upper electrode over the third light-emitting layer.

In the above-described structure, it is preferable that a charge-generation layer be provided between the first light-emitting layer and the second light-emitting layer, and that the second light-emitting layer and the third light-emitting layer be in contact with each other.

In the above-described structures, it is preferable that a spectrum of light emitted from the first light-emitting layer have a peak in a wavelength range of blue, and that a spectrum of light emitted from the second light-emitting layer have a peak in a wavelength range of yellow. In the above-described structures, it is preferable that a spectrum of light emitted from the first light-emitting layer has a peak in a wavelength range of blue, that a spectrum of light emitted from the second light-emitting layer has a peak in a wavelength range of green, and that a spectrum of light emitted from the third light-emitting layer has a peak in a wavelength range of red.

In the above-described structures, it is preferable that the first lower electrode, the second lower electrode, the third lower electrode, and the fourth lower electrode each have a function of reflecting visible light, and that the upper electrode have a function of reflecting visible light and a function of transmitting visible light. In the above-described structures, it is preferable that the first lower electrode, the second lower electrode, the third lower electrode, and the fourth lower electrode each contain silver.

In the above-described structures, it is preferable that a thickness of the third transparent conductive film be larger than a thickness of the first transparent conductive film, a thickness of the second transparent conductive film, and a thickness of the fourth transparent conductive film. In the above-described structures, it is preferable that a distance between the third lower electrode and the first light-emitting layer be longer than a distance between the first lower electrode and the first light-emitting layer, a distance between the second lower electrode and the first light-emitting layer, and a distance between the fourth lower electrode and the first light-emitting layer.

In the above-described structures, it is preferable that an optical path length between the first lower electrode and the third light-emitting layer be around $3\lambda_R/4$ ($\lambda_R$ represents a wavelength of red light), that an optical path length between the second lower electrode and the second light-emitting layer be around $3\lambda_G/4$ ($\lambda_G$ represents a wavelength of green light), that an optical path length between the third lower electrode and the first light-emitting layer be around $3\lambda_B/4$ ($\lambda_B$ represents a wavelength of blue light), and that an optical path length between the fourth lower electrode and the second light-emitting layer be around $3\lambda_Y/4$ ($\lambda_Y$ represents a wavelength of yellow light).

One embodiment of the present invention also includes, in its category, an electronic device including the light-emitting device with any of the above structures and a housing and/or a touch sensor, or a lighting device including the light-emitting device with any of the above structures and a housing and/or a touch sensor. Note that a light-emitting device in this specification means an image display device or a light source (including a lighting device). In addition, the light-emitting device includes, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

One embodiment of the present invention can provide a novel light-emitting device. Another embodiment of the present invention can provide a novel light-emitting device with high emission efficiency, low power consumption, and small viewing angle dependence of chromaticity. Another embodiment of the present invention can provide a novel method for manufacturing a light-emitting device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 33A and 33B are each a cross-sectional view illustrating a light-emitting device of one embodiment of the present invention.

FIGS. 35A and 35B are each a cross-sectional view illustrating a light-emitting device of one embodiment of the present invention.

DETAILED DESCRIPTION OF THE INVENTION

Figure 1:
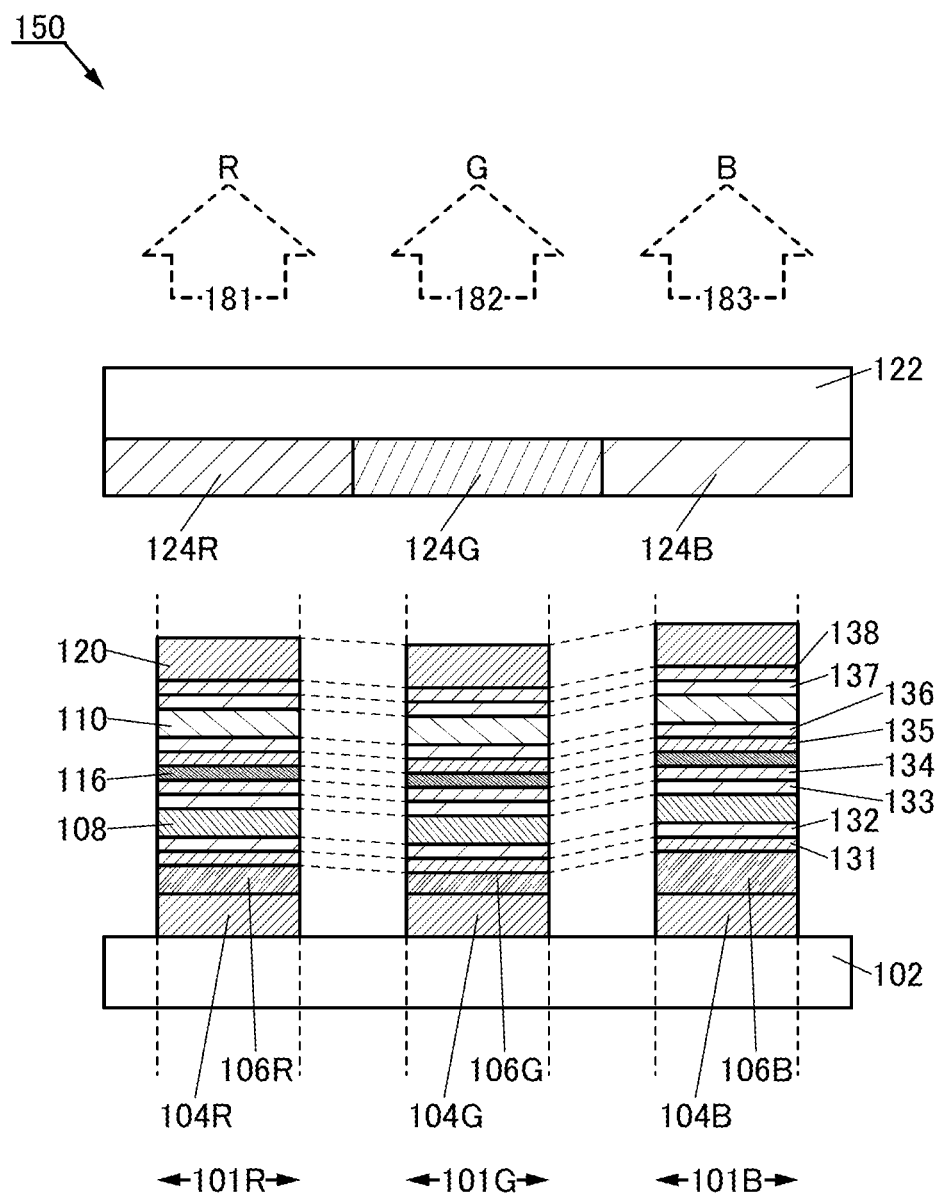
FIG. 1 is a cross-sectional view illustrating a light-emitting device of one embodiment of the present invention.

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In describing structures of the invention with reference to the drawings in this specification and the like, common reference numerals are used for the same portions in different drawings.

In this specification and the like, a wavelength range of blue refers to a wavelength range of greater than or equal to 400 nm and less than 480 nm, and blue light has at least one peak in that wavelength range in an emission spectrum. A wavelength range of green refers to a wavelength range of greater than or equal to 480 nm and less than 550 nm, and green light has at least one peak in that wavelength range in an emission spectrum. A wavelength range of yellow refers to a wavelength range of greater than or equal to 550 nm and less than 600 nm, and yellow light has at least one peak in that wavelength range in an emission spectrum. A wavelength range of red refers to a wavelength range of greater than or equal to 600 nm and less than or equal to 740 nm, and red light has at least one peak in that wavelength range in an emission spectrum.

In this specification and the like, a normal vector of a light-emitting element refers to a direction perpendicular to a surface on which one of a pair of electrodes of the light-emitting element is formed (here, a surface on which an upper electrode on the light extraction side is formed).

In this specification and the like, a transparent conductive film transmits visible light and has conductivity. Examples of the transparent conductive film include an oxide conductor film typified by an indium tin oxide (ITO) film, an oxide semiconductor film, and an organic conductive film containing an organic substance. Examples of the organic conductive film containing an organic substance include a film containing a composite material in which an organic compound and an electron donor (donor) are mixed and a film containing a composite material in which an organic compound and an electron acceptor (acceptor) are mixed. The resistivity of the transparent conductive film is preferably lower than or equal to $1 \times 10^5$ Ω·cm, more preferably lower than or equal to $1 \times 10^4$ Ω·cm.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a light-emitting device of one embodiment of the present invention will be described below with reference to FIGS. 1 to 26, FIGS. 27A to 27D, FIGS. 28A and 28B, FIG. 29, and FIGS. 30A and 30B.

<Structural Example 1 of Light-Emitting Device>

FIG. 1 is a cross-sectional view illustrating a light-emitting device of one embodiment of the present invention. A light-emitting device 150 shown in FIG. 1 includes a light-emitting element 101R, a light-emitting element 101G, a light-emitting element 101B, an optical element 124R, an optical element 124G, and an optical element 124B. Note that the light-emitting elements (the light-emitting element 101R, the light-emitting element 101G, and the light-emitting element 101B) are provided over a substrate 102, and the optical elements (the optical element 124R, the optical element 124G, and the optical element 124B) are provided below a substrate 122.

The light-emitting element 101R includes a lower electrode 104R, a transparent conductive film 106R over the lower electrode 104R, a light-emitting layer 108 over the transparent conductive film 106R, a light-emitting layer 110 over the light-emitting layer 108, and an upper electrode 120 over the light-emitting layer 110. The light-emitting element 101G includes a lower electrode 104G, a transparent conductive film 106G over the lower electrode 104G, the light-emitting layer 108 over the transparent conductive film 106G, the light-emitting layer 110 over the light-emitting layer 108, and the upper electrode 120 over the light-emitting layer 110. The light-emitting element 101B includes a lower electrode 104B, a transparent conductive film 106B over the lower electrode 104B, the light-emitting layer 108 over the transparent conductive film 106B, the light-emitting layer 110 over the light-emitting layer 108, and the upper electrode 120 over the light-emitting layer 110.

In the light-emitting device 150, a hole-injection layer 131 and a hole-transport layer 132 are provided between the transparent conductive films (the transparent conductive film 106R, the transparent conductive film 106G, and the transparent conductive film 106B) and the light-emitting layer 108. Furthermore, an electron-transport layer 133, an electron-injection layer 134, a charge-generation layer 116, a hole-injection layer 135, and a hole-transport layer 136 are provided between the light-emitting layer 108 and the light-emitting layer 110. Furthermore, an electron-transport layer 137 and an electron-injection layer 138 are provided between the light-emitting layer 110 and the upper electrode 120.

In the description below, the layers provided between the pair of electrodes (e.g., the lower electrode 104R and the upper electrode 120) are collectively referred to as an EL layer 100 in some cases.

Note that in an example shown in FIG. 1, the hole-injection layer 131, the hole-transport layer 132, the light-emitting layer 108, the electron-transport layer 133, the electron-injection layer 134, the charge-generation layer 116, the hole-injection layer 135, the hole-transport layer 136, the light-emitting layer 110, the electron-transport layer 137, the electron-injection layer 138, and the upper electrode 120 are each divided to form the light-emitting elements; however, they can also be used without being divided.

In FIG. 1, the lower electrode 104R, the lower electrode 104G, and the lower electrode 104B each have a function of reflecting visible light. The upper electrode 120 has a function of reflecting visible light and a function of transmitting visible light. When the electrodes having a function of reflecting visible light are each formed using a material containing aluminum or silver, the reflectivity can be increased and the emission efficiency of each of the light-emitting elements (the light-emitting element 101R, the light-emitting element 101G, and the light-emitting element 101R) can be increased.

Light 181 emitted from the light-emitting element 101R through the optical element 124R has a wavelength range of light exhibiting a red color. Light 182 emitted from the light-emitting element 101G through the optical element 124G has a wavelength range of light exhibiting light of a green color. Light 183 emitted from the light-emitting element 101B through the optical element 124B has a wavelength range of light exhibiting light of a blue color.

In other words, the optical element 124R, the optical element 124G, and the optical element 124B each have a function of selectively transmitting light exhibiting a particular color out of incident light.

For example, the optical element 124R has a region whose transmittance with respect to light with a wavelength of greater than or equal to 570 nm and less than or equal to 800 nm is higher than or equal to 50%. The optical element 124G has a region whose transmittance with respect to light with a wavelength of greater than or equal to 480 nm and less than 570 nm is higher than or equal to 50%. The optical element 124B has a region whose transmittance with respect to light with a wavelength of greater than or equal to 400 nm and less than 480 nm is higher than or equal to 50% and a region whose transmittance with respect to light with a wavelength of greater than or equal to 530 nm and less than or equal to 680 nm is lower than or equal to 20%.

Note that in FIG. 1, red light (R), green light (G), and blue light (B) emitted from the light-emitting elements through the optical elements are schematically denoted by arrows of dashed lines. The same applies to light-emitting devices described later. The light-emitting device 150 illustrated in FIG. 1 has a top-emission structure in which light emitted from the light-emitting elements is extracted to the side opposite to the substrate 102 side where the light-emitting elements are formed. However, one embodiment of the present invention is not limited to this type, and may have a bottom-emission structure in which light emitted from light-emitting elements is extracted to the substrate 102 side where the light-emitting elements are formed, or a dual-emission structure in which light emitted from light-emitting elements is extracted in both top and bottom directions of the substrate 102 where the light-emitting elements are formed.

A spectrum of the light 181 extracted through the optical element 124R includes a first local maximum value in a wavelength range of greater than or equal to 600 nm and less than or equal to 740 nm. A spectrum of the light 182 extracted through the optical element 124G includes a second local maximum value in a wavelength range of greater than or equal to 480 nm and less than 550 nm. A spectrum of the light 183 extracted through the optical element 124B includes a third local maximum value in a wavelength range of greater than or equal to 400 nm and less than 480 nm and a fourth local maximum value located on the longer wavelength side than the third local maximum value.

For example, the light-emitting layer 108 contains a first light-emitting substance that emits light of at least one of violet, blue, and blue green, and the light-emitting layer 110 contains a second light-emitting substance that emits light of at least one of green, yellow green, yellow, orange, and red. In this case, the light-emitting elements having emission spectra including the above-described local maximum values can be formed. For example, it is preferable that the light-emitting layer 108 contain the first light-emitting substance that emits blue light and the light-emitting layer 110 contain the second light-emitting substance that emits yellow light.

In this manner, an emission spectrum of the light-emitting layer 108 and an emission spectrum of the light-emitting layer 110 are adjusted, so that light close to monochromatic light can be emitted from the light-emitting device 150. Furthermore, white light emission can be obtained by adjusting the emission spectrum of the light-emitting layer 108 and the emission spectrum of the light-emitting layer 110.

The light-emitting element 101R, the light-emitting element 101G, and the light-emitting element 101B in the light-emitting device 150 each have a microcavity structure.

<<Microcavity Structure>>

A microcavity structure will be described below.

Light emitted from the light-emitting layer 108 and the light-emitting layer 110 resonates between a pair of electrodes (e.g., the lower electrode 104R and the upper electrode 120). In the light-emitting device 150, the thickness of each of the transparent conductive film 106R, the transparent conductive film 106G, and the transparent conductive film 106B in the light-emitting elements is adjusted so that the intensity of light emitted from the light-emitting layer 108 and the light-emitting layer 110 can be increased. Note that at least one of the hole-injection layer 131 and the hole-transport layer 132 in light-emitting elements may vary in thickness so that the intensity of light emitted from the light-emitting layer 108 and the light-emitting layer 110 can be increased.

For example, in the case where the refractive index of each of the lower electrodes (the lower electrode 104R, the lower electrode 104G, and the lower electrode 104B) and the upper electrode 120 is lower than the refractive index of the light-emitting layer 108 or the light-emitting layer 110, the thickness of the transparent conductive film 106R is adjusted so that the optical path length between the lower electrode 104R and the upper electrode 120 is $m_R \lambda_R/2$ ($m_R$ is a natural number and $\lambda_R$ is a wavelength of light which should be intensified in the light-emitting element 101R). Furthermore, the thickness of the transparent conductive film 106G is adjusted so that the optical path length between the lower electrode 104G and the upper electrode 120 is $\lambda_G \lambda_G/2$ ($m_G$ is a natural number and $\lambda_G$ is a wavelength of light which is intensified in the light-emitting element 101G). Furthermore, the thickness of the transparent conductive film 106B is adjusted so that the optical path length between the lower electrode 104B and the upper electrode 120 is $m_B \lambda_B/2$ ($m_B$ is a natural number and $\lambda_B$ is a wavelength of light which is intensified in the light-emitting element 101B).

By adjusting the thickness of the transparent conductive film 106R, the optical path length between the lower electrode 104R and the light-emitting layer 110 can be around $3\lambda_R/4$. By adjusting the thickness of the transparent conductive film 106G, the optical path length between the lower electrode 104G and the light-emitting layer 110 can be around $3\lambda_G/4$. By adjusting the thickness of the transparent conductive film 106B, the optical path length between the lower electrode 104B and the light-emitting layer 108 can be around $3\lambda_B/4$.

In other words, the thickness of the transparent conductive film 106B can be larger than the thickness of the transparent conductive film 106R and the thickness of the transparent conductive film 106G.

With the above-described optical path lengths, an optical path length of $2\lambda_R/2$ (i.e., $\lambda_R$) is achieved between the lower electrode 104R and the upper electrode 120, an optical path length of $2\lambda_G/2$ (i.e., $\lambda_G$) is achieved between the lower electrode 104G and the upper electrode 120, and an optical path length of $3\lambda_B/2$ (i.e., $1.5\lambda_B$) is achieved between the lower electrode 104B and the upper electrode 120 in the light-emitting device 150.

Furthermore, with the above-described optical path lengths, the distance between the lower electrode 104B and the light-emitting layer 108 can be longer than the distance between the lower electrode 104R and the light-emitting layer 108 and the distance between the lower electrode 104G and the light-emitting layer 108.

For example, when the optical path length between the lower electrode 104B and the light-emitting layer 108 is around $\lambda_B/4$, light is scattered or absorbed in the vicinity of a surface of the lower electrode 104B, resulting in lower light extraction efficiency. The reason for this is as follows. When a metal film with high reflectivity (e.g., a metal film containing silver) is used as one of a pair of electrodes, light might be scattered or absorbed at or near a surface of the metal film with high reflectivity under the influence of surface plasmon resonance (SPR), resulting in lower light extraction efficiency.

However, in the light-emitting device 150, the optical path length between the lower electrode 104B and the light-emitting layer 108 is around $3\lambda_B/4$ as described above. Therefore, scattering or absorption of light in the vicinity of the lower electrode 104B can be suppressed, resulting in high light extraction efficiency. Accordingly, in the light-emitting element 101B, blue light can be efficiently extracted from the light-emitting layer 108.

Note that, to be exact, the optical path length between the lower electrodes (the lower electrode 104R, the lower electrode 104G, and the lower electrode 104B) and the upper electrode 120 is represented by the product of the distance between a reflective region in the lower electrode and a reflective region in the upper electrode 120 and the refractive index. However, it is difficult to exactly determine the reflective regions in the lower electrode and the upper electrode 120; therefore, positions in the lower electrode and the upper electrode 120 are determined as the reflective regions. Thus, the above-described effect can be achieved.

That is, in this specification and the like, "around $\lambda_z$ (z is R, G, or B)" is $\lambda_z \pm 20$ nm.

Similarly, to be exact, the optical path length between the lower electrode and the light-emitting layer (the light-emitting layer 108 or the light-emitting layer 110) is represented by the product of the distance between the reflective region in the lower electrode and a light-emitting region in the light-emitting layer and the refractive index.

In this manner, the optical path length between the lower electrode and the upper electrode is adjusted in each light-emitting element of the light-emitting device 150 shown in FIG. 1, so that scattering or absorption of light at or near the lower electrode can be suppressed, resulting in high light extraction efficiency.

However, in the light-emitting element 101B, the thickness of the transparent conductive film 106B is adjusted so that the optical path length between the lower electrode 104B and the light-emitting layer 108 is around $3\lambda_B/4$; thus, the optical path length between the lower electrode 104B and the upper electrode 120 is around $3\lambda_B/2$. At this time, in the case where the optical path length between the lower electrode 104R and the upper electrode 120 in the other light-emitting element, e.g., in the light-emitting element 101R is around $2\lambda_R/2$ and $\lambda_R$ is approximately 1.5 times as large as $\lambda_B$, the optical path length between the lower electrode 104B and the upper electrode 120 in the light-emitting element 101B is substantially the same as the optical path length between the lower electrode 104R and the upper electrode 120 in the light-emitting element 101R. In that case, because each of the light-emitting element 101B and the light-emitting element 101R has the light-emitting layer 108 and the light-emitting layer 110, light with a wavelength of around $\lambda_B$ and light with a wavelength of around $\lambda_R$ are emitted from the light-emitting element 101B at the same time. Therefore, the light-emitting element 101B emits light having the third local maximum value around $\lambda_B$ and the fourth local maximum value located on the longer wavelength side than $\lambda_B$. When the fourth local maximum value located on the longer wavelength side than $\lambda_B$ has high intensity, color purity is decreased.

Note that in the light-emitting device 150 of one embodiment of the present invention, light emitted from the light-emitting element 101B is extracted through the optical element 124B. Therefore, the transmittance of light in a wavelength range of $\lambda_B$ is made higher than the transmittance of light in a wavelength range of $\lambda_R$ in the optical element 124B, resulting in high color purity.

Light emitted from the light-emitting element in a front direction and light emitted from the light-emitting element in an oblique direction exhibit different emission spectra and emission colors. This is because the resonant wavelength in a microcavity structure is changed between the front direction and the oblique direction. That is, the viewing angle dependence of the emission spectrum and chromaticity occurs. The cause of the viewing angle dependence is described with reference to FIG. 2.

<<Viewing Angle Dependence of Emission Spectrum and Chromaticity>>

Figure 2:
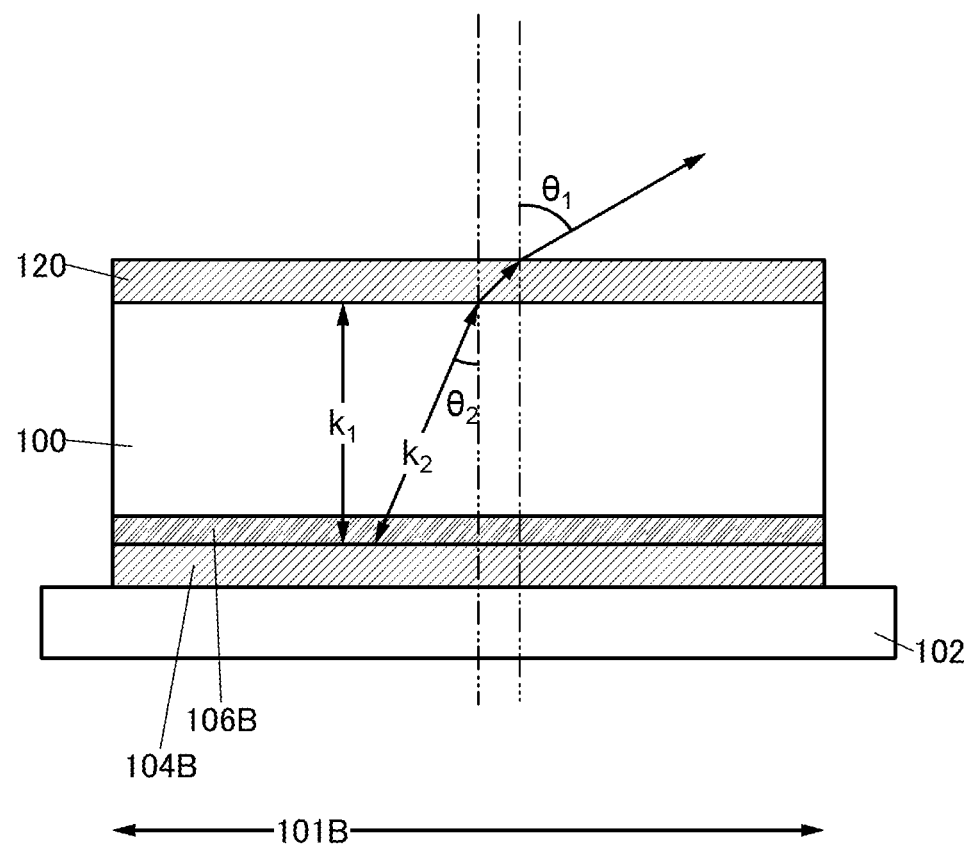
FIG. 2 is a schematic cross-sectional view illustrating viewing angle dependence of an emission spectrum and chromaticity.

In FIG. 2, the light-emitting element 101B is used as an example. In the case where the microcavity structure is employed in the light-emitting element 101B, a wave vector of light that resonates in the front direction of a light emission surface is denoted by $k_1$. At this time, $k_2$, a wave vector of light that resonates in the oblique direction, can be expressed by Formula (1) below.

[Formula 1]

$$k_2 = \frac{k_1}{\cos\theta_2} \quad (1)$$

Note that in Formula (1), $\theta_2$ is the angle of a travelling direction of light in the light-emitting element with respect to a normal vector of the light emission surface of the light-emitting element.

When light travels between media with different refractive indexes, Formula (2) below holds according to Snell's law.

[Formula 2]

$$\sin\theta_1 = \frac{n_B}{n_0}\sin\theta_2 \quad (2)$$

Note that in Formula (2), $\theta_1$ is the angle of light extracted to the outside with respect to the normal vector of the light emission surface of the light-emitting element, $n_0$ is the refractive index of a medium outside the light-emitting element, and $n_B$ is the refractive index of media (the EL layer and the transparent conductive film 106B) between the lower electrode 104B and the upper electrode 120.

Furthermore, $k_1$, the wave vector of light that resonates in the front direction of the light emission surface, can be expressed by Formula (3) below using the wavelength of the light-emitting element.

[Formula 3]

$$k_1 = \frac{2\pi}{\lambda_B} \quad (3)$$

In Formula (3), $\lambda_B$ is a wavelength of light that resonates in the front direction of the light emission surface.

According to Formulae (1) to (3), the resonant wavelength in the oblique direction can be expressed by Formula (4) below.

[Formula 4]

$$\lambda_B\left(1 - \left(\frac{n_0}{n_B}\sin\theta_1\right)^2\right)^{0.5} \quad (4)$$

According to Formula (4), the resonant wavelength in the oblique direction ($\theta_1 > 0°$) of the light emission surface is shorter than the resonant wavelength in the front direction ($\theta_1 = 0°$) of the light emission surface, and the resonant wavelength is shorter as $\theta_1$ is larger.

As described above, light in the oblique direction and light in the front direction exhibit different emission spectra and emission colors. Therefore, in some cases, the viewing angle dependence of chromaticity occurs even when light in the front direction exhibits a desired emission spectrum or emission color.

Here, the viewing angle dependence of an emission spectrum or the viewing angle dependence of chromaticity of the light-emitting element is described with reference to FIGS. 3 to 5 and Tables 1 and 2.

A light-emitting element corresponding to the light-emitting element 101B shown in FIG. 1 was manufactured. FIG. 3 shows the measurement results of electroluminescence spectra of light emitted at angles of 0°, 10°, 30°, 50°, and 70° to the normal vector of the light-emitting element.

Figure 3:
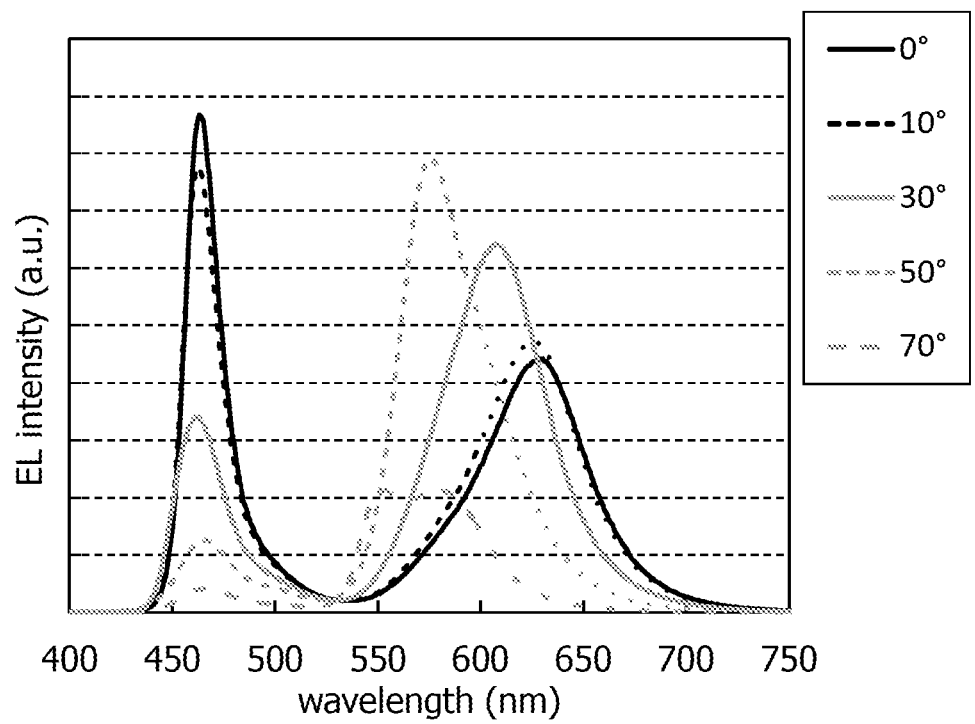
FIG. 3 shows electroluminescence spectra of light emitted at angles of 0°, 10°, 30°, 50°, and 70° to a normal vector of a light-emitting element.

The following are structures and abbreviations of compounds used in the light-emitting element exhibiting the electroluminescence spectra shown in FIG. 3, and the structure of the light-emitting element.

[Chemical Formula I]

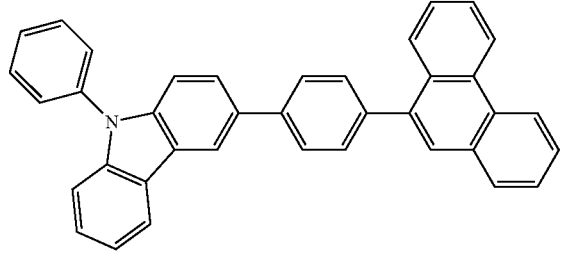

PCPPn

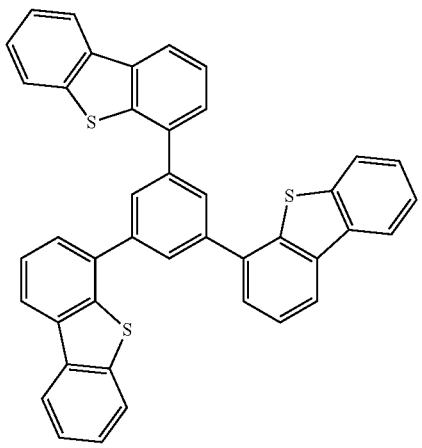

DPT3P-II

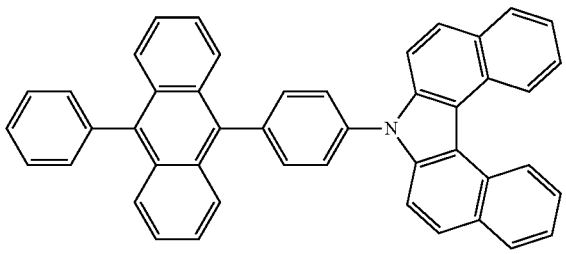

cgDBCzPA

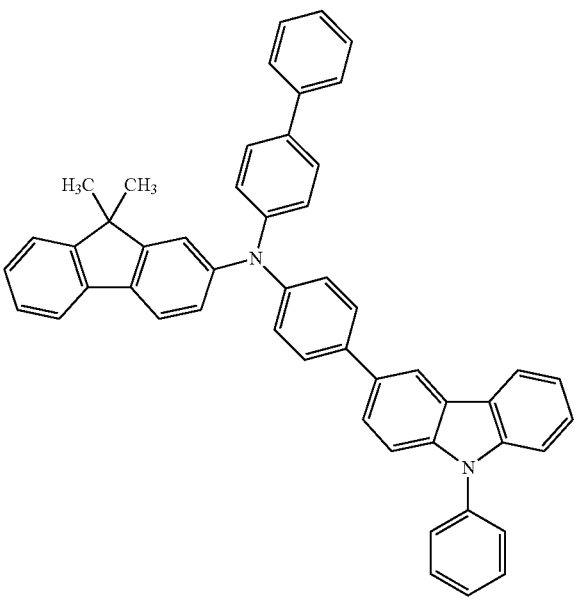

PCBBiF

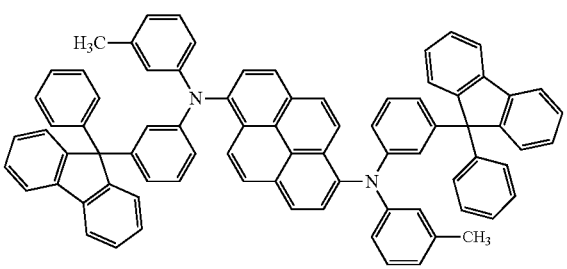

1,6mMemFLPAPrn

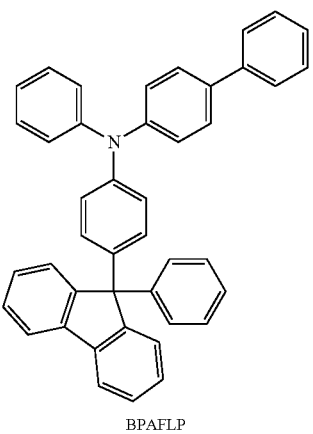

BPAFLP

[Chemical Formula 2]

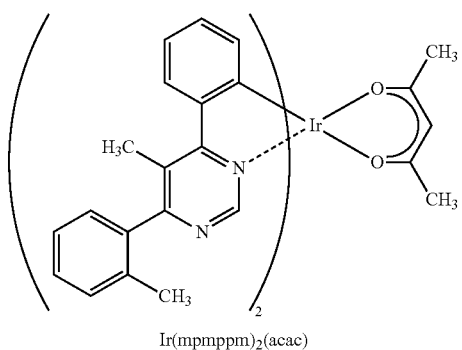

Ir(mpmppm)₂(acac)

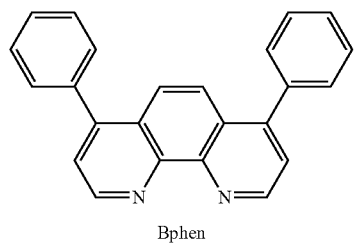

Bphen

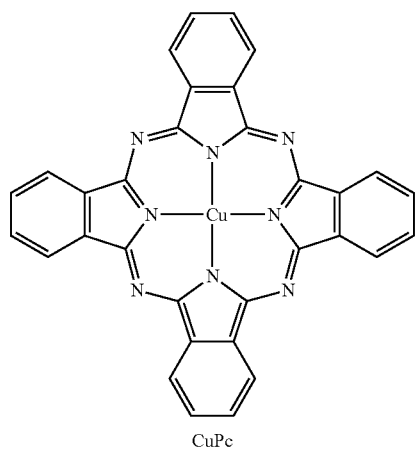

CuPc

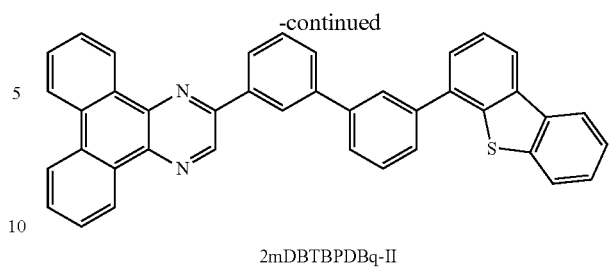

2mDBTBPDBq-II

<<Structure of Light-Emitting Element Subjected to Measurement of Emission Spectra>>

As the lower electrode 104B, a film of an alloy of silver, palladium, and copper (abbreviation: APC film) was formed to a thickness of 100 nm. As the transparent conductive film 106B, a film of indium tin oxide containing silicon oxide (abbreviation: ITSO) was formed to a thickness of 60 nm.

As the hole-injection layer 131, 3-[4-(9-phenanthryl)-phenyl]-9-phenyl-9H-carbazole (abbreviation: PCPPn) and molybdenum oxide ($MoO_3$) were deposited by co-evaporation such that the deposited layer has a weight ratio of PCPPn:$MoO_3$=2:1 and a thickness of 70 nm. Note that a co-evaporation method is an evaporation method in which a plurality of different substances is concurrently vaporized from respective different evaporation sources. As the hole-transport layer 132, PCPPn was deposited by evaporation to a thickness of 10 nm.

As the light-emitting layer 108, 7-[4-(10-phenyl-9-anthryl)phenyl]-7H-dibenzo[c,g]carbazole (abbreviation: cgDBCzPA) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) were deposited by co-evaporation such that the deposited layer has a weight ratio of cgDBCzPA:1,6mMemFLPAPrn=1:0.05 and a thickness of 25 nm. Note that cgDBCzPA served as a host material and 1,6mMemFLPAPrn served as a fluorescent material (a guest material) in the light-emitting layer 108.

When the light-emitting layer 108 is formed using the above-described materials, light emission from the fluorescent material can be obtained efficiently. The details thereof are described in Embodiment 2.

As the electron-transport layer 133, cgDBCzPA and bathophenanthroline (abbreviation: Bphen) were deposited on the light-emitting layer 108 by evaporation to thicknesses of 5 nm and 15 nm, respectively. As the electron-injection layer 134, lithium oxide ($Li_2O$) and copper phthalocyanine (abbreviation: CuPc) were deposited by evaporation to thicknesses of 0.1 nm and 2 nm, respectively. As the charge-generation layer 116 serving as the hole-injection layer 135, 1,3,5-tri(dibenzothiophen-4-yl)benzene (abbreviation: DBT3P-II) and $MoO_3$ were deposited by co-evaporation such that the deposited layer has a weight ratio of DBT3P-II:$MoO_3$=2:1 and a thickness of 12.5 nm. Then, as the hole-transport layer 136, 4-phenyl-4'-(9-phenylfluoren-9-yl)triphenylamine (abbreviation: BPAFLP) was deposited by evaporation to a thickness of 20 nm.

As the light-emitting layer 110, 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-9,9-dimethyl-N-[4-(9-phenyl-9H-carbazol-3-yl)phenyl]-9H-fluoren-2-amine (abbreviation: PCBBiF), and (acetylacetonato)bis[5-methyl-6-(2-methylphenyl)-4-phenylpyrimidinato]iridium(III) (another name: bis{2-[5-methyl-6-(2-methylphenyl)-4-pyrimidinyl-κN3]phenyl-κC}(2,4-pentanedionato-κ²O,O')iridium (III)) (abbreviation: Ir(mpmppm)$_2$(acac)) were deposited by co-evaporation such that the deposited layer has a weight ratio of 2mDBTBPDBq-II:PCBBiF:Ir(mpmppm)$_2$(acac)= 0.8:0.2:0.06 and a thickness of 40 nm. Note that 2mDBTB-PDBq-II served as a first organic compound (a host material), PCBBiF served as a second organic compound (an assist material), and Ir(mpmppm)$_2$(acac) served as a phosphorescent material (a guest material) in the light-emitting layer 110.

When the light-emitting layer 110 is formed using the above-described materials, light emission from the phosphorescent material can be obtained efficiently, and a drive voltage can be reduced. The details thereof are described in Embodiment 2.

As the electron-transport layer 137, 2mDBTBPDBq-II and Bphen were sequentially deposited by evaporation each to a thickness of 15 nm. As the electron-injection layer 138, lithium fluoride (LiF) was deposited by co-evaporation to a thickness of 1 nm.

As the upper electrode 120, an alloy of silver (Ag) and magnesium (Mg) was deposited by co-evaporation in a volume ratio of Ag:Mg=0.5:0.05 to a thickness of 15 nm, and then, an ITO film was formed to a thickness of 70 nm.

The above is the description of the structure of the light-emitting element exhibiting the electroluminescence spectra shown in FIG. 3. Table 1 shows the details of the element structure.

value and the fourth local maximum value located on the longer wavelength side than the third local maximum value. This is because the optical path length also allows light with a wavelength that is around 1.5 times as large as that of the third local maximum value to be intensified. Furthermore, the fourth local maximum values in the oblique directions (10°, 30°, 50°, and 70°) are located on the shorter wavelength side than the fourth local maximum value in the front direction (0°). This is because the resonant wavelength in the microcavity structure is short in the oblique direction as described above.

In view of this, a structure is considered in which a coloring layer (i.e., a color filter) is provided in a position of the optical element 124B to decrease the intensity of the fourth local maximum value in the oblique direction. FIG. 4 shows the measurement results of the transmittance of the coloring layer on the substrate 122. FIG. 5 shows the measurement results of emission spectra of light emitted from a light-emitting device including the light-emitting element shown in Table 1 and the coloring layer having the transmittance shown in FIG. 4. Note that the electroluminescence spectra shown in FIG. 5 are results of measuring light extracted through the coloring layer at angles of 0°, 10°, 30°, 50°, and 70° to the normal vector of the light-emitting element. Table 2 shows the wavelengths of the third local maximum values and the fourth local maxi-

TABLE 1

| Layer | Reference numeral | Thickness (nm) | Material | Weight ratio *1) |
|---|---|---|---|---|
| Upper electrode | 120 | 70 | ITO | — |
|  |  | 15 | Ag:Mg | 0.5:0.05 |
| Electron-injection layer | 138 | 1 | LiF | — |
| Electron-transport layer | 137 | 15 | Bphen | — |
|  |  | 15 | 2mDBTBPDBq-II | — |
| Light-emitting layer | 110 | 40 | 2mDBTBPDBq-II:PCBBiF:Ir(mpmppm)$_2$(acac) | 0.8:0.2:0.06 |
| Hole-transport layer | 136 | 20 | BPAFLP | — |
| Charge-generation layer | 116 | 12.5 | DBT3P-II:MoO$_3$ | 2:1 |
| Electron-injection layer | 134 | 2 | CuPc | — |
|  |  | 0.1 | Li$_2$O | — |
| Electron-transport layer | 133 | 15 | Bphen | — |
|  |  | 5 | cgDBCzPA | — |
| Light-emitting layer | 108 | 25 | cgDBCzPA:1,6mMemFLPAPrn | 1:0.05 |
| Hole-transport layer | 132 | 10 | PCPPn | — |
| Hole-injection layer | 131 | 70 | PCPPn:MoO$_3$ | 2:1 |
| Transparent conductive film | 106B | 60 | ITSO | — |
| Lower electrode | 104B | 100 | APC | — |

*1) Volume ratio is provided as the ratio of "Ag:Mg".

Figure 5:
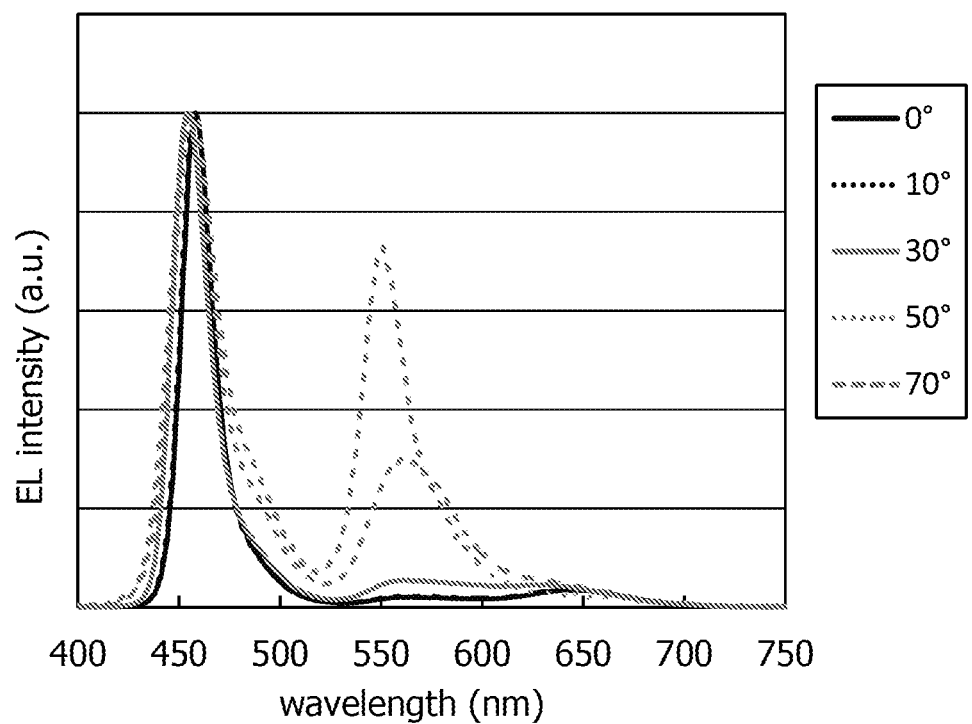
FIG. 5 shows electroluminescence spectra of light extracted at angles of 0°, 10°, 30°, 50°, and 70° to a normal vector of a light-emitting element through a coloring layer.

As shown in FIG. 3, the electroluminescence spectra of the light-emitting element 101B include the third local maximum mum values of the electroluminescence spectra shown in FIG. 5, and the like.

TABLE 2

| Measured target | Angle (°) *1) | Wavelength of third local maximum value (nm) | Wavelength of fourth local maximum value (nm) | Intensity of fourth local maximum value *2) | Intensity ratio of fourth local maximum value to third local maximum value (%) |
|---|---|---|---|---|---|
| Light-emitting element in Table 1 | 0 | 463 | 630 | 0.510 | 51.0 |
|  | 10 | 462 | 625 | 0.609 | 60.9 |
|  | 30 | 462 | 607 | 1.89 | 189 |
|  | 50 | 465 | 576 | 6.29 | 629 |
|  | 70 | 467 | 552 | 5.07 | 507 |
|  |  |  | 581 | 5.12 | 512 |

TABLE 2-continued

Figure 4:
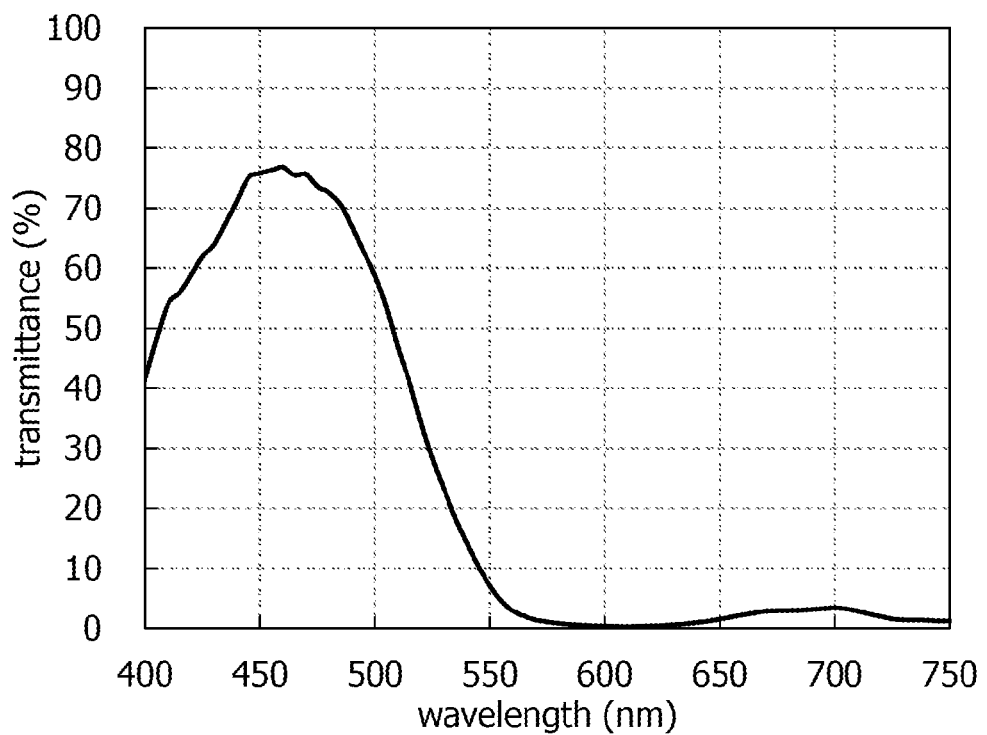
FIG. 4 shows the transmittance of a coloring layer.

| Measured target | Angle (°) *1) | Wavelength of third local maximum value (nm) | Wavelength of fourth local maximum value (nm) | Intensity of fourth local maximum value *2) | Intensity ratio of fourth local maximum value to third local maximum value (%) |
|---|---|---|---|---|---|
| Light-emitting device (including light-emitting element in Table 1 and coloring layer having transmittance in FIG. 4) | 0 | 458 | 563 | 0.0205 | 2.05 |
| | | | 642 | 0.0352 | 3.52 |
| | 10 | 458 | 563 | 0.0226 | 2.26 |
| | | | 643 | 0.0355 | 3.55 |
| | 30 | 454 | 563 | 0.0547 | 5.47 |
| | | | 630 | 0.0459 | 4.59 |
| | 50 | 456 | 560 | 0.300 | 30.0 |
| | 70 | 459 | 550 | 0.727 | 72.7 |

*1) The angle of extracted light with respect to the normal vector of the light emission surface.
*2) The intensity of the fourth local maximum value when the normalized third local maximum value is taken as 1.

As shown in FIG. 3, FIG. 5, and Table 2, with the coloring layer having the transmittance shown in FIG. 4, the intensity of the fourth local maximum value of light in the front direction (0°) which is emitted from the light-emitting element through the coloring layer is significantly decreased from the intensity of the fourth local maximum value of light emitted from the light-emitting element without the coloring layer. However, the intensities of the fourth local maximum values in the oblique directions (10°, 30°, 50°, and 70°), particularly the fourth local maximum values at 50° and 70°, are not reduced sufficiently. That is, in the case where the performance of the optical element is not enough (e.g., the coloring layer has the transmittance characteristics shown in FIG. 4) because the fourth local maximum value in the oblique direction is located on the shorter wavelength side, it might be difficult to reduce the intensity of the fourth local maximum value sufficiently.

When the intensity ratio of the fourth local maximum value to the third local maximum value is large (specifically, when the intensity ratio of the fourth local maximum value to the third local maximum value exceeds 15%) as shown in FIG. 5 and Table 2, the viewing angle dependence of chromaticity occurs. Note that in some cases, there are two or more of the fourth local maximum values located on the longer wavelength side than the third local maximum value at angles of 0°, 10°, and 30° to the normal vector of the light-emitting element as shown in Table 2. In the case where two or more of the fourth local maximum values are located on the longer wavelength side than the third local maximum value, when the intensity ratio of the largest fourth local maximum value to the third local maximum value exceeds 15%, the viewing angle dependence of chromaticity occurs.

However, the optical element 124B in the light-emitting device 150 of one embodiment of the present invention includes, as one of its optical characteristics, a region whose transmittance with respect to light with a wavelength of greater than or equal to 530 nm and less than or equal to 680 nm is lower than or equal to 20%. Thus, regarding the light 183 emitted through the optical element 124B, the intensity ratio of the fourth local maximum value to the third local maximum value in the range of greater than 0° and less than or equal to 70° with respect to the normal vector of the optical element 124B can be lower than or equal to 15%. Thus, the viewing angle dependence of chromaticity of the light-emitting device can be small. More preferably, the intensity ratio of the fourth local maximum value to the third local maximum value is lower than or equal to 10%. Still more preferably, the intensity ratio of the fourth local maximum value to the third local maximum value is lower than or equal to 3%.

As described above, by adjusting the optical path length between the lower electrode and the upper electrode of each light-emitting element in the light-emitting device of one embodiment of the present invention, scattering or absorption of light in the vicinity of the lower electrode can be suppressed, resulting in high light extraction efficiency. Furthermore, the light-emitting device having small viewing angle dependence of chromaticity can be achieved with the use of the optical element that reduces the intensity of a particular wavelength in each light-emitting element, particularly in the light-emitting element exhibiting blue light. Therefore, a novel light-emitting device with high emission efficiency, low power consumption, and small viewing angle dependence can be provided.

<Structural Example 2 of Light-Emitting Device>

Next, a structure example different from the light-emitting device 150 illustrated in FIG. 1 will be described below with reference to FIG. 6.

Figure 6:
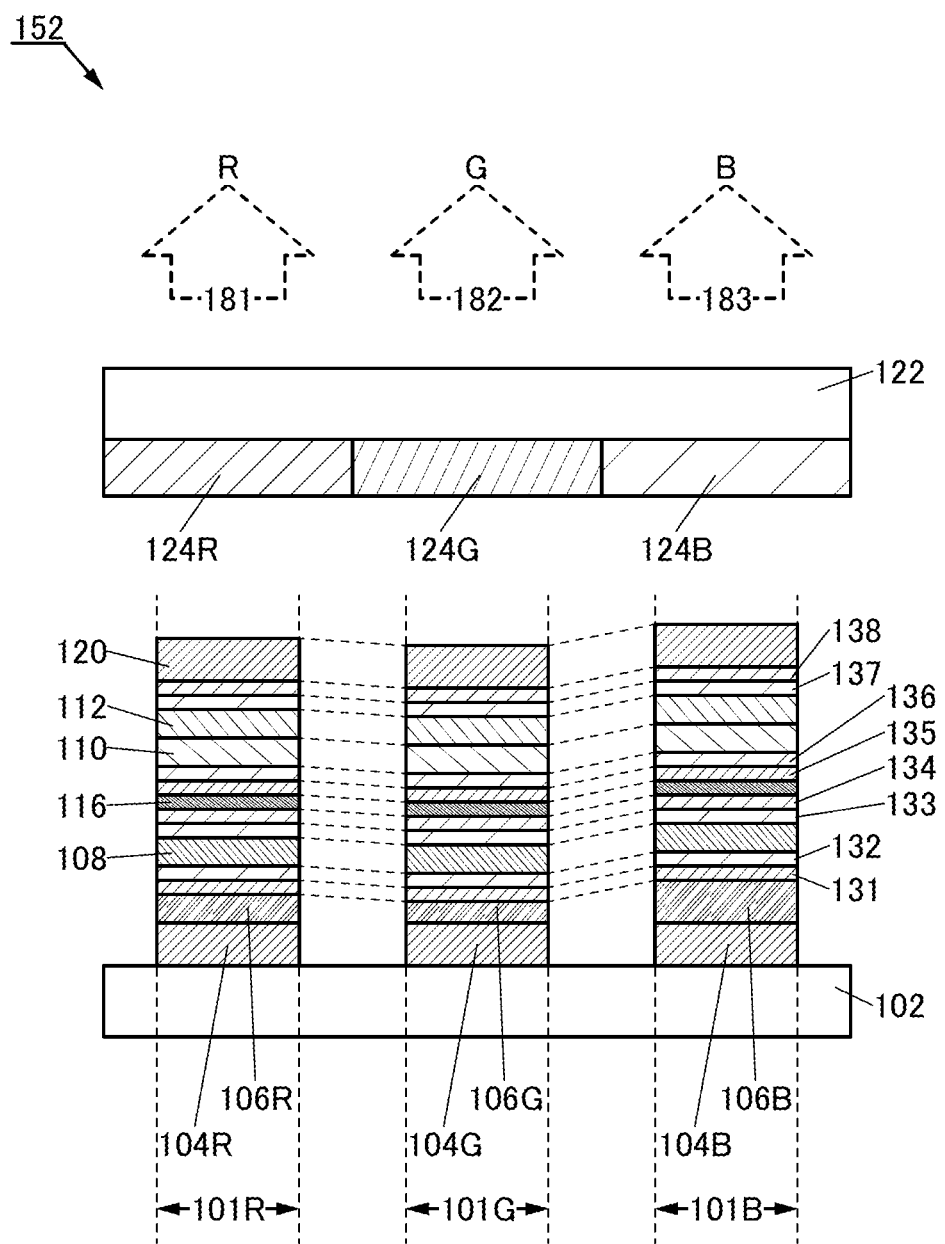
FIG. 6 is a cross-sectional view illustrating a light-emitting device of one embodiment of the present invention.

FIG. 6 is a cross-sectional view illustrating an example of a light-emitting device of one embodiment of the present invention. In FIG. 6, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

A light-emitting device 152 shown in FIG. 6 differs from the light-emitting device 150 shown in FIG. 1 in the structure of the EL layer included in each of the light-emitting elements (the light-emitting element 101R, the light-emitting element 101G, and the light-emitting element 101B). Specifically, a light-emitting layer 112 is provided between the light-emitting layer 110 and the upper electrode 120.

The light-emitting layer 112 contains a third light-emitting substance that emits light of at least one of green, yellow green, yellow, orange, and red. Note that the light-emitting layer 110 and the light-emitting layer 112 are preferably made to emit light of different colors. In the light-emitting device 152, the first light-emitting substance that emits blue light, the second light-emitting substance that emits green light, and the third light-emitting substance that emits red light are preferably used as the light-emitting layer 108, the light-emitting layer 110, and the light-emitting layer 112, respectively.

The three light-emitting layers (the light-emitting layer 108, the light-emitting layer 110, and the light-emitting layer 112) provided in the EL layer as described above can increase color purity of each light-emitting element. However, the light-emitting layer 112 increases the number of layers in the EL layer. In the case where the number of EL layers should be small, the light-emitting device 150 shown in FIG. 1 is preferable. The other components are similar to those of the light-emitting device 150 shown in FIG. 1, and the effect similar to that in the case of the light-emitting device 150 is obtained.

<Structural Example 3 of Light-Emitting Device>

Next, a structural example different from the light-emitting device 150 shown in FIG. 1 will be described below with reference to FIG. 7.

Figure 7:
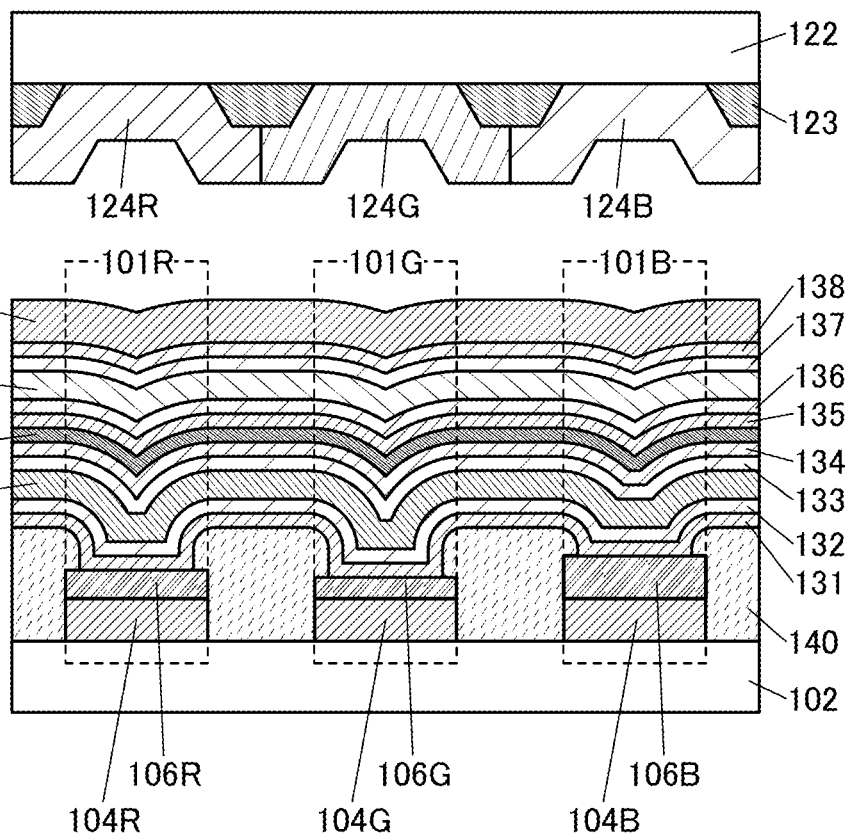
FIG. 7 is a cross-sectional view illustrating a light-emitting device of one embodiment of the present invention.

FIG. 7 is a cross-sectional view illustrating an example of a light-emitting device of one embodiment of the present invention. In FIG. 7, a portion having a function similar to that in FIG. 1 and FIG. 6 is represented by the same hatch pattern as in FIG. 1 and FIG. 6 and not especially denoted by a reference numeral in some cases. In addition, common reference numerals are used for portions having similar functions, and a detailed description of the portions is omitted in some cases.

A light-emitting device 154 shown in FIG. 7 differs from the light-emitting device 150 shown in FIG. 1 in having a partition wall 140 and a light-blocking layer 123. The other components are similar to those of the light-emitting device 150 illustrated in FIG. 1, and the effect similar to that in the case of the light-emitting device 150 is obtained.

The partition wall 140 has an insulating property. The partition wall 140 covers end portions of the lower electrodes (the lower electrode 104R, the lower electrode 104G, and the lower electrode 104B) and the transparent conductive films (the transparent conductive film 106R, the transparent conductive film 106G, and the transparent conductive film 106B) of the light-emitting elements and has opening portions that overlap with the lower electrodes. With the partition wall 140, the lower electrodes of the light-emitting elements and the transparent conductive films of the light-emitting elements can have divided island shapes.

The light-blocking layer 123 has a function of blocking light from the adjacent light-emitting element. Note that a structure without the light-blocking layer 123 may also be employed.

<Structural Example 4 of Light-Emitting Device>

Next, a structural example different from the light-emitting device 150 shown in FIG. 1 will be described below with reference to FIG. 8.

Figure 8:
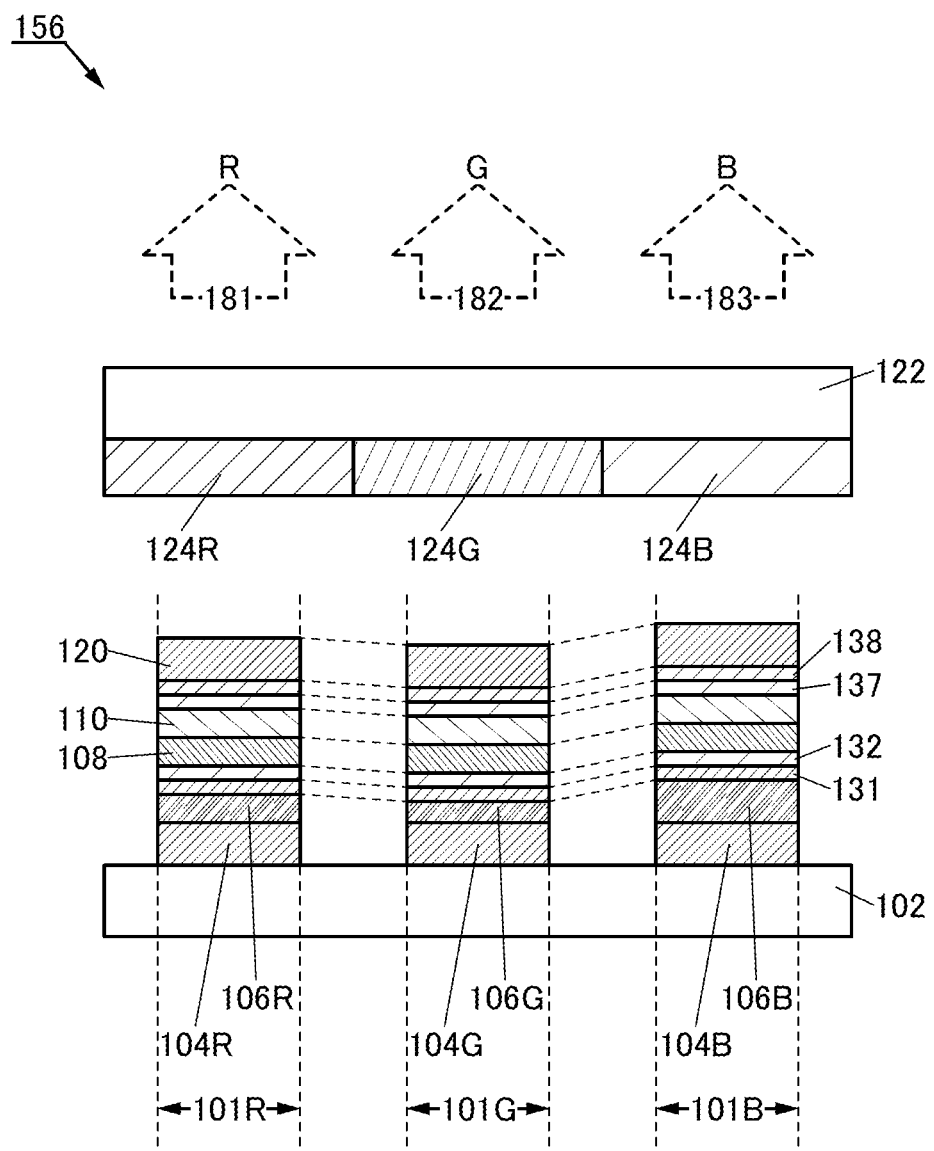
FIG. 8 is a cross-sectional view illustrating a light-emitting device of one embodiment of the present invention.

FIG. 8 is a cross-sectional view illustrating an example of a light-emitting device of one embodiment of the present invention. In FIG. 8, a portion having a function similar to that in FIGS. 1 to 7 is represented by the same hatch pattern as in FIGS. 1 to 7 and not especially denoted by a reference numeral in some cases. In addition, common reference numerals are used for portions having similar functions, and a detailed description of the portions is omitted in some cases.

A light-emitting device 156 shown in FIG. 8 differs from the light-emitting device 150 shown in FIG. 1 in the structure of the EL layer included in each of the light-emitting elements (the light-emitting element 101R, the light-emitting element 101G, and the light-emitting element 101B). Specifically, in each light-emitting element of the light-emitting device 156 shown in FIG. 8, the electron-transport layer 133, the electron-injection layer 134, the charge-generation layer 116, the hole-injection layer 135, and the hole-transport layer 136 are not provided between the light-emitting layer 108 and the light-emitting layer 110. The structure in which the light-emitting layer 108 and the light-emitting layer 110 are in contact with each other as shown in FIG. 8 can reduce the number of layers in the EL layer, resulting in a reduction of the manufacturing cost. Note that although not shown, a buffer layer without a light-emitting material (the layer is also referred to as a separation layer or a separate layer) may be provided between the light-emitting layer 108 and the light-emitting layer 110 in FIG. 8. The other components are similar to those of the light-emitting device 150 shown in FIG. 1, and the effect similar to that in the case of the light-emitting device 150 is obtained.

<Structural Example 5 of Light-Emitting Device>

Next, a structural example different from the light-emitting device 150 shown in FIG. 1 will be described below with reference to FIG. 9.

Figure 9:
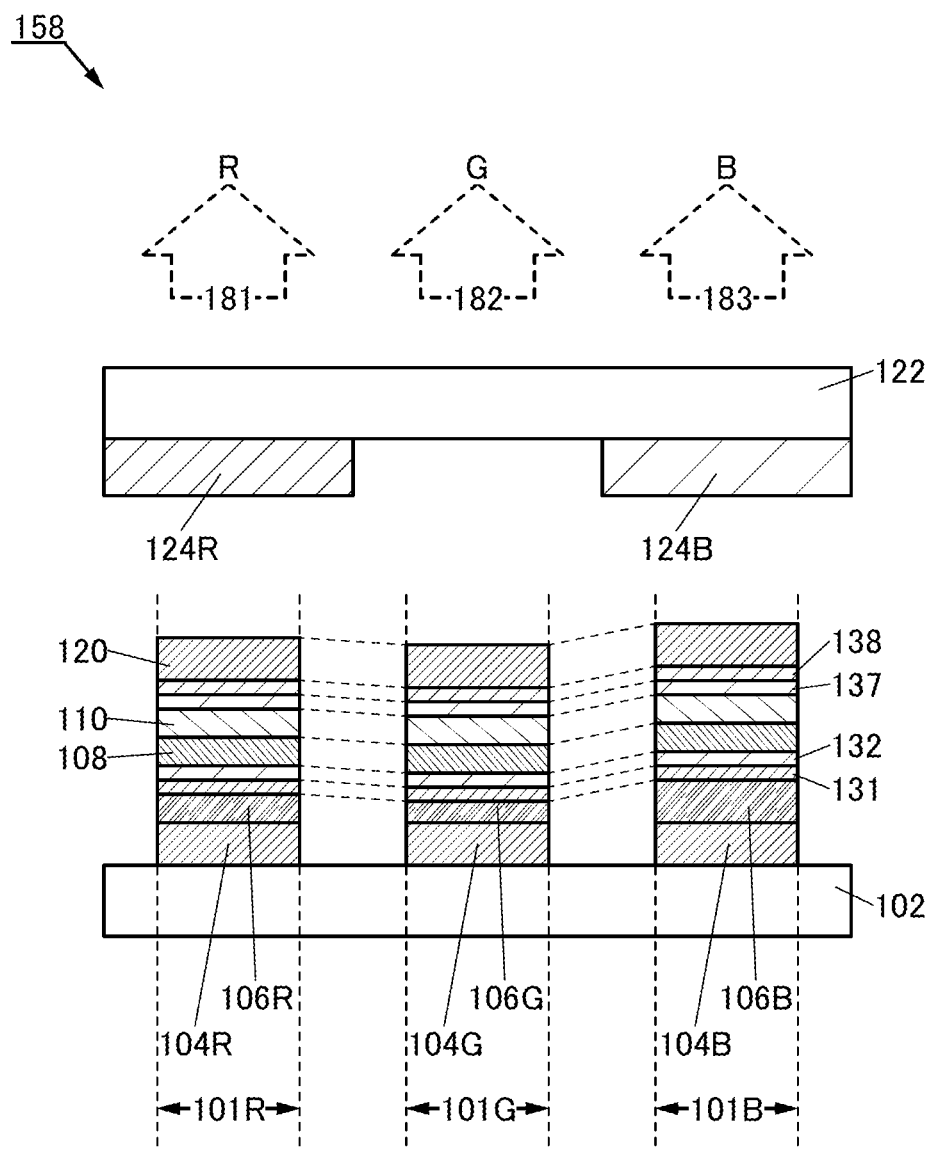
FIG. 9 is a cross-sectional view illustrating a light-emitting device of one embodiment of the present invention.

FIG. 9 is a cross-sectional view illustrating an example of a light-emitting device of one embodiment of the present invention. In FIG. 9, a portion having a function similar to that in FIGS. 1 to 8 is represented by the same hatch pattern as in FIGS. 1 to 8 and not especially denoted by a reference numeral in some cases. In addition, common reference numerals are used for portions having similar functions, and a detailed description of the portions is omitted in some cases.

A light-emitting device 158 shown in FIG. 9 does not include the optical element 124G included in the light-emitting device 156 shown in FIG. 8. Since the optical element 124G is not provided, light emitted from the light-emitting element 101G can be directly extracted to the outside, leading to low power consumption. Note that in the case where color purity is increased or the reflection of outside light is suppressed, the structure provided with the optical element 124G is preferable as in the light-emitting device 156 shown in FIG. 8. The other components are similar to those of the light-emitting device 156 illustrated in FIG. 8, and the effect similar to that in the case of the light-emitting device 156 is obtained.

<Structural Example 6 of Light-Emitting Device>

Next, a structural example different from that of the light-emitting device 150 illustrated in FIG. 1 will be described below with reference to FIG. 10.

Figure 10:
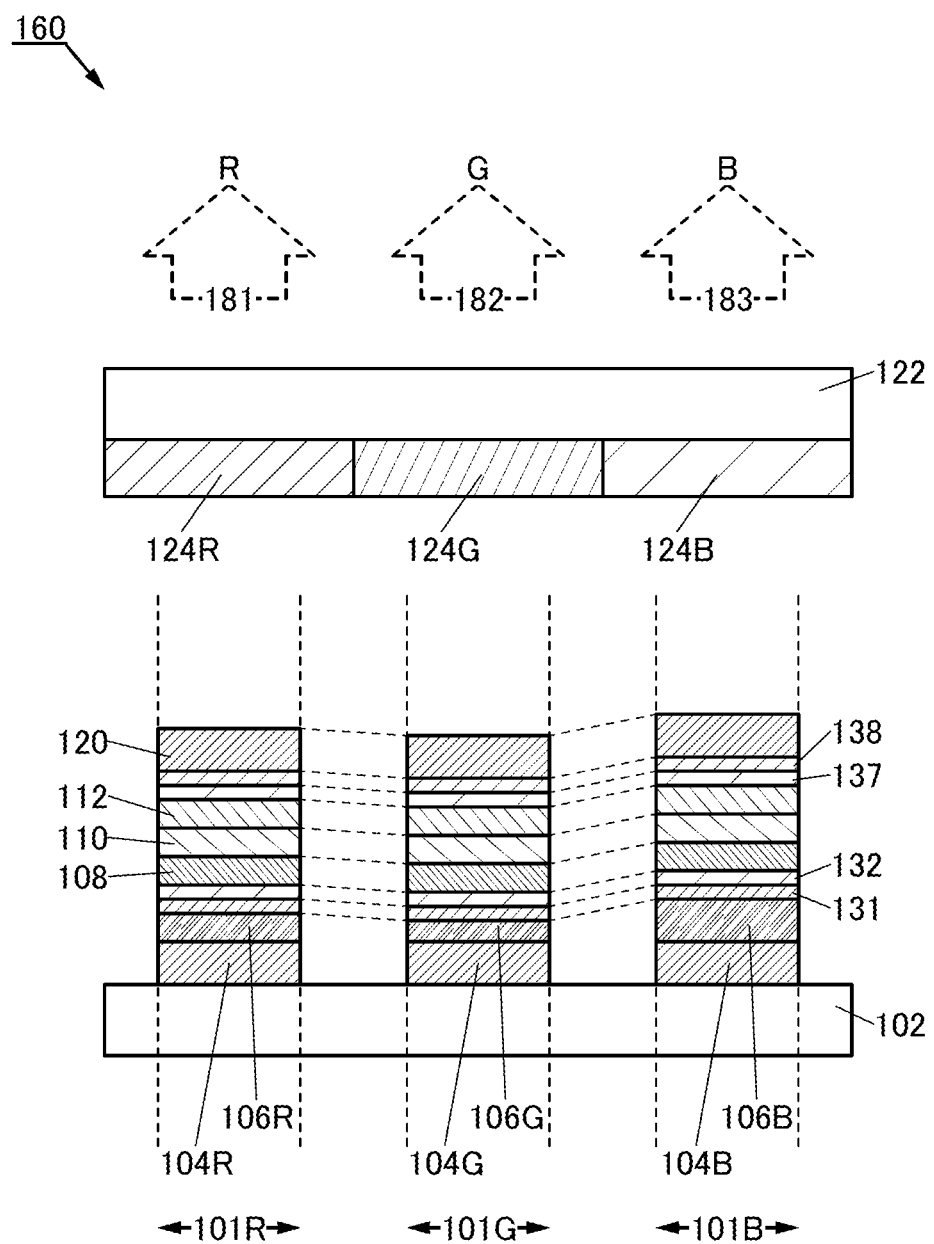
FIG. 10 is a cross-sectional view illustrating a light-emitting device of one embodiment of the present invention.

FIG. 10 is a cross-sectional view illustrating an example of a light-emitting device of one embodiment of the present invention. In FIG. 10, a portion having a function similar to that in FIGS. 1 to 9 is represented by the same hatch pattern as in FIGS. 1 to 9 and not especially denoted by a reference numeral in some cases. In addition, common reference numerals are used for portions having similar functions, and a detailed description of the portions is omitted in some cases.

A light-emitting device 160 shown in FIG. 10 differs from the light-emitting device 156 shown in FIG. 8 in the structure of the EL layer included in each of the light-emitting elements (the light-emitting element 101R, the light-emitting element 101G, and the light-emitting element 101B). Specifically, the light-emitting layer 112 is provided between the light-emitting layer 110 and the electron-transport layer 137. The light-emitting layer 112 is similar to the light-emitting layer 112 of the light-emitting device 152 described above. The other structures are similar to those of the light-emitting device 156 illustrated in FIG. 8 and have similar effects.

<Structural Example 7 of Light-Emitting Device>

The light-emitting devices shown in FIG. 1 and FIGS. 6 to 10 have a top-emission structure; however, the light-emitting devices may have a bottom-emission structure as shown in FIGS. 11 to 14.

Figure 11:
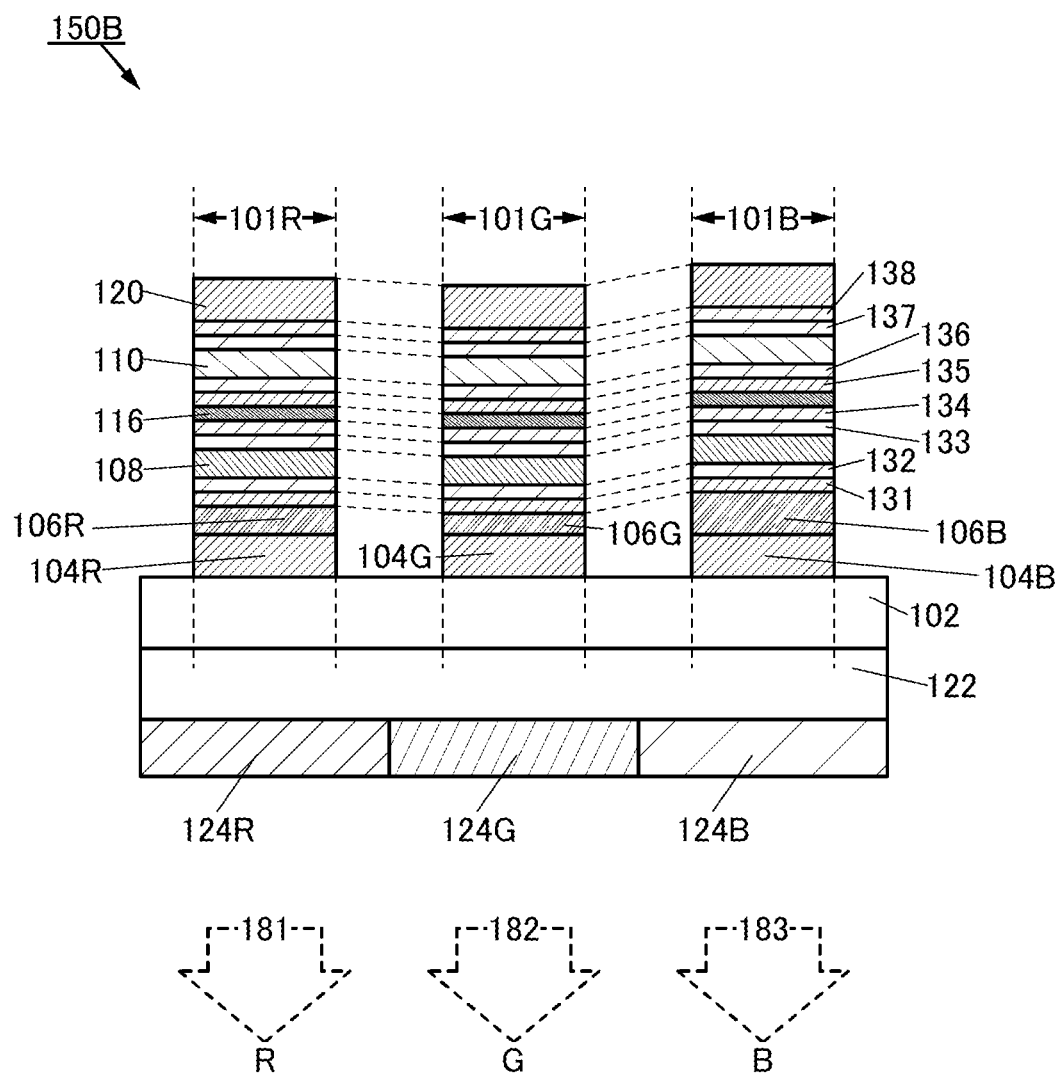
FIG. 11 is a cross-sectional view illustrating a light-emitting device of one embodiment of the present invention.
Figure 12:
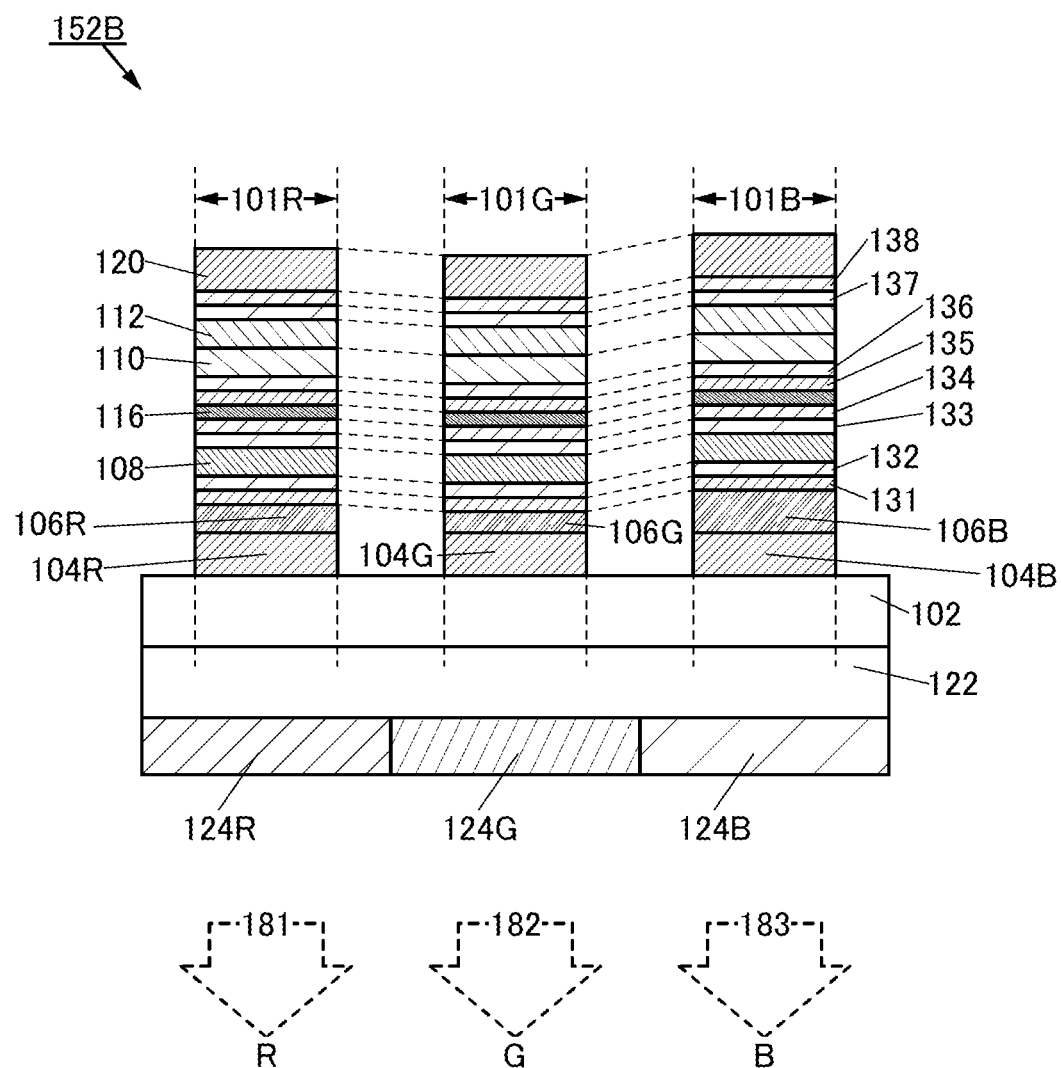
FIG. 12 is a cross-sectional view illustrating a light-emitting device of one embodiment of the present invention.
Figure 13:
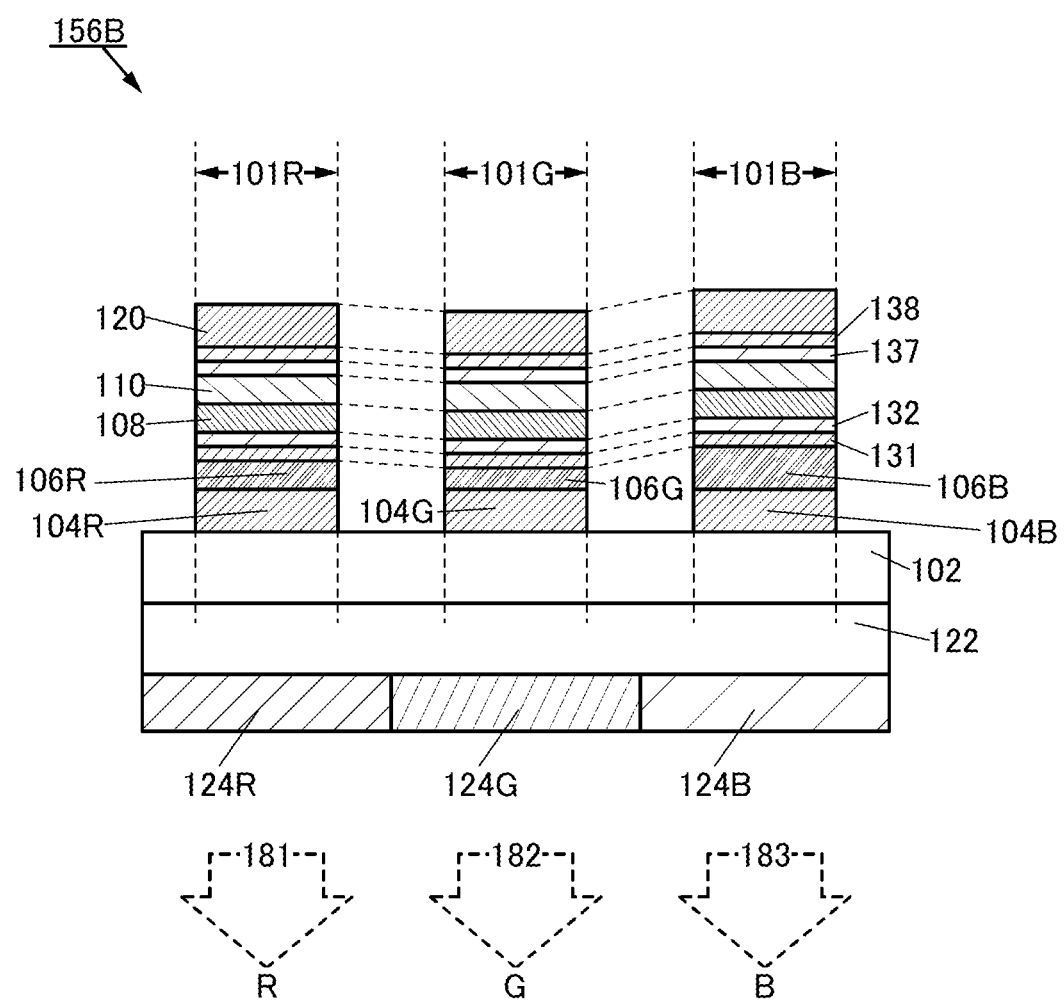
FIG. 13 is a cross-sectional view illustrating a light-emitting device of one embodiment of the present invention.
Figure 14:
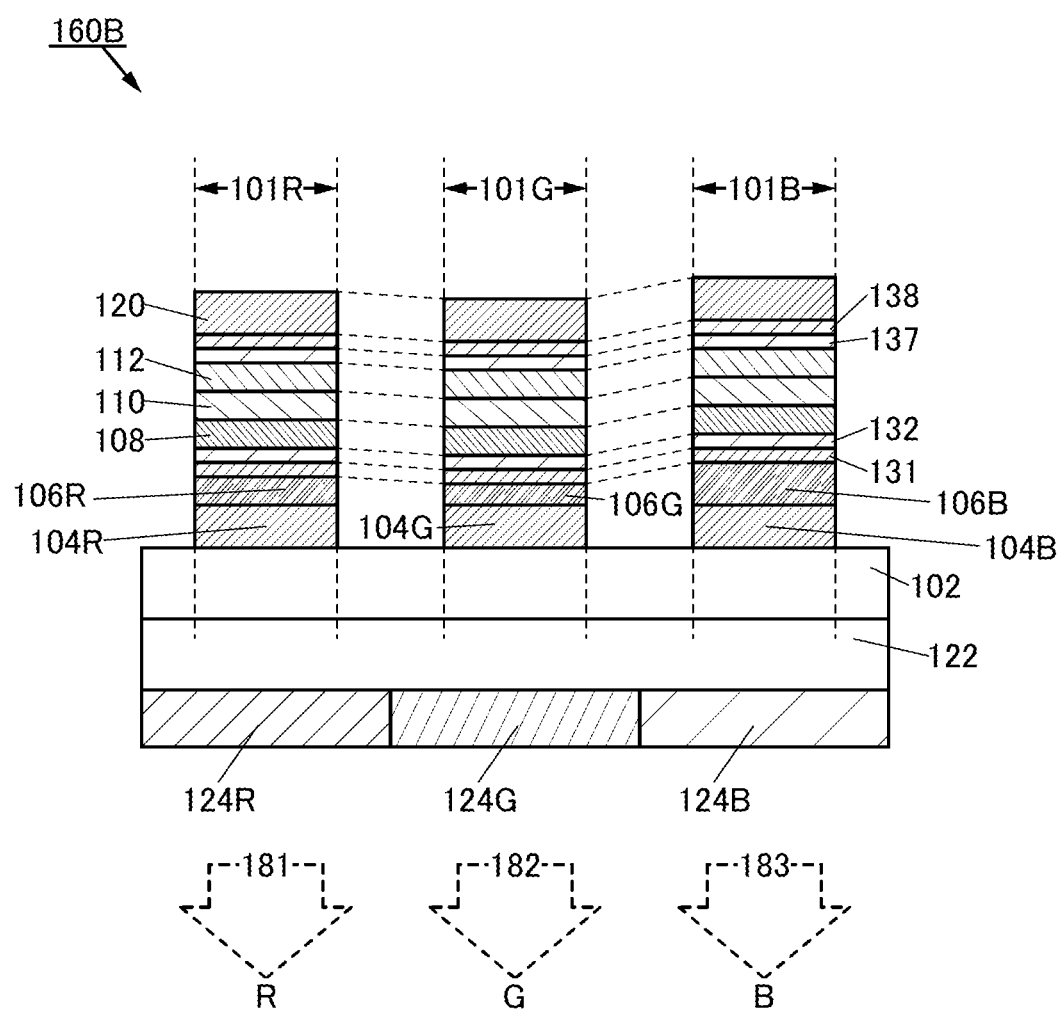
FIG. 14 is a cross-sectional view illustrating a light-emitting device of one embodiment of the present invention.

FIG. 11 is a cross-sectional view of a light-emitting device 150B that is a modification example of the light-emitting device 150 shown in FIG. 1. FIG. 12 is a cross-sectional view of a light-emitting device 152B that is a modification example of the light-emitting device 152 shown in FIG. 6. FIG. 13 is a cross-sectional view of a light-emitting device 156B that is a modification example of the light-emitting device 156 shown in FIG. 8. FIG. 14 is a cross-sectional view of a light-emitting device 160B that is a modification example of the light-emitting device 160 shown in FIG. 10.

Note that in the case where the light-emitting device has a bottom-emission structure as shown in FIGS. 11 to 14, the lower electrode and the upper electrode of each light-emitting element may have the following structures.

For example, the lower electrode 104R, the lower electrode 104G, and the lower electrode 104B each have a function of reflecting visible light and a function of transmitting visible light. The upper electrode 120 has a function of reflecting visible light.

That is, the light-emitting device having a bottom-emission structure can be obtained by replacing the upper electrode and the lower electrode of the light-emitting device having the top-emission structure described above. Note that in the drawings, the stacking order of the layers in the EL layer may be reversed between the top-emission structure and the bottom-emission structure, though the case is not shown.

<Structural Example 8 of Light-Emitting Device>

Next, a structural example different from that of the light-emitting device 150 shown in FIG. 1 will be described below with reference to FIG. 15.

Figure 15:
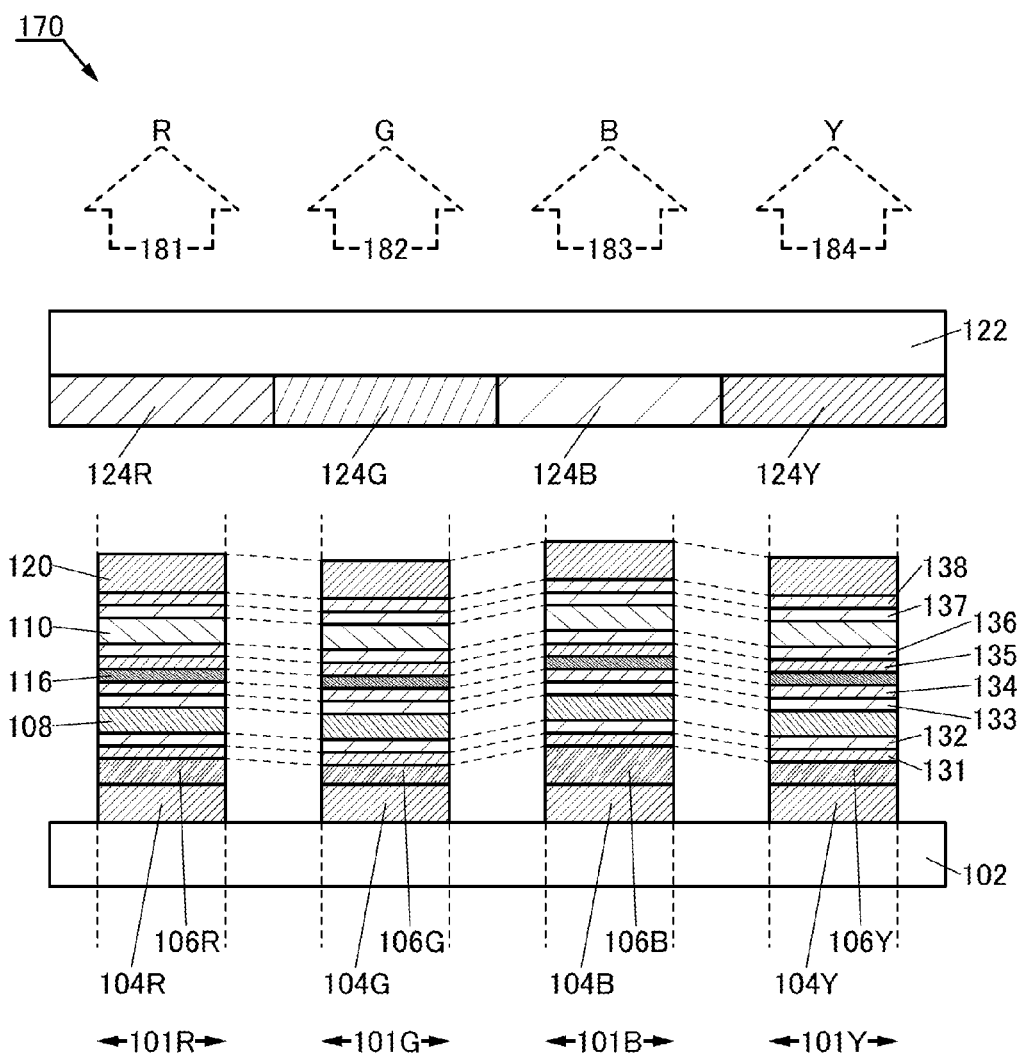
FIG. 15 is a cross-sectional view illustrating a light-emitting device of one embodiment of the present invention.

FIG. 15 is a cross-sectional view of a light-emitting device of one embodiment of the present invention. In FIG. 15, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

A light-emitting device 170 shown in FIG. 15 includes the light-emitting element 101R, the light-emitting element 101G, the light-emitting element 101B, a light-emitting element 101Y, the optical element 124R, the optical element 124G, the optical element 124B, and an optical element 124Y. Note that the light-emitting elements (the light-emitting element 101R, the light-emitting element 101G, the light-emitting element 101B, and the light-emitting element 101Y) are provided over the substrate 102, and the optical elements (the optical element 124R, the optical element 124G, the optical element 124B, and the optical element 124Y) are provided below the substrate 122.

The light-emitting element 101Y includes a lower electrode 104Y, a transparent conductive film 106Y over the lower electrode 104Y, the light-emitting layer 108 over the transparent conductive film 106Y, the light-emitting layer 110 over the light-emitting layer 108, and the upper electrode 120 over the light-emitting layer 110.

In the light-emitting device 170, the hole-injection layer 131 and the hole-transport layer 132 are provided between the transparent conductive films (the transparent conductive film 106R, the transparent conductive film 106G, the transparent conductive film 106B, and a transparent conductive film 106Y) and the light-emitting layer 108. Furthermore, the electron-transport layer 133, the electron-injection layer 134, the charge-generation layer 116, the hole-injection layer 135, and the hole-transport layer 136 are provided between the light-emitting layer 108 and the light-emitting layer 110. Furthermore, the electron-transport layer 137 and the electron-injection layer 138 are provided between the light-emitting layer 110 and the upper electrode 120.

The lower electrode 104Y has a function of reflecting visible light. When the lower electrode 104Y is formed using material containing aluminum or silver, the reflectivity can be increased and the emission efficiency of each light-emitting element can be increased.

Light 184 emitted from the light-emitting element 101Y through the optical element 124Y has a wavelength range of light exhibiting a yellow color.

In other words, the optical element 124Y has a function of selectively transmitting light exhibiting a particular color out of incident light.

For example, the optical element 124Y has a region whose transmittance with respect to light with a wavelength of greater than or equal to 550 nm and less than 600 nm is higher than or equal to 50%.

Note that in FIG. 15, red light (R), green light (G), blue light (B), and yellow light (Y) emitted from the light-emitting elements through the optical elements are schematically denoted by arrows of dashed lines. The same applies to light-emitting devices described later. The light-emitting device 170 illustrated in FIG. 15 has a top-emission structure in which light emitted from the light-emitting elements is extracted to the side opposite to the substrate 102 side where the light-emitting elements are formed.

A spectrum of the light 184 extracted through the optical element 124Y includes a fifth local maximum value in a wavelength range of greater than or equal to 550 nm and less than 600 nm.

The light-emitting element 101R, the light-emitting element 101G, the light-emitting element 101B, and the light-emitting element 101Y in the light-emitting device 170 each have a microcavity structure.

That is, in the light-emitting device 170, the thickness of each of the transparent conductive film 106R, the transparent conductive film 106G, the transparent conductive film 106B, and the transparent conductive film 106Y in the light-emitting elements is adjusted so that the intensity of light emitted from the light-emitting layer 108 and the light-emitting layer 110 can be increased. Note that at least one of the hole-injection layer 131 and the hole-transport layer 132 in light-emitting elements may vary in thickness so that the intensity of light emitted from the light-emitting layer 108 and the light-emitting layer 110 can be increased.

For example, in the case where the refractive index of the lower electrode 104Y and the upper electrode 120 is lower than the refractive index of the light-emitting layer 108 or the light-emitting layer 110, the thickness of the transparent conductive film 106Y is adjusted so that the optical path length between the lower electrode 104Y and the upper electrode 120 is $M_Y \lambda_Y / 2$ ($m_Y$ is a natural number and $\lambda_Y$ is a wavelength of light which is intensified in the light-emitting element 101Y).

By adjusting the thickness of the transparent conductive film 106R, the optical path length between the lower electrode 104R and the light-emitting layer 110 can be around $3\lambda_R/4$. By adjusting the thickness of the transparent conductive film 106G, the optical path length between the lower electrode 104G and the light-emitting layer 110 can be around $3\lambda_G/4$. By adjusting the thickness of the transparent conductive film 106B, the optical path length between the lower electrode 104B and the light-emitting layer 108 can be around $3\lambda_B/4$. By adjusting the thickness of the transparent conductive film 106Y, the optical path length between the lower electrode 104Y and the light-emitting layer 110 can be around $3\lambda_Y/4$.

In other words, the thickness of the transparent conductive film 106B can be larger than the thickness of the transparent conductive film 106R, the thickness of the transparent conductive film 106G, and the thickness of the transparent conductive film 106Y.

With the above-described optical path lengths, an optical path length of $2\lambda_R/2$ (i.e., $\lambda_R$) is achieved between the lower electrode 104R and the upper electrode 120, an optical path length of $2\lambda_G/2$ (i.e., $\lambda_G$) is achieved between the lower electrode 104G and the upper electrode 120, an optical path length of $3\lambda_B/2$ (i.e., $1.5\lambda_B$) is achieved between the lower electrode 104B and the upper electrode 120, and an optical path length of $2\lambda_Y/2$ (i.e., $\lambda_Y$) is achieved between the lower electrode 104Y and the upper electrode 120 in the light-emitting device 170.

Furthermore, with the above-described optical path lengths, the distance between the lower electrode 104B and the light-emitting layer 108 can be longer than the distance between the lower electrode 104R and the light-emitting layer 108, the distance between the lower electrode 104G and the light-emitting layer 108, and the distance between the lower electrode 104Y and the light-emitting layer 108.

Note that, to be exact, the optical path length between the lower electrode 104Y and the upper electrode 120 is represented by the product of the distance between a reflective region in the lower electrode 104Y and a reflective region in the upper electrode 120 and the refractive index. However, it is difficult to exactly determine the reflective regions in the lower electrode 104Y and the upper electrode 120; therefore, positions in the lower electrode 104Y and the upper electrode 120 are determined as the reflective regions. Thus, the above-described effect can be achieved.

That is, in this specification and the like, "around $\lambda_Y$" is $\lambda_Y \pm 20$ nm.

As described above, by adjusting the optical path length between the lower electrode and the upper electrode of each light-emitting element in the light-emitting device 170 shown in FIG. 15, scattering or absorption of light in the vicinity of the lower electrode can be suppressed, resulting in high light extraction efficiency. The other components are similar to those of the light-emitting device 150 shown in FIG. 1, and the effect similar to that in the case of the light-emitting device 150 is obtained.

<Structural Example 9 of Light-Emitting Device>

Next, a structural example different from that of the light-emitting device 170 illustrated in FIG. 15 will be described below with reference to FIG. 16.

Figure 16:
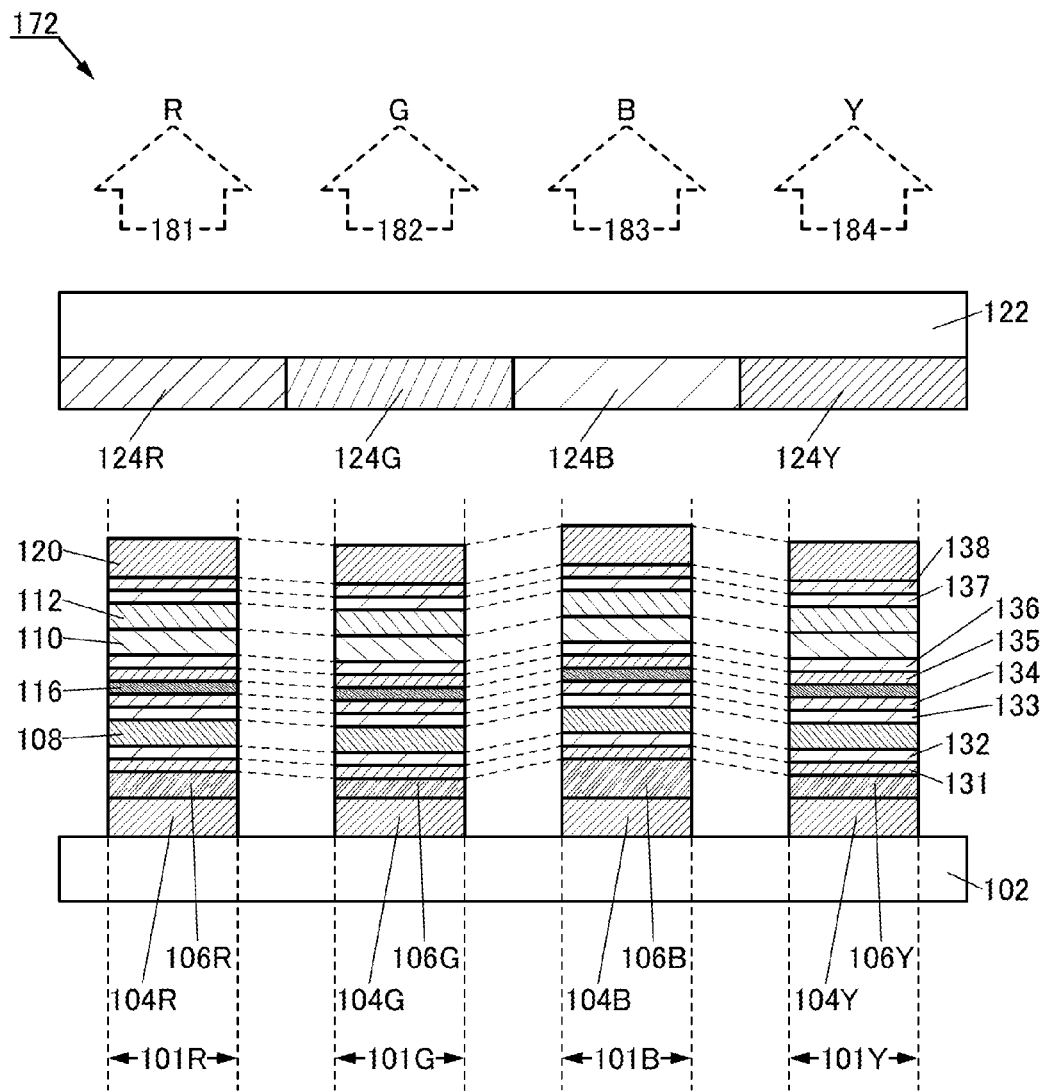
FIG. 16 is a cross-sectional view illustrating a light-emitting device of one embodiment of the present invention.

FIG. 16 is a cross-sectional view illustrating an example of a light-emitting device of one embodiment of the present invention. In FIG. 16, a portion having a function similar to that in FIG. 15 is represented by the same hatch pattern as in FIG. 15 and not especially denoted by a reference numeral in some cases. In addition, common reference numerals are used for portions having similar functions, and a detailed description of the portions is omitted in some cases.

A light-emitting device 172 shown in FIG. 16 differs from the light-emitting device 170 shown in FIG. 15 in the structure of the EL layer included in each of the light-emitting elements (the light-emitting element 101R, the light-emitting element 101G, the light-emitting element 101B, and the light-emitting element 101Y). Specifically, the light-emitting layer 112 is provided between the light-emitting layer 110 and the upper electrode 120.

The light-emitting layer 112 contains a third light-emitting substance that emits light of at least one of green, yellow green, yellow, orange, and red. Note that the light-emitting layer 110 and the light-emitting layer 112 are preferably made to emit light of different colors. In the light-emitting device 172, the first light-emitting substance that emits blue light, the second light-emitting substance that emits green light, and the third light-emitting substance that emits red light are preferably used as the light-emitting layer 108, the light-emitting layer 110, and the light-emitting layer 112, respectively.

The three light-emitting layers (the light-emitting layer 108, the light-emitting layer 110, and the light-emitting layer 112) provided in the EL layer as described above can increase color purity of each light-emitting element. However, the light-emitting layer 112 increases the number of layers in the EL layer. In the case where the number of EL layers should be small, the light-emitting device 170 shown in FIG. 15 is preferable. The other components are similar to those of the light-emitting device 170 shown in FIG. 15, and the effect similar to that in the case of the light-emitting device 170 is obtained.

<Structural Example 10 of Light-Emitting Device>

Next, a structural example different from the light-emitting device 170 shown in FIG. 15 will be described below with reference to FIG. 17.

Figure 17:
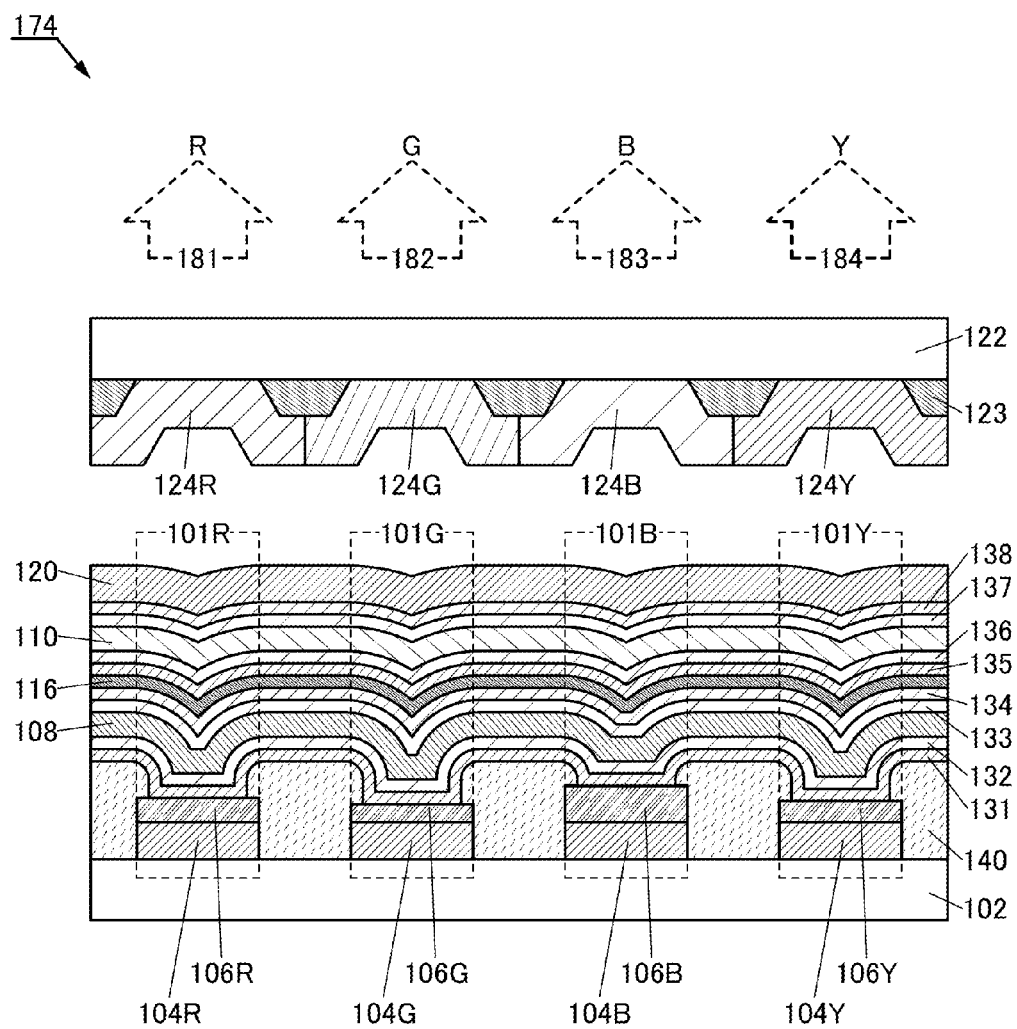
FIG. 17 is a cross-sectional view illustrating a light-emitting device of one embodiment of the present invention.

FIG. 17 is a cross-sectional view illustrating an example of a light-emitting device of one embodiment of the present invention. In FIG. 17, a portion having a function similar to that in FIGS. 15 and 16 is represented by the same hatch pattern as in FIGS. 15 and 16 and not especially denoted by a reference numeral in some cases. In addition, common reference numerals are used for portions having similar functions, and a detailed description of the portions is omitted in some cases.

A light-emitting device 174 shown in FIG. 17 differs from the light-emitting device 170 shown in FIG. 15 in having the partition wall 140 and the light-blocking layer 123. The other components are similar to those of the light-emitting device 170 shown in FIG. 15, and the effect similar to that in the case of the light-emitting device 170 is obtained.

The partition wall 140 has an insulating property. The partition wall 140 covers end portions of the lower electrodes (the lower electrode 104R, the lower electrode 104G, the lower electrode 104B, and the lower electrode 104Y) and the transparent conductive films (the transparent conductive film 106R, the transparent conductive film 106G, the transparent conductive film 106B, and the transparent conductive film 106Y) of the light-emitting elements and has opening portions that overlap with the lower electrodes. With the partition wall 140, the lower electrodes of the light-emitting elements and the transparent conductive films of the light-emitting elements can have divided island shapes.

The light-blocking layer 123 has a function of blocking light from the adjacent light-emitting element. Note that a structure without the light-blocking layer 123 may also be employed.

<Structural Example 11 of Light-Emitting Device>

Next, a structural example different from that of the light-emitting device 176 shown in FIG. 15 will be described below with reference to FIG. 18.

Figure 18:
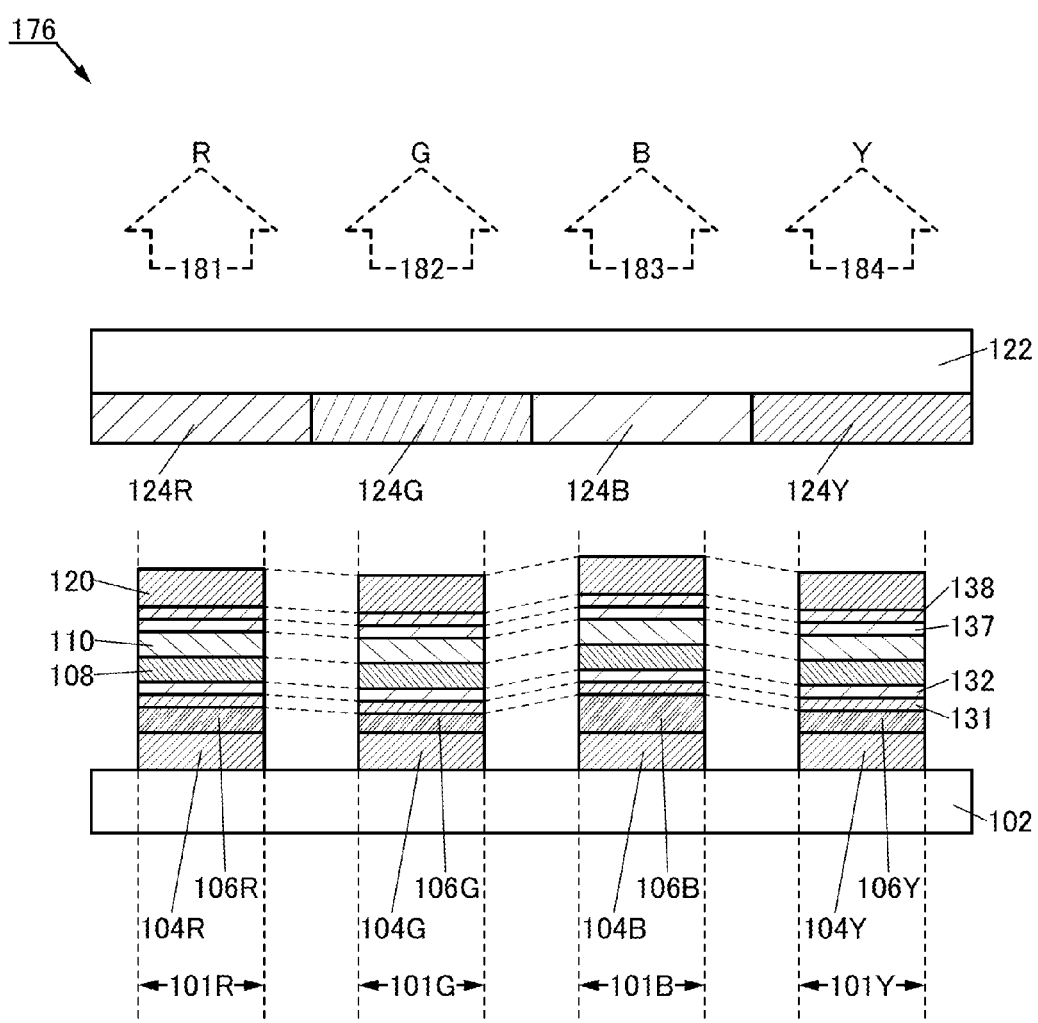
FIG. 18 is a cross-sectional view illustrating a light-emitting device of one embodiment of the present invention.

FIG. 18 is a cross-sectional view of a light-emitting device of one embodiment of the present invention. In FIG. 18, a portion having a function similar to that in FIGS. 15 to 17 is represented by the same hatch pattern as in FIGS. 15 to 17 and not especially denoted by a reference numeral in some cases. In addition, common reference numerals are used for portions having similar functions, and a detailed description of the portions is omitted in some cases.

A light-emitting device 176 shown in FIG. 18 differs from the light-emitting device 170 shown in FIG. 15 in the structure of the EL layer included in each of the light-emitting elements (the light-emitting element 101R, the light-emitting element 101G, the light-emitting element 101B, and the light-emitting element 101Y). Specifically, in each light-emitting element of the light-emitting device 176 shown in FIG. 18, the electron-transport layer 133, the electron-injection layer 134, the charge-generation layer 116, the hole-injection layer 135, and the hole-transport layer 136 are not provided between the light-emitting layer 108 and the light-emitting layer 110. The structure in which the light-emitting layer 108 and the light-emitting layer 110 are in contact with each other as shown in FIG. 18 can reduce the number of layers in the EL layer, resulting in a reduction of the manufacturing cost. Note that although not shown, a buffer layer without a light-emitting material (the layer is also referred to as a separation layer or a separate layer) may be provided between the light-emitting layer 108 and the light-emitting layer 110 in FIG. 18. The other components are similar to those of the light-emitting device 170 shown in FIG. 15, and the effect similar to that in the case of the light-emitting device 170 is obtained.

<Structural Example 12 of Light-Emitting Device>

Next, a structural example different from the light-emitting device 170 shown in FIG. 15 will be described below with reference to FIG. 19.

Figure 19:
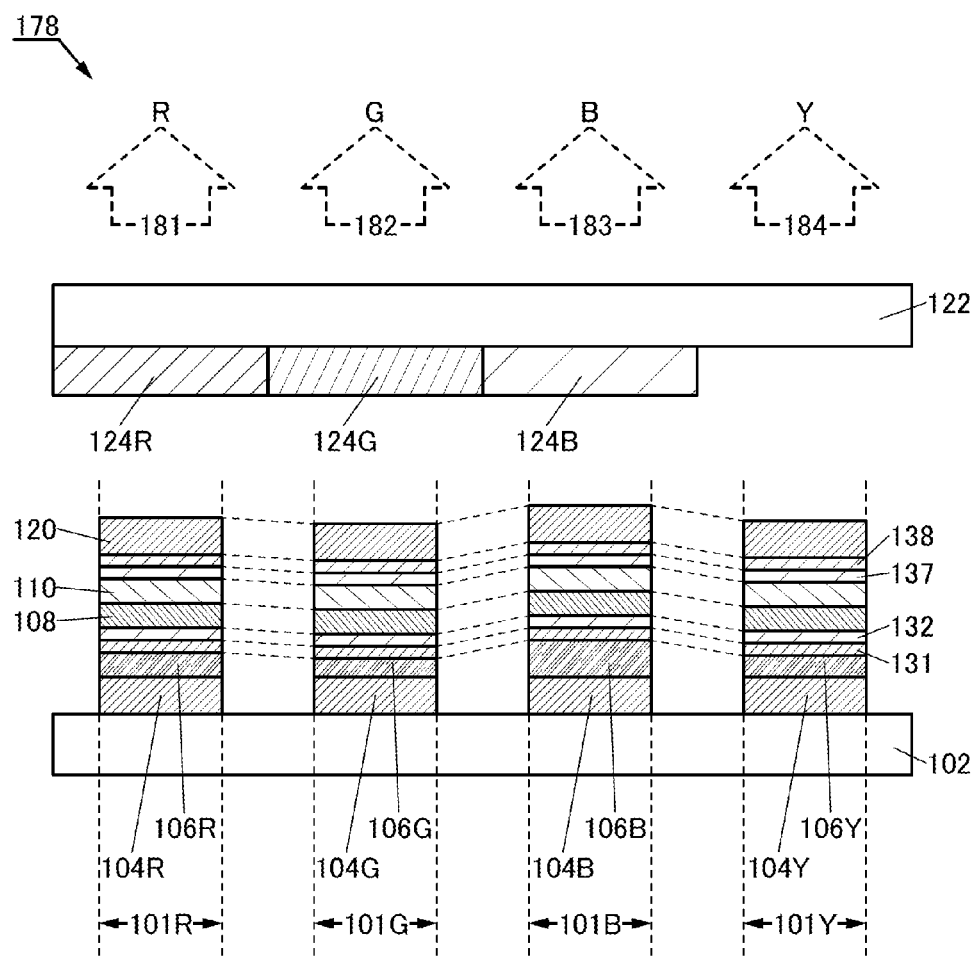
FIG. 19 is a cross-sectional view illustrating a light-emitting device of one embodiment of the present invention.

FIG. 19 is a cross-sectional view illustrating an example of a light-emitting device of one embodiment of the present invention. In FIG. 19, a portion having a function similar to that in FIGS. 15 to 18 is represented by the same hatch pattern as in FIGS. 15 to 18 and not especially denoted by a reference numeral in some cases. In addition, common reference numerals are used for portions having similar functions, and a detailed description of the portions is omitted in some cases.

A light-emitting device 178 shown in FIG. 19 does not include the optical element 124Y included in the light-emitting device 176 shown in FIG. 18. Since the optical element 124Y is not provided, light emitted from the light-emitting element 101Y can be directly extracted to the outside, leading to low power consumption. Note that in the case where color purity is increased or the reflection of outside light is suppressed, the structure provided with the optical element 124Y is preferable as in the light-emitting device 176 shown in FIG. 18. The other components are similar to those of the light-emitting device 176 illustrated in FIG. 18, and the effect similar to that in the case of the light-emitting device 176 is obtained.

<Structural Example 13 of Light-Emitting Device>

Next, a structural example different from the light-emitting device 170 shown in FIG. 15 will be described below with reference to FIG. 20.

Figure 20:
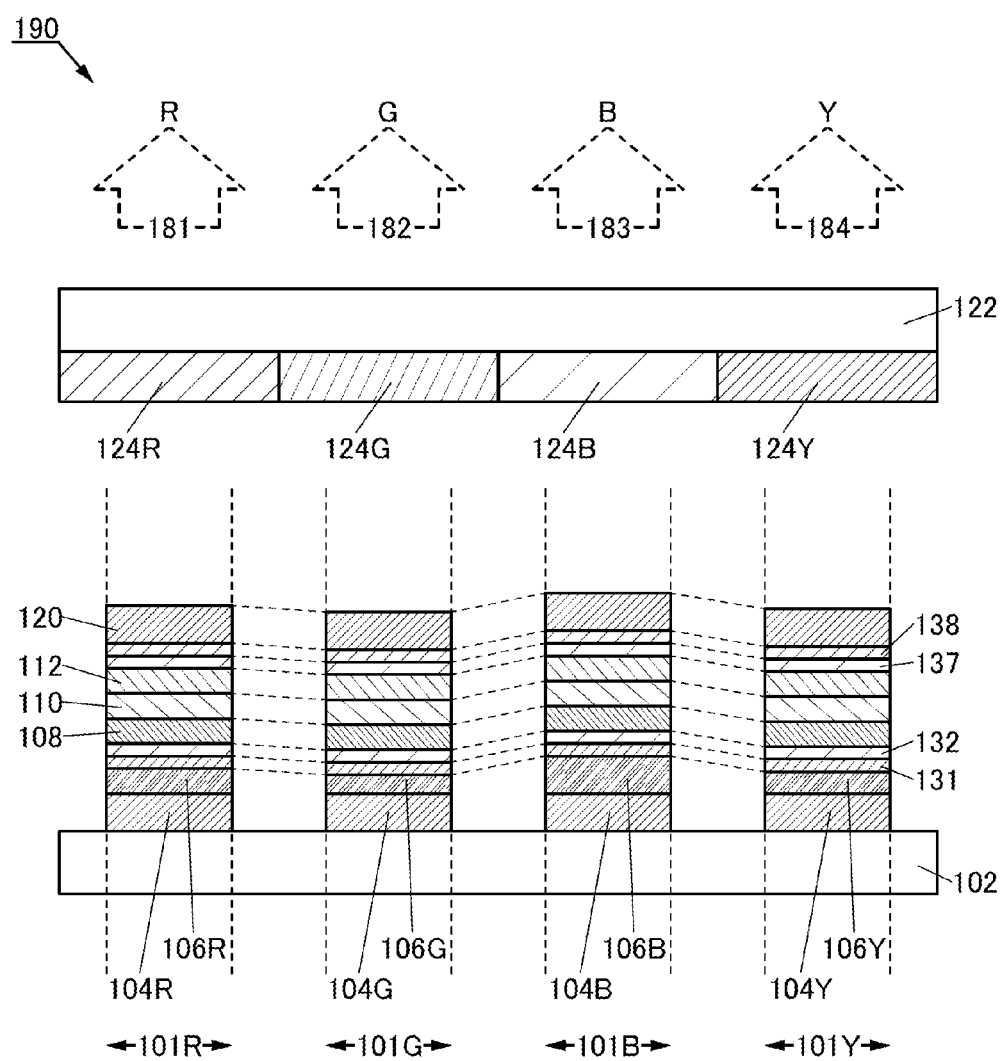
FIG. 20 is a cross-sectional view illustrating a light-emitting device of one embodiment of the present invention.

FIG. 20 is a cross-sectional view illustrating an example of a light-emitting device of one embodiment of the present invention. In FIG. 20, a portion having a function similar to that in FIGS. 15 to 19 is represented by the same hatch pattern as in FIGS. 15 to 19 and not especially denoted by a reference numeral in some cases. In addition, common reference numerals are used for portions having similar functions, and a detailed description of the portions is omitted in some cases.

A light-emitting device 190 shown in FIG. 20 differs from the light-emitting device 176 shown in FIG. 18 in the structure of the EL layer included in each of the light-emitting elements (the light-emitting element 101R, the light-emitting element 101G, the light-emitting element 101B, and the light-emitting element 101Y). Specifically, the light-emitting layer 112 is provided between the light-emitting layer 110 and the electron-transport layer 137. The light-emitting layer 112 is similar to the light-emitting layer 112 of the light-emitting device 172 described above. The other components are similar to those of the light-emitting device 176 shown in FIG. 18, and the effect similar to that in the case of the light-emitting device 176 is obtained.

<Structural Example 14 of Light-Emitting Device>

The light-emitting devices shown in FIGS. 15 to 20 have a top-emission structure; however, the light-emitting devices may have a bottom-emission structure as shown in FIGS. 21 to 26.

Figure 21:
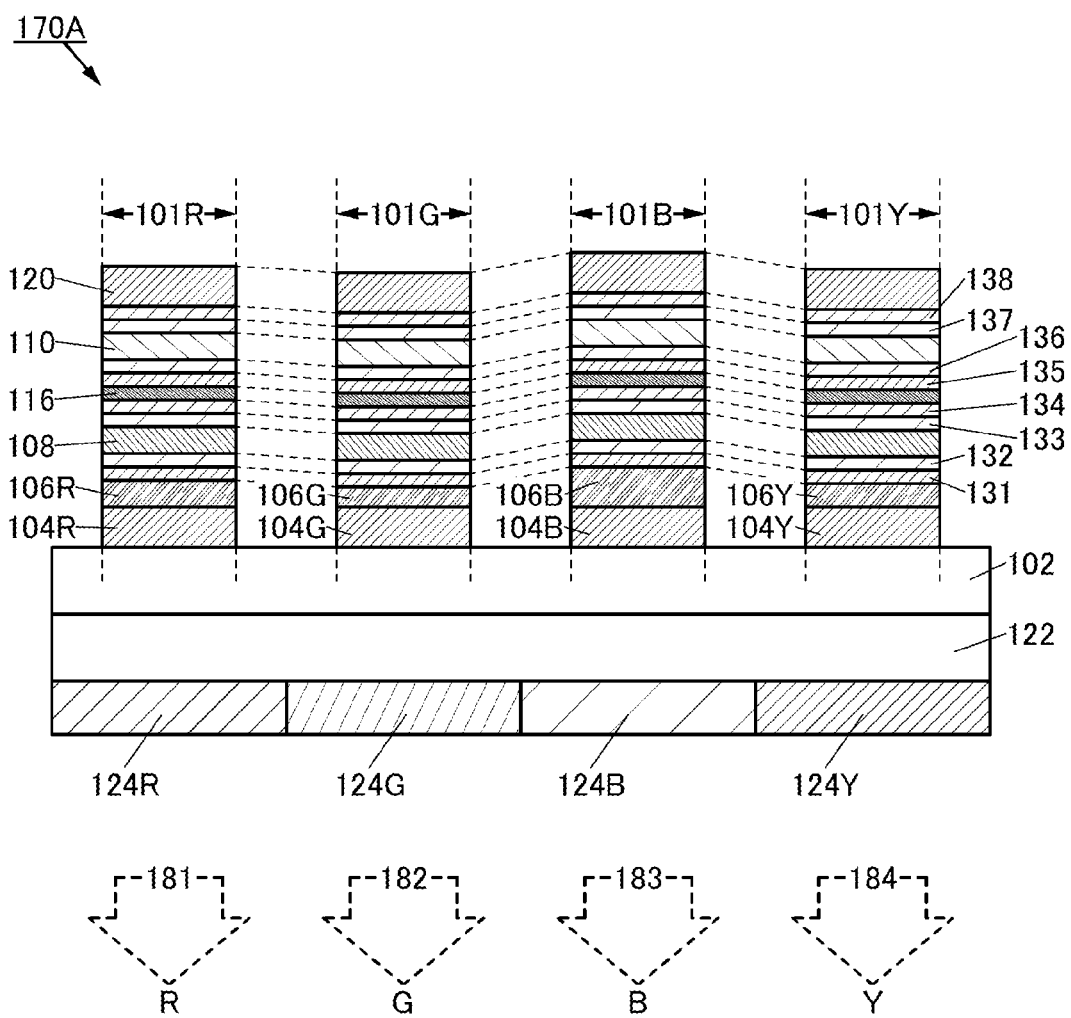
FIG. 21 is a cross-sectional view illustrating a light-emitting device of one embodiment of the present invention.
Figure 22:
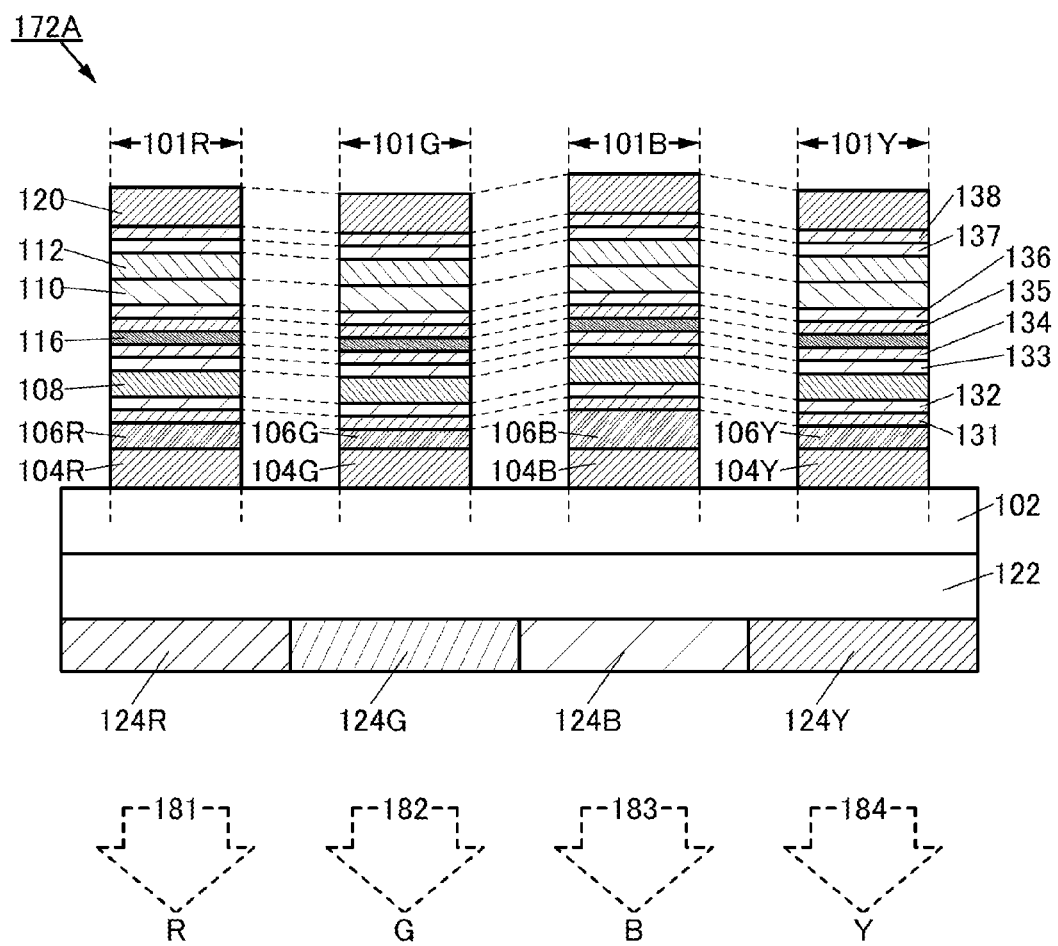
FIG. 22 is a cross-sectional view illustrating a light-emitting device of one embodiment of the present invention.
Figure 23:
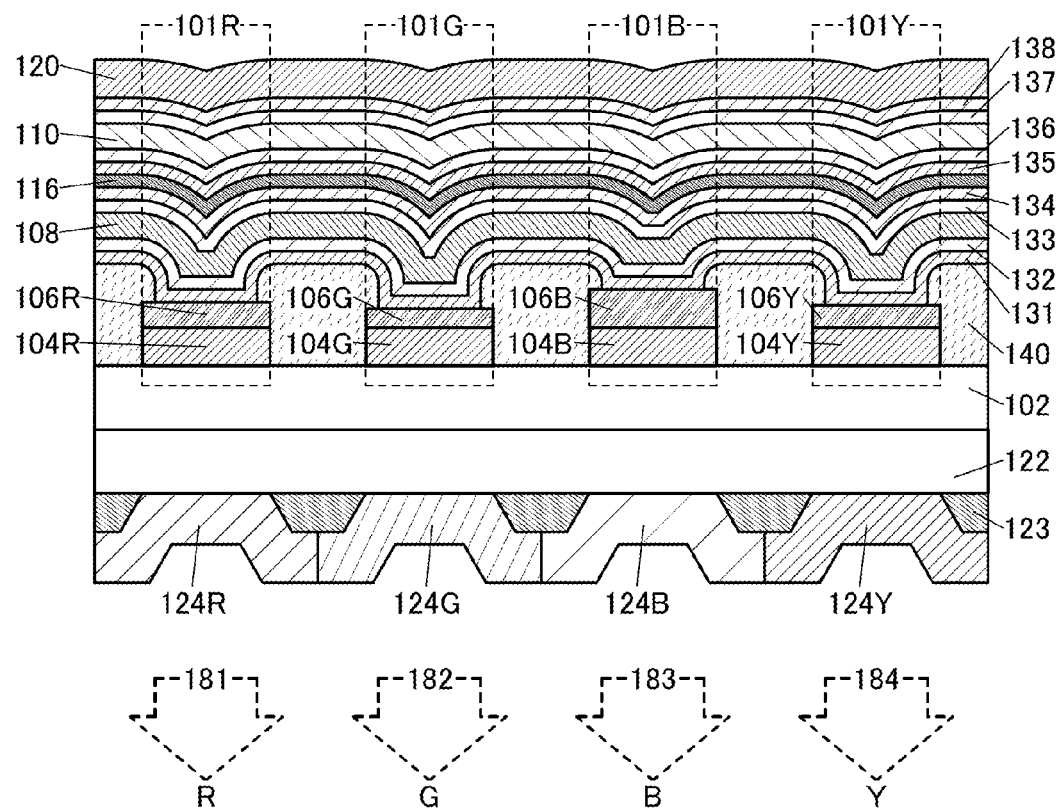
FIG. 23 is a cross-sectional view illustrating a light-emitting device of one embodiment of the present invention.
Figure 24:
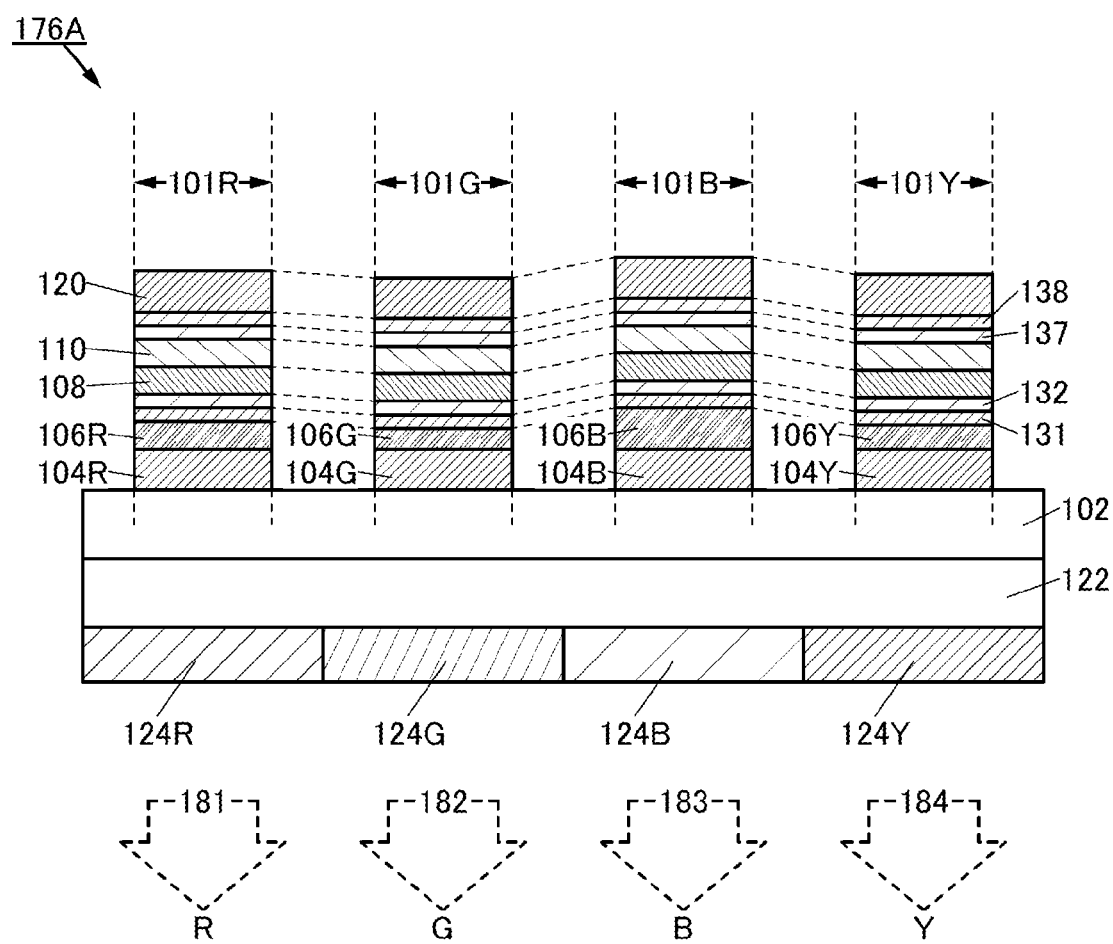
FIG. 24 is a cross-sectional view illustrating a light-emitting device of one embodiment of the present invention.
Figure 25:
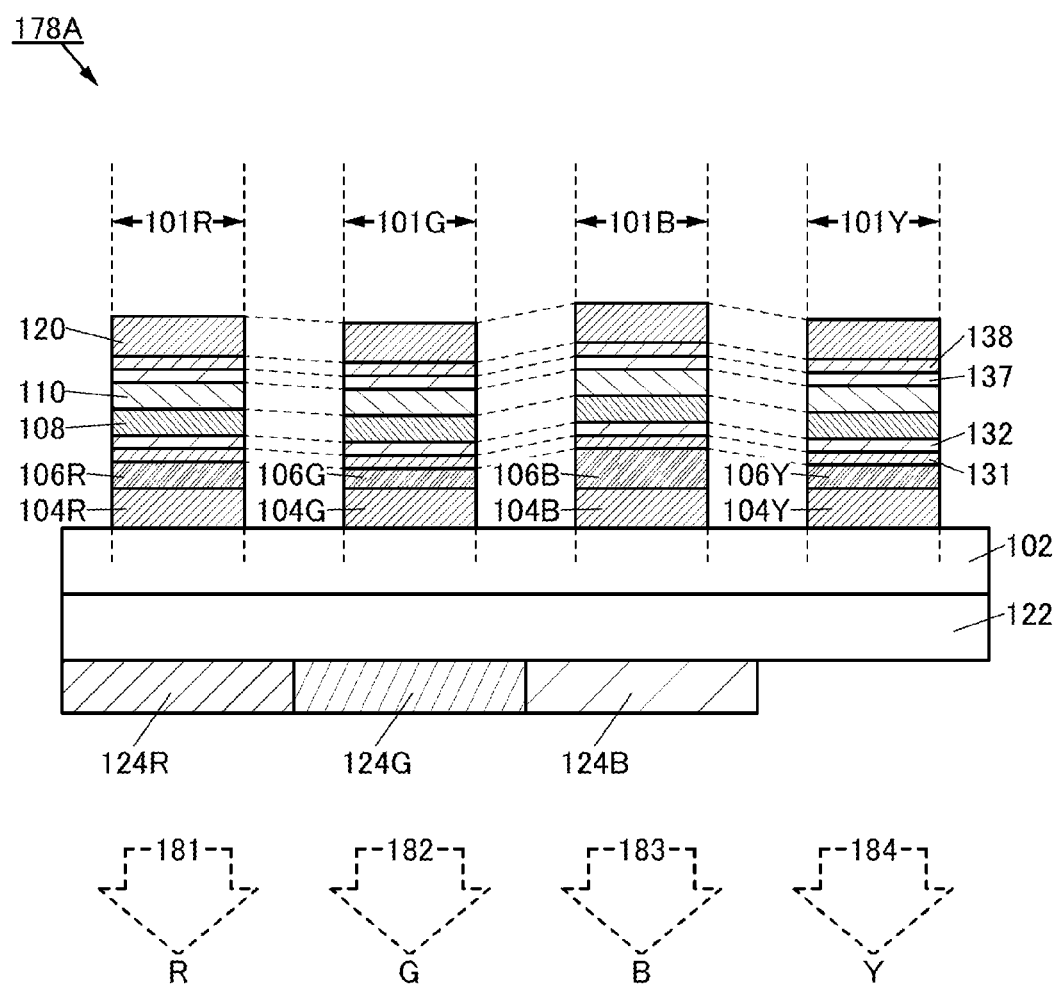
FIG. 25 is a cross-sectional view illustrating a light-emitting device of one embodiment of the present invention.
Figure 26:
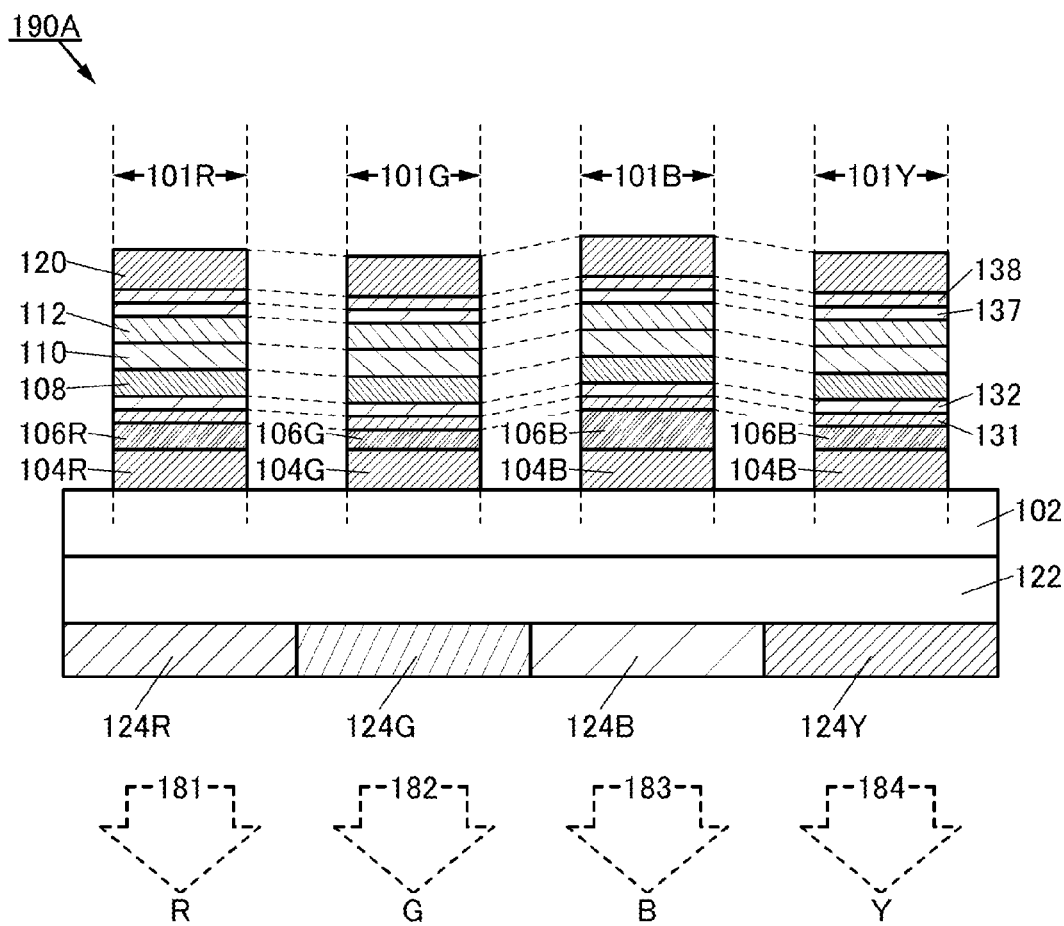
FIG. 26 is a cross-sectional view illustrating a light-emitting device of one embodiment of the present invention.

FIG. 21 is a cross-sectional view of a light-emitting device 170A that is a modification example of the light-emitting device 170 shown in FIG. 15. FIG. 22 is a cross-sectional view of a light-emitting device 172A that is a modification example of the light-emitting device 172 shown in FIG. 16. FIG. 23 is a cross-sectional view of a light-emitting device 174A that is a modification example of the light-emitting device 154 shown in FIG. 17. FIG. 24 is a cross-sectional view of a light-emitting device 176A that is a modification example of the light-emitting device 176 shown in FIG. 18. FIG. 25 is a cross-sectional view of a light-emitting device 178A that is a modification example of the light-emitting device 178 shown in FIG. 19. FIG. 26 is a cross-sectional view of a light-emitting device 190A that is a modification example of the light-emitting device 190 shown in FIG. 20.

Note that in the case where the light-emitting device has a bottom-emission structure as shown in FIGS. 21 to 26, the lower electrode and the upper electrode of each light-emitting element may have the following structures.

For example, the lower electrode 104R, the lower electrode 104G, the lower electrode 104B, and the lower electrode 104Y each have a function of reflecting visible light and a function of transmitting visible light. The upper electrode 120 has a function of reflecting visible light.

The above-described structures of the light-emitting devices can be combined as appropriate.

<Components of Light-Emitting Device>

Components of the light-emitting elements shown in FIGS. 1 to 26 are described in detail below.

<<Substrate>>

The substrate 102 is used as a support of the light-emitting elements. The substrate 122 is used as a support of the optical elements. For the substrates 102 and 122, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting elements or the optical elements. Another material having a function of protecting the light-emitting elements or the optical elements may be used.

Note that in this specification and the like, a transistor or a light-emitting element can be formed using any of a variety of substrates, for example. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, a soda lime glass substrate, or the like can be given. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate such that the transistor and the light-emitting element may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the transistor and the light-emitting element is formed using a substrate, the transistor and the light-emitting element may be transferred to another substrate. Example of the substrate to which the transistor and the light-emitting element are transferred are, in addition to the above substrate over which the transistor can be formed, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

<<Lower Electrode>>

The lower electrode 104R, the lower electrode 104G, the lower electrode 104B, and the lower electrode 104Y each function as an anode or a cathode of each light-emitting element. Note that each of the lower electrode 104R, the lower electrode 104G, the lower electrode 104B, and the lower electrode 104Y is preferably formed using a reflective conductive material containing silver. Examples of the conductive material include silver (Ag) and an alloy containing silver (Ag) and M (M is yttrium (Y), neodymium (Nd), magnesium (Mg), aluminum (Al), titanium (Ti), gallium (Ga), zinc (Zn), indium (In), tungsten (W), manganese (Mn), ytterbium (Yb), tin (Sn), iron (Fe), nickel (Ni), copper (Cu), palladium (Pd), iridium (Ir), or gold (Au)). Examples of the alloy containing silver include an alloy containing silver, palladium, and copper, an alloy containing silver and copper, an alloy containing silver and magnesium, an alloy containing silver and nickel, and an alloy containing silver and gold.

The lower electrode 104R, the lower electrode 104G, the lower electrode 104B, and the lower electrode 104Y can each be formed using a conductive material whose visible light reflectivity is higher than or equal to 40% and lower than or equal to 100%, preferably higher than or equal to 70% and lower than or equal to 100%, and whose resistivity is lower than or equal to $1\times10^{-2}$ Ω·cm. The lower electrode 104R, the lower electrode 104G, the lower electrode 104B, and the lower electrode 104Y can each be formed by a sputtering method, an evaporation method, a printing method, a coating method, or the like.

<<Transparent Conductive Film>>

The transparent conductive film 106R, the transparent conductive film 106G, the transparent conductive film 106B, and the transparent conductive film 106Y each function as the lower electrode, the anode, or the cathode of each light-emitting element. In addition, the transparent conductive film 106R, the transparent conductive film 106G, the transparent conductive film 106B, and the transparent conductive film 106Y each have a function of adjusting the optical path length so that desired light emitted from each light-emitting layer resonates and its wavelength can be amplified.

The transparent conductive film 106R, the transparent conductive film 106G, the transparent conductive film 106B, and the transparent conductive film 106Y can each be formed using, for example, ITO, ITSO, indium oxide-zinc oxide (indium zinc oxide), or indium oxide containing tungsten oxide and zinc oxide. In particular, the transparent conductive film 106R, the transparent conductive film 106G, the transparent conductive film 106B, and the transparent conductive film 106Y are each preferably formed using a material with a high work function (higher than or equal to 4.0 eV). The transparent conductive film 106R, the transparent conductive film 106G, the transparent conductive film 106B, and the transparent conductive film 106Y can each be formed by a sputtering method, an evaporation method, a printing method, a coating method, or the like.

<<Upper Electrode>>

The upper electrode 120 functions as the cathode or the anode of each light-emitting element. Note that the upper electrode 120 is formed using a reflective conductive material. As the conductive material, a conductive material having a visible light reflectivity of higher than or equal to 40% and lower than or equal to 100%, preferably higher than or equal to 60% and lower than or equal to 100%, and a resistivity of lower than or equal to $1\times10^{-2}$ Ω·cm can be used. Alternatively, the upper electrode 120 is formed using a reflective conductive material and a light-transmitting conductive material. As the conductive materials, a conductive material having a visible light reflectivity of higher than or equal to 20% and lower than or equal to 80%, preferably higher than or equal to 40% and lower than or equal to 70%, and a resistivity of lower than or equal to $1\times10^{-2}$ Ω·cm can be used. The upper electrode 120 can be formed using one or more kinds of conductive metals and alloys, conductive compounds, and the like. In particular, in the case where the upper electrode 120 functions as the cathode, the upper electrode 120 is preferably formed using a material having a low work function (lower than or equal to 3.8 eV). The examples include aluminum, silver, an element belonging to Group 1 or 2 of the periodic table (e.g., an alkali metal such as lithium (Li) or cesium, an alkaline earth metal such as calcium or strontium, or magnesium), an alloy containing any of these elements (e.g., Ag—Mg or Al—Li), a rare earth metal such as europium or ytterbium, and an alloy containing any of these rare earth metals. The upper electrode 120 can be formed by a sputtering method, an evaporation method, a printing method, a coating method, or the like.

The light-emitting layer 108 contains the first light-emitting substance that emits light of at least one of violet, blue, and blue green. The light-emitting layer 110 contains the second light-emitting substance that emits light of at least one of green, yellow green, yellow, orange, and red. The light-emitting layer 112 contains the third light-emitting substance that emits light of at least one of green, yellow green, yellow, orange, and red. The light-emitting layer 108 contains either or both of an electron-transport material and a hole-transport material in addition to the first light-emitting substance. The light-emitting layer 110 contains either or both of an electron-transport material and a hole-transport material in addition to the second light-emitting substance. The light-emitting layer 112 contains either or both of an electron-transport material and a hole-transport material in addition to the third light-emitting substance.

As the first light-emitting substance, the second light-emitting substance, and the third light-emitting substance, any of light-emitting substances that convert singlet excitation energy into luminescence and light-emitting substances that convert triplet excitation energy into luminescence can be used. Examples of the light-emitting substance are given below.

Examples of the light-emitting substance that converts singlet excitation energy into luminescence include substances that emit fluorescence. An anthracene derivative, a tetracene derivative, a pyrene derivative, a perylene derivative, a stilbene derivative, and the like are preferable. For example, the following substances can be used: substances that emit blue light (emission wavelength: greater than or equal to 400 nm and less than or equal to 480 nm) such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-bis[4-(9-phenyl-9H-fluoren-9-yl)phenyl]-N,N'-diphenyl-pyrene-1,6-diamine (abbreviation: 1,6FLPAPrn), and N,N'-bis(3-methylphenyl)-N,N'-bis[3-(9-phenyl-9H-fluoren-9-yl)phenyl]-pyrene-1,6-diamine (abbreviation: 1,6mMemFLPAPrn); and substances that emit yellow light (emission wavelength: greater than or equal to 550 nm and less than 600 nm) such as rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2).

Examples of the light-emitting substance that converts triplet excitation energy into luminescence include substances that emit phosphorescence. For example, a substance having an emission peak at greater than or equal to 440 nm and less than or equal to 520 nm, a substance having an emission peak at greater than or equal to 520 nm and less than 600 nm, or a substance having an emission peak at greater than or equal to 600 nm and less than or equal to 700 nm can be used.

Examples of the substance that has an emission peak at greater than or equal to 440 nm and less than or equal to 520 nm include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[3-(5-biphenyl)-5-isopropyl-4-phenyl-4H-1,2,4-triazolato]iridium(III) (abbreviation: [Ir(iPr5btz)$_3$], and tris[4-(3-biphenyl)-5-isopropyl-3-phenyl-4H-1,2,4-triazolato]iridium(III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N, C$^{2'}$]iridium(III) acetylacetonate (abbreviation: FIr(acac)). Among the materials given above, the organometallic iridium complex having a 4H-triazole skeleton has high reliability and high emission efficiency and is thus especially preferable.

Examples of the substance that has an emission peak at greater than or equal to 520 nm and less than or equal to 600 nm include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); and a rare earth metal complex such as tris(acetylacetonato) (monophenanthroline)terbium(III) (abbreviation: Tb(acac)$_3$(Phen)). Among the materials given above, the organometallic iridium complex having a pyrimidine skeleton has distinctively high reliability and emission efficiency and is thus especially preferable.

Among the substances having an emission peak at greater than or equal to 520 nm and less than 600 nm, a substance having an emission peak at greater than or equal to 550 nm and less than or equal to 580 nm is especially preferably used. With the use of the substance having an emission peak at greater than or equal to 550 nm and less than or equal to 580 nm, the current efficiency of the light-emitting element can be increased.

Examples of the substance having an emission peak at greater than or equal to 550 nm and less than or equal to 580 nm include Ir(mpmppm)$_2$(acac), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), Ir(mppr-iPr)$_2$(acac), Ir(pq)$_3$, Ir(bzq)$_2$(acac), bis(2,4-diphenyl-1,3-oxazolato-N,C$^{2'}$)iridium(III)acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III)acetylacetonate (abbreviation: Ir(bt)$_2$(acac)).

Examples of the substance that has an emission peak at greater than or equal to 600 nm and less than or equal to 700 nm include organometallic iridium complexes having pyrimidine skeletons, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complex having a pyrimidine skeleton has distinctively high reliability and emission efficiency and is thus especially preferable. Further, the organometallic iridium complexes having pyrazine skeletons can provide red light emission with favorable chromaticity.

As the electron-transport material used for the light-emitting layer 108, the light-emitting layer 110, and the light-emitting layer 112, a π-electron deficient heteroaromatic compound such as a nitrogen-containing heteroaromatic compound is preferable, examples of which include quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

As the hole-transport material used for the light-emitting layer 108, the light-emitting layer 110, and the light-emitting layer 112, a π-electron rich heteroaromatic compound (e.g., a carbazole derivative or an indole derivative) or an aromatic amine compound is preferably used. Examples thereof include 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4"-tris[N-(1-naphthyl)-N-phenylamino]triphenylamine (abbreviation: 1'-TNATA), 2,7-bis[N-(4-diphenyl aminophenyl)-N-phenylamino]-spiro-9,9'-bifluorene (abbreviation: DPA2SF), N,N'-bis(9-phenylcarbazol-3-yl)-N,N-diphenylbenzene-1,3-diamine (abbreviation: PCA2B), N-(9,9-dimethyl-2-diphenylamino-9H-fluoren-7-yl)diphenylamine (abbreviation: DPNF), N,N',N"-triphenyl-N,N',N"-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenyl aminophenyl)-N-phenylamino]-9-phenylcarbazole (abbreviation: PCzDPA2), 4,4'-bis(N-{4-[N-(3-methylphenyl)-N-phenylamino]phenyl}-N-phenylamino)biphenyl (abbreviation: DNTPD), 3,6-bis[N-(4-diphenyl aminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

<<Hole-Injection Layer and Hole-Transport Layer>>

The hole-injection layer 131 injects holes into the light-emitting layer 108 through the hole-transport layer 132 with a high hole-transport property. The hole-injection layer 131 contains a hole-transport material and an acceptor substance, in which case electrons are extracted from the hole-transport material by the acceptor substance to generate holes and the holes are injected into the light-emitting layer 108 through the hole-transport layer 132. Note that the hole-transport layer 132 is formed using a hole-transport material. The hole-injection layer 135 injects holes into the light-emitting layer 110 through the hole-transport layer 136 with a high hole-transport property. The hole-injection layer 135 contains a hole-transport material and an acceptor substance, in which case electrons are extracted from the hole-transport material by the acceptor substance to generate holes and the holes are injected into the light-emitting layer 110 through the hole-transport layer 136. The hole-transport layer 136 is formed using a hole-transport material. The hole-injection layer 131 and the hole-injection layer 135 may also be formed using the above-described acceptor material alone or using the above-described acceptor material and another material in combination.

Examples of the acceptor substance that is used for the hole-injection layer 131 and the hole-injection layer 135 include oxides of metals belonging to Groups 4 to 8 of the periodic table. Specific examples thereof include vanadium oxide, niobium oxide, tantalum oxide, chromium oxide, molybdenum oxide, ruthenium oxide, tungsten oxide, manganese oxide, and rhenium oxide. Among these, molybdenum oxide is particularly preferable because it is stable in the air, has a low hygroscopic property, and is easily handled.

Other examples of the acceptor material include compounds having an electron-withdrawing group (a halogen group or a cyano group) such as 7,7,8,8-tetracyano-2,3,5,6-tetrafluoroquinodimethane (abbreviation: $F_4$-TCNQ), chloranil, and 2,3,6,7,10,11-hexacyano-1,4,5,8,9,12-hexaazatriphenylene (HAT-CN). In particular, a compound in which electron-withdrawing groups are bonded to a condensed aromatic ring having a plurality of hetero elements, like HAT-CN, is thermally stable and preferable.

Alternatively, a phthalocyanine-based compound such as phthalocyanine (abbreviation: $H_2Pc$) or copper phthalocyanine (abbreviation: CuPc) can be used for the hole-injection layer 131 and the hole-injection layer 135.

Examples of the hole-transport material used for the hole-injection layer 131, the hole-transport layer 132, the hole-injection layer 135, and the hole-transport layer 136 include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-Carbazole (abbreviation: CzPA). The substances described here are mainly substances having a hole mobility of $1 \times 10^{-6}$ cm$^2$/Vs or higher. However, besides the above materials, others may be used as long as the material has a higher hole transport property than an electron transport property. A composite material of the above-described hole-transport material and the acceptor substance can be used.

Further alternatively, a high molecular compound such as poly(N-vinylcarbazole) (abbreviation: PVK), poly(4-vinyltriphenylamine) (abbreviation: PVTPA), poly[N-(4-{N'-[4-(4-diphenyl amino)phenyl]phenyl-N-phenylamino}phenyl) methacrylamide] (abbreviation: PTPDMA), or poly[N,N'-bis(4-butylphenyl)-N,N'-bis(phenyl)benzidine] (abbreviation: Poly-TPD) can be used.

<<Electron-Transport Layer>>

The electron-transport layer 133 and the electron-transport layer 137 each contain a substance with a high electron-transport property. For the electron-transport layer 133 and the electron-transport layer 137, a metal complex such as tris(8-quinolinolate)aluminum(III) (abbreviation: Alq$_3$), tris(4-methyl-8-quinolinolate)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolate)aluminum(III) (abbreviation: BAlq), bis[2-(2-benzoxazolyl)phenolato]zinc (II) (abbreviation: Zn(BOX)$_2$, or bis[2-(2-hydroxyphenyl)benzothiazolato]zinc (II) (abbreviation: Zn(BTZ)$_2$) can be used. Other examples are heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4'-bis(5-methylbenzoxazol-2-yl)stilbene (abbreviation: BzOs). Further alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy). The materials mentioned here are mainly substances each having an electron mobility of $1 \times 10^{-6}$ cm$^2$/Vs or higher. Note that other substances may also be used for the electron-transport layer 133 and the electron-transport layer 137 as long as their electron-transport properties are higher than their hole-transport properties.

The electron-transport layer 133 and the electron-transport layer 137 is not limited to a single layer, and may be a stack of two or more layers each containing any of the above-described substances.

<<Electron-Injection Layer>>

The electron-injection layer 134 and the electron-injection layer 138 each contain a substance with a high electron-injection property. For the electron-injection layer 134, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 134 and the electron-injection layer 138. Examples of the electride include a substance in which electrons are added at high concentration to calcium oxide-aluminum oxide. The electron-injection layer 134 and the electron-injection layer 138 can be formed using the substance that can be used for the electron-transport layer 133 and the electron-transport layer 137.

Alternatively, the electron-injection layer 134 and the electron-injection layer 138 may be formed using a composite material in which an organic compound and an electron donor (donor) are mixed. The composite material is superior in an electron-injection property and an electron-transport property, since electrons are generated in the organic compound by the electron donor. The organic compound here is preferably a material excellent in transporting the generated electrons; specifically, for example, the substances for forming the electron-transport layer 133 and the electron-transport layer 137 (e.g., a metal complex or a heteroaromatic compound) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Further, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

<<Charge-Generation Layer>>

The charge-generation layer 116 has a function of injecting electrons into one of the light-emitting layers (the light-emitting layer 108 or the light-emitting layer 110) and injecting holes into the other light-emitting layer (the light-emitting layer 108 or the light-emitting layer 110), when a voltage is applied between the pair of electrodes (the lower electrode and the upper electrode).

For example, in the light-emitting element 101B illustrated in FIG. 1, when a voltage is applied such that the potential of the lower electrode (the lower electrode 104B and the transparent conductive film 106B) is higher than that of the upper electrode 120, the charge-generation layer 116 injects electrons into the light-emitting layer 108 and injects holes into the light-emitting layer 110.

Note that in terms of light extraction efficiency, the charge-generation layer 116 preferably transmits visible light (specifically, the charge-generation layer 116 has a visible light transmittance of higher than or equal to 40%). The charge-generation layer 116 functions even if it has lower conductivity than the pair of electrodes (the lower electrode and the upper electrode).

The charge-generation layer 116 may have either a structure in which an electron acceptor (acceptor) is added to a hole-transport material or a structure in which an electron donor (donor) is added to an electron-transport material. Alternatively, both of these structures may be stacked.

Note that forming the charge-generation layer 116 by using any of the above materials can suppress an increase in drive voltage caused by the stack of the light-emitting layers.

The above-described light-emitting layer, hole-transport layer, hole-injection layer, electron-transport layer, electron-injection layer, and charge-generation layer can each be formed by any of the following methods: an evaporation method (including a vacuum evaporation method), an ink-jet method, a coating method, gravure printing, and the like. Besides the above-mentioned materials, an inorganic compound or a high molecular compound (e.g., an oligomer, a dendrimer, or a polymer) may be used for the above-described light-emitting layer, hole-transport layer, hole-injection layer, electron-transport layer, electron-injection layer, and charge-generation layer.

The optical element 124R, the optical element 124G, the optical element 124B, and the optical element 124Y each selectively transmit light of a particular color out of incident light. For example, a coloring layer (also referred to as color filter), a band pass filter, a multilayer filter, or the like can be used, for example. Alternatively, color conversion elements can be used as the optical elements. A color conversion element is an optical element that converts incident light into light having a longer wavelength than the incident light. As the color conversion elements, quantum-dot elements are favorably used. The usage of the quantum-dot type can increase color reproducibility of the light-emitting device.

A plurality of optical elements may also be stacked over each of the optical element 124R, the optical element 124G, the optical element 124B, and the optical element 124Y. As another optical element, a circularly polarizing plate, an anti-reflective film, or the like can be provided, for example. A circularly polarizing plate provided on the side where light emitted from the light-emitting element of the light-emitting device is extracted can prevent a phenomenon in which light entering from the outside of the light-emitting device is reflected inside the light-emitting device and returned to the outside. An anti-reflective film can weaken external light reflected by a surface of the light-emitting device. Accordingly, light emitted from the light-emitting device can be observed clearly.

<<Light-Blocking Layer>>

The light-blocking layer 123 has a function of reducing the reflection of external light. The light-blocking layer 123 has a function of preventing mixing of light emitted from an adjacent light-emitting element. As the light-blocking layer 123, a metal, a resin containing black pigment, carbon black, a metal oxide, a composite oxide containing a solid solution of a plurality of metal oxides, or the like can be used.

<<Partition Wall>>

The partition wall 140 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

<Method for Manufacturing Light-Emitting Device>

Next, a manufacturing method of a light-emitting device of one embodiment of the present invention will be described below with reference to FIGS. 27A to 27D and FIGS. 28A and 28B. Here, a method for manufacturing the light-emitting device 174 illustrated in FIG. 17 will be described.

FIGS. 27A to 27D and FIGS. 28A and 28B are cross-sectional views illustrating a method for manufacturing the light-emitting device of one embodiment of the present invention.

The method for manufacturing the light-emitting device 174 described below includes first to seventh steps.

<<First Step>>

Figure 27A:
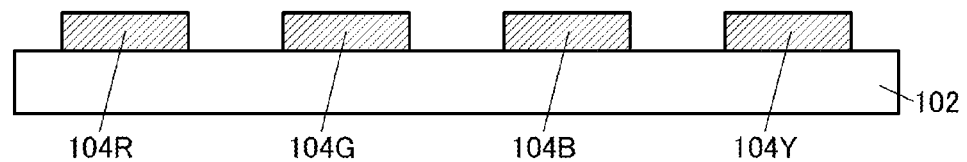
FIGS. 27A to 27D are cross-sectional views illustrating a method for manufacturing a light-emitting device of one embodiment of the present invention.

In the first step, the lower electrodes (e.g., the lower electrode 104R, the lower electrode 104G, the lower electrode 104B, and the lower electrode 104Y) of the light-emitting elements are formed over the substrate 102 (see FIG. 27A).

In this embodiment, a reflective conductive film is formed over the substrate 102 and processed into a desired shape; in this way, the lower electrode 104R, the lower electrode 104G, the lower electrode 104B, and the lower electrode 104Y are formed. As the reflective conductive film, an APC film is used. The lower electrode 104R, the lower electrode 104G, the lower electrode 104B, and the lower electrode 104Y are preferably formed through a step of processing the same conductive film, because the manufacturing cost can be reduced.

Note that a plurality of transistors may be formed over the substrate 102 before the first step. The plurality of transistors may be electrically connected to the lower electrode 104R, the lower electrode 104G, the lower electrode 104B, and the lower electrode 104Y.

<<Second Step>>

Figure 27B:
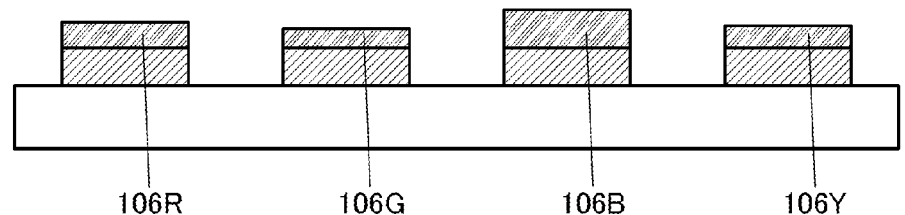

In the second step, the transparent conductive films (e.g., the transparent conductive film 106R, the transparent conductive film 106G, the transparent conductive film 106B, and the transparent conductive film 106Y) of the light-emitting element are formed over the lower electrodes (see FIG. 27B).

In this embodiment, a transparent conductive film is formed over the substrate 102, the transparent conductive film 106R, the transparent conductive film 106G, the transparent conductive film 106B, and the transparent conductive film 106Y and processed into a desired shape; in this way, the transparent conductive film 106R, the transparent conductive film 106G, the transparent conductive film 106B, and the transparent conductive film 106Y are formed. As the transparent conductive film, an ITSO film is used.

The transparent conductive film 106R, the transparent conductive film 106G, the transparent conductive film 106B, and the transparent conductive film 106Y may be formed through a plurality of steps. When the transparent conductive film 106R, the transparent conductive film 106G, the transparent conductive film 106B, and the transparent conductive film 106Y are formed through a plurality of steps, they can be formed to have thicknesses which enable each light-emitting element to have a microcavity structure.

<<Third Step>>

Figure 27C:
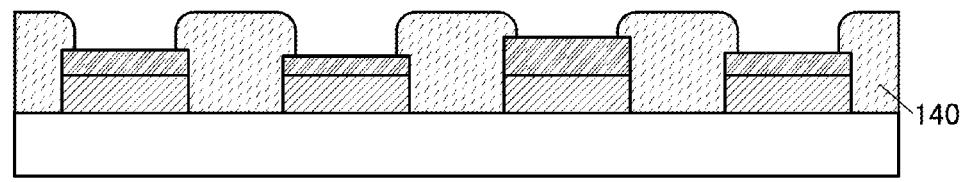

In the third step, the partition wall 140 that covers end portions of the lower electrode and the transparent conductive film of each light-emitting element is formed (see FIG. 27C).

The partition wall 140 includes an opening overlapping with the lower electrode. The transparent conductive film exposed by the opening functions as the anode of the light-emitting element. As the partition wall 140, a polyimide-based resin is used in this embodiment.

In the first to third steps, since there is no possibility of damaging the EL layer (a layer containing an organic compound), a variety of film formation methods and micromachining technologies can be employed. In this embodiment, a reflective conductive film is formed by a sputtering method, the conductive film is patterned by a lithography method, and then the conductive film is processed into an island shape by a dry etching method or a wet etching method to form the lower electrode 104R, the lower electrode 104G, the lower electrode 104B, and the lower electrode 104Y. Then, a transparent conductive film is formed by a sputtering method, a pattern is formed over the transparent conductive film by a lithography method, and then the transparent conductive film is processed into an island shape by a wet etching method to form the transparent conductive film 106R, the transparent conductive film 106G, the transparent conductive film 106B, and the transparent conductive film 106Y.

<<Fourth Step>>

Figure 27D:
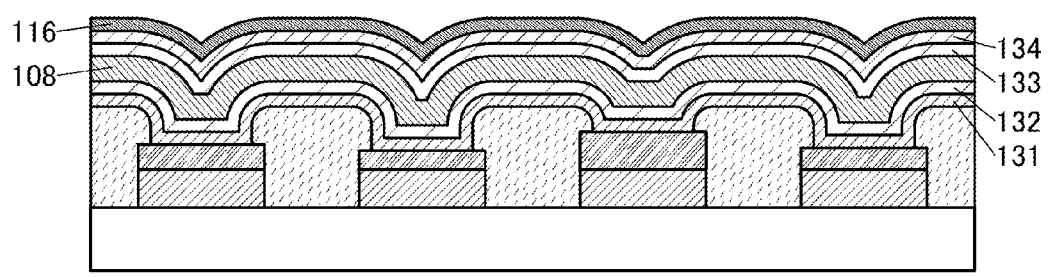

In the fourth step, the hole-injection layer 131, the hole-transport layer 132, the light-emitting layer 108, the electron-transport layer 133, the electron-injection layer 134, and the charge-generation layer 116 are formed (see FIG. 27D).

The hole-injection layer 131 can be formed by co-evaporating a hole-transport material and a material containing an acceptor substance. Note that co-evaporation is an evaporation method in which a plurality of different substances are concurrently vaporized from their respective evaporation sources. The hole-transport layer 132 can be formed by evaporating a hole-transport material.

The light-emitting layer 108 can be formed by evaporating the first light-emitting substance that emits light of at least one of violet, blue, and blue green. As the first light-emitting substance, a fluorescent organic compound can be used. The fluorescent organic compound may be evaporated alone or the fluorescent organic compound mixed with another material may be evaporated.

The electron-transport layer 133 can be formed by evaporating a substance with a high electron-transport property. The electron-injection layer 134 can be formed by evaporating a substance with a high electron-injection property.

The charge-generation layer 116 can be formed by evaporating a material obtained by adding an electron acceptor (acceptor) to a hole-transport material or a material obtained by adding an electron donor (donor) to an electron-transport material.

<<Fifth Step>>

Figure 28A:
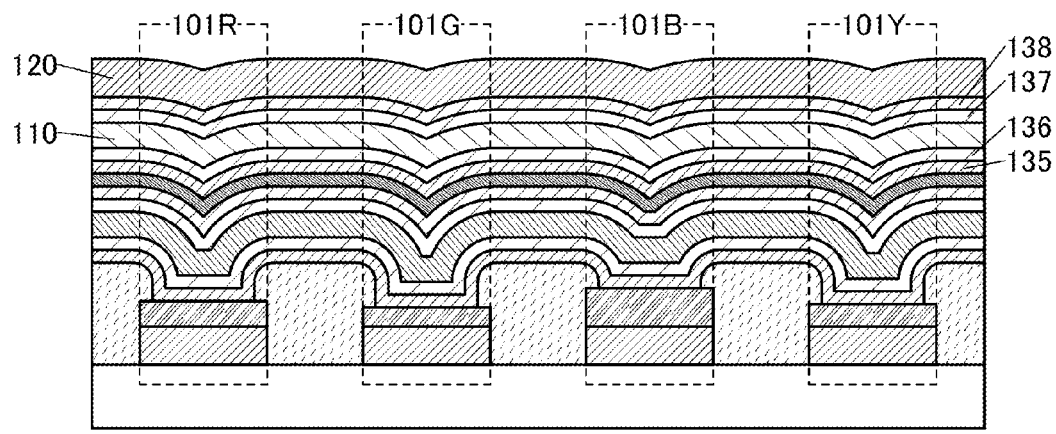
FIGS. 28A and 28B are cross-sectional views illustrating the method for manufacturing a light-emitting device of one embodiment of the present invention.

In the fifth step, the hole-injection layer 135, the hole-transport layer 136, the light-emitting layer 110, the electron-transport layer 137, the electron-injection layer 138, and the upper electrode 120 are formed (see FIG. 28A).

The hole-injection layer 135 can be formed by using a material and a method which are similar to those of the hole-injection layer 131. The hole-transport layer 136 can be formed by using a material and a method which are similar to those of the hole-transport layer 132.

The light-emitting layer 110 can be formed by evaporating the second light-emitting substance that emits light of at least one of green, yellow green, yellow, orange, and red. As the second light-emitting substance, a phosphorescent organic compound can be used. The phosphorescent organic compound may be vapor-deposited alone or the phosphorescent organic compound mixed with another material may be vapor-deposited. For example, the phosphorescent organic compound may be used as a guest material, and the guest material may be dispersed into a host material having higher excitation energy than the guest material.

The electron-transport layer 137 can be formed by evaporating a substance with a high electron-transport property. The electron-injection layer 138 can be formed by evaporating a substance with a high electron-injection property.

The upper electrode 120 can be formed by stacking a reflective conductive film and a light-transmitting conductive film. The upper electrode 120 may have a single-layer structure or a stacked structure.

Through the above-described steps, the light-emitting element 101R, the light-emitting element 101G, the light-emitting element 101B, and the light-emitting element 101Y are formed over the substrate 102.

<<Sixth Step>>

Figure 28B:
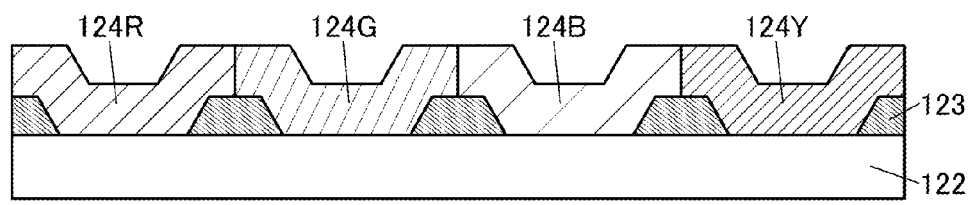

In the sixth step, the light-blocking layer 123, the optical element 124R, the optical element 124G, the optical element 124B, and the optical element 124Y are formed over the substrate 122 (see FIG. 28B).

As the light-blocking layer 123, an organic resin film containing black pigment is formed in a desired region. Then, the optical element 124R, the optical element 124G, the optical element 124B, and the optical element 124Y are formed over the substrate 122 and the light-blocking layer 123. As the optical element 124R, an organic resin film containing red pigment is formed in a desired region. As the optical element 124G, an organic resin film containing green pigment is formed in a desired region. As the optical element 124B, an organic resin film containing blue pigment is formed in a desired region. As the optical element 124Y, an organic resin film containing yellow pigment is formed in a desired region.

<<Seventh Step>>

In the seventh step, the light-emitting element 101R, the light-emitting element 101G, the light-emitting element 101B, and the light-emitting element 101Y formed over the substrate 102 are attached to the light-blocking layer 123, the optical element 124R, the optical element 124G, the optical element 124B, and the optical element 124Y formed over the substrate 122, and sealed with a sealant (not shown).

Through the above-described steps, the light-emitting device 174 illustrated in FIG. 17 can be formed.

This embodiment can be combined as appropriate with any of the other embodiments.

Embodiment 2

In this embodiment, a light emission mechanism in the light-emitting element which can be used in the light-emitting element of one embodiment of the present invention, the light-emitting device of one embodiment of the present invention, or the display device of one embodiment of the present invention is described with reference to FIG. 29, FIGS. 30A and 30B, and FIG. 31.

In this specification and the like, a fluorescent material refers to a material that emits light in the visible light region when the level of the lowest singlet excited state ($S_1$ level) relaxes to the ground state. A phosphorescent material refers to a material that emits light in the visible light region at room temperature when the level of the lowest triplet excited state ($T_1$ level) relaxes to the ground state. That is, a phosphorescent material refers to a material that can convert triplet excitation energy into visible light.

Note that in this specification and the like, "room temperature" refers to a temperature in a range of 0° C. to 40° C.

Figure 29:
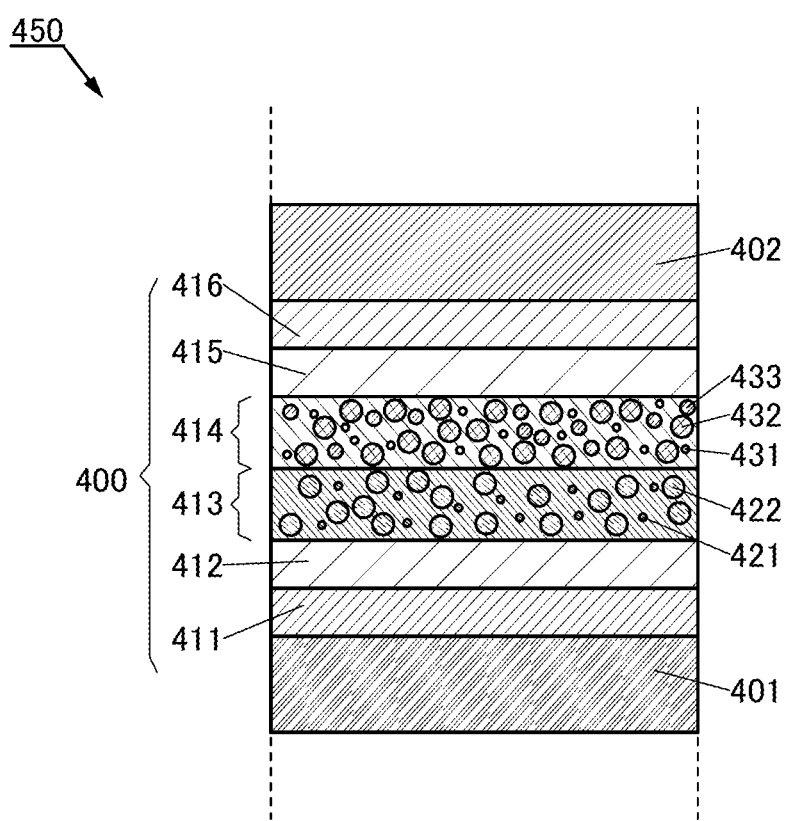
FIG. 29 is a schematic cross-sectional view illustrating a light-emitting element of one embodiment of the present invention.

FIG. 29 is a schematic cross-sectional view of a light-emitting element 450.

In the light-emitting element 450 shown in FIG. 29, an EL layer 400 is provided between a pair of electrodes (an electrode 401 and an electrode 402). Note that in the description below, the electrode 401 functions as an anode and the electrode 402 functions as a cathode in the light-emitting element 450; however, the function may be reversed.

The EL layer 400 includes a light-emitting layer 413 and a light-emitting layer 414. In the light-emitting element 450, the light-emitting layer 413, the light-emitting layer 414, a hole-injection layer 411, a hole-transport layer 412, an electron-transport layer 415, and an electron-injection layer 416 are illustrated as part of the EL layer 400. However, this stacked-layer structure is an example, and the structure of the EL layer 400 in the light-emitting element 450 is not limited thereto. For example, the stacking order of the layers may be changed in the EL layer 400. Alternatively, a functional layer other than the layers may be provided in the EL layer 400. The functional layer may have a function of injecting carriers (electrons or holes), a function of transporting carriers, a function of suppressing carriers, or a function of generating carriers.

The light-emitting layer 413 contains a guest material 421 and a host material 422. The light-emitting layer 414 contains a guest material 431, an organic compound 432, and an organic compound 433. Note that in the description below, the guest material 421 is a fluorescent material and the guest material 431 is a phosphorescent material.

<Light Emission Mechanism of Light-Emitting Layer 413>

First, a light emission mechanism of the light-emitting layer 413 is described below.

In the light-emitting layer 413, recombination of carriers forms an excited state. Because the amount of the host material 422 is large as compared to the guest material 421, the excited states are formed mostly as the excited states of the host material 422. The ratio of singlet excited states to triplet excited states caused by carrier recombination (hereinafter referred to as exciton generation probability) is approximately 1:3.

First, a case where the $T_1$ level of the host material 422 is higher than the Ti level of the guest material 421 is described below.

Energy is transferred from the host material 422 in the triplet excited state to the guest material 421 (triplet energy transfer). However, the triplet excited state of the guest material does not offer emission of light in a visible light region because the guest material 421 is the fluorescent material. Thus, it is difficult to use the triplet excited state of the host material 422 for light emission. Therefore, when the $T_1$ level of the host material 422 is higher than the $T_1$ level of the guest material 421, only approximately 25% of injected carriers can be used for light emission at most.

Figure 30A:
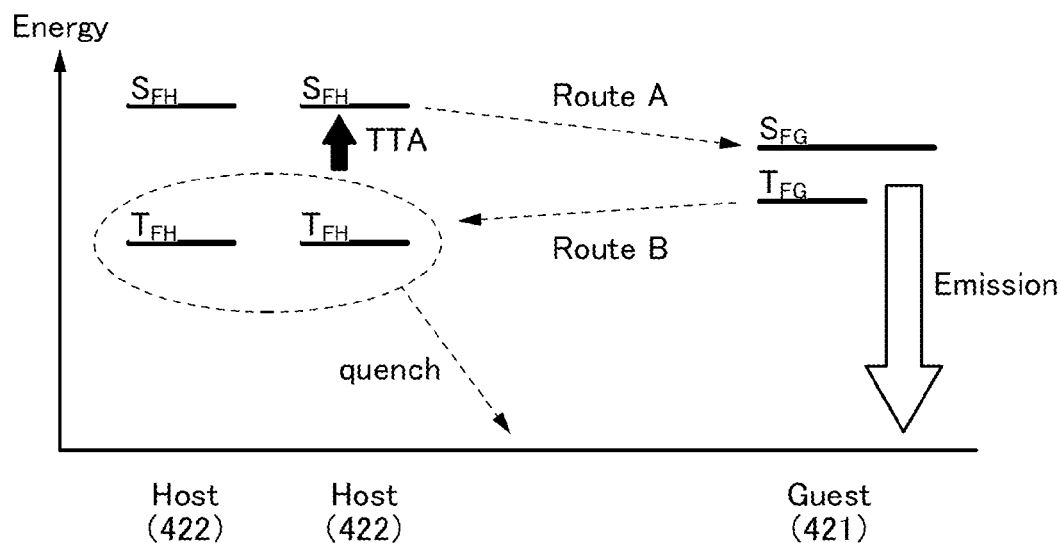
FIGS. 30A and 30B show correlations of energy levels in light-emitting layers.

Next, FIG. 30A shows a correlation of energy levels between the host material 422 and the guest material 421 of the light-emitting layer 413. The following explains what terms and signs in FIG. 30A represent:

Host: the host material 422;
Guest: the guest material 421 (the fluorescent material);
$S_{FH}$: the level of the lowest singlet excited state of the host material 422;
$T_{FH}$: the level of the lowest triplet excited state of the host material 422;
$S_{FG}$: the level of the lowest singlet excited state of the guest material 421 (the fluorescent material); and
$T_{FG}$: the level of the lowest triplet excited state of the guest material 421 (the fluorescent material).

As shown in FIG. 30A, the $T_1$ level of the guest material ($T_{FG}$ in FIG. 30A) is higher than the $T_1$ level of the guest material ($T_{FH}$ in FIG. 30A).

In addition, as shown in FIG. 30A, triplet excitons collide with each other by triplet-triplet annihilation (TTA), and part of energy of them is converted into the level of the lowest singlet excited state of the host material ($S_{FH}$). Energy is transferred from the level of the lowest singlet excited state of the host material ($S_{FH}$) to the level of the lowest singlet excited state of the guest material (the fluorescent material) ($S_{FG}$) that is the level lower than $S_{FH}$ (see Route A in FIG. 30A); and thus the guest material (the fluorescent material) emits light.

Because the $T_1$ level of the host material is lower than the $T_1$ level of the guest material, energy is transferred from $T_{FG}$ to $T_{FH}$ without deactivation of $T_{FG}$ (see Route B in FIG. 30A) and is utilized for TTA.

When the light-emitting layer 413 has the above structure, light emission from the guest material 421 in the light-emitting layer 413 can be obtained efficiently.

<Light Emission Mechanism of Light-Emitting Layer 414>

Next, a light emission mechanism of the light-emitting layer 414 is described below.

The organic compound 432 and the organic compound 433 in the light-emitting layer 414 form an exciplex. One of the organic compound 432 and the organic compound 433 serves as a host material for the light-emitting layer 414, and the other of the organic compound 432 and the organic compound 433 serves as an assist material for the light-emitting layer 414. Note that the organic compound 432 serves as the host material and the organic compound 433 serves as the assist material in the following description.

Although there is no limitation on the combination of the organic compound 432 and the organic compound 433 in the light-emitting layer 414 as long as an exciplex can be formed, it is preferred that one organic compound be a material having a hole-transport property and the other organic compound be a material having an electron-transport property. This is because in this case, a donor-acceptor excited state is easily formed, which allows an exciplex to be efficiently formed. In the case where the combination of the organic compound 432 and the organic compound 433 is a combination of the material having a hole-transport property and the material having an electron-transport property, the carrier balance can be easily controlled depending on the mixture ratio. Specifically, the ratio of the material having a hole-transport property to the material having an electron-transport property is preferably within a range of 1:9 to 9:1 (weight ratio). Since the carrier balance can be easily controlled with the above-described structure, a recombination region can also be easily adjusted.

Figure 30B:
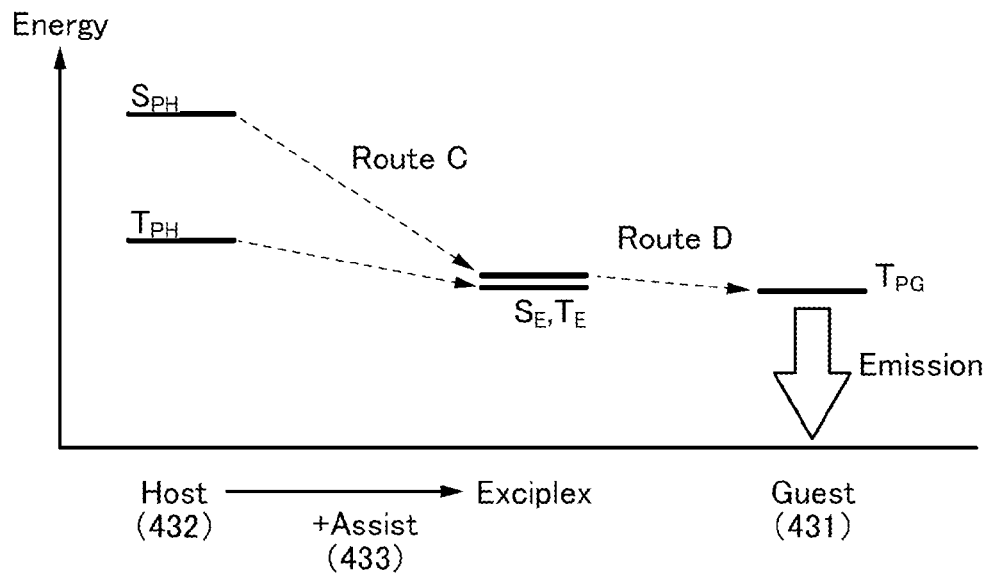

FIG. 30B shows a correlation of energy levels between the organic compound 432, the organic compound 433, and the guest material 431 of the light-emitting layer 414. The following explains what terms and signs in FIG. 30B represent:

Host: the organic compound 432;
Assist: the organic compound 433;
Guest: the guest material 431 (the phosphorescent material);
$S_{PH}$: the level of the lowest singlet excited state of the host material (the organic compound 432);
$T_{PH}$: the level of the lowest triplet excited state of the host material (the organic compound 432);
$T_{PG}$: the level of the lowest triplet excited state of the guest material 431 (the phosphorescent material);
$S_E$: the level of the lowest singlet excited state of the exciplex; and $T_E$: the level of the lowest triplet excited state of the exciplex.

In the light-emitting element of one embodiment of the present invention, the organic compounds 432 and 433 of the light-emitting layer 414 form the exciplex. The level of the lowest singlet excited state of the exciplex ($S_E$) and the level of the lowest triplet excited state of the exciplex ($T_E$) are adjacent to each other (see Route C in FIG. 30B).

An exciplex is an excited state formed from two kinds of substances. In the case of photoexcitation, the exciplex is formed by interaction between one molecule in an excited state and the other substance in a ground state. The two kinds of substances that have formed the exciplex return to a ground state by emitting light and serve as the original two kinds of substances. In the case of electrical excitation, the exciplex can be formed when a cationic molecule (hole) of one substance comes close to an anionic molecule (electron) of the other substance. That is, the exciplex can be formed without formation of independent excitation state of any molecule in the electrical excitation; thus, a driving voltage can be lowered. Both energies of $S_E$ and $T_E$ of the exciplex then move to the level of the lowest triplet excited state of the guest material 431 (the phosphorescent material) to obtain light emission (see Route D in FIG. 30B).

The above-described process of Route C and Route D is referred to as exciplex-triplet energy transfer (ExTET) in this specification and the like. In other words, in the light-emitting element 450, energy can be given from the exciplex to the guest material 431 (the phosphorescent material).

When one of the organic compounds 432 and 433 receiving a hole and the other of the organic compounds 432 and 433 receiving an electron come close to each other, the exciplex is formed at once. Alternatively, when one substance becomes in an excited state, the one immediately interacts with the other substance to form the exciplex. Therefore, most excitons in the light-emitting layer 414 exist as the exciplexes. A band gap of the exciplex is narrower than those of the organic compounds 432 and 433; therefore, the driving voltage can be lowered when the exciplex is formed by recombination of a hole and an electron.

When the light-emitting layer 414 has the above structure, light emission from the guest material 431 (the phosphorescent material) in the light-emitting layer 414 can be obtained efficiently.

<Light Emission Mechanism of Light-Emitting Layers 413 and 414>

Each light emission mechanism of the light-emitting layer 413 and the light-emitting layer 414 is described above. In the light-emitting element 450, even when energy is transferred from the exciplex to the host material 422 of the light-emitting layer 413 (in particular, when energy of the triplet excited level is transferred) at an interface between the light-emitting layer 413 and the light-emitting layer 414, triplet excitation energy can be converted into light emission in the light-emitting layer 413.

The $T_1$ level of the host material 422 of the light-emitting layer 413 is preferably lower than $T_1$ levels of the organic compound 432 and the organic compound 433 of the light-emitting layer 414. In the light-emitting layer 413, an $S_1$ level of the host material 422 is preferably higher than an $S_1$ level of the guest material 421 (the fluorescent material) while the $T_1$ level of the host material 422 is lower than a $T_1$ level of the guest material 421 (the fluorescent material).

Figure 31:
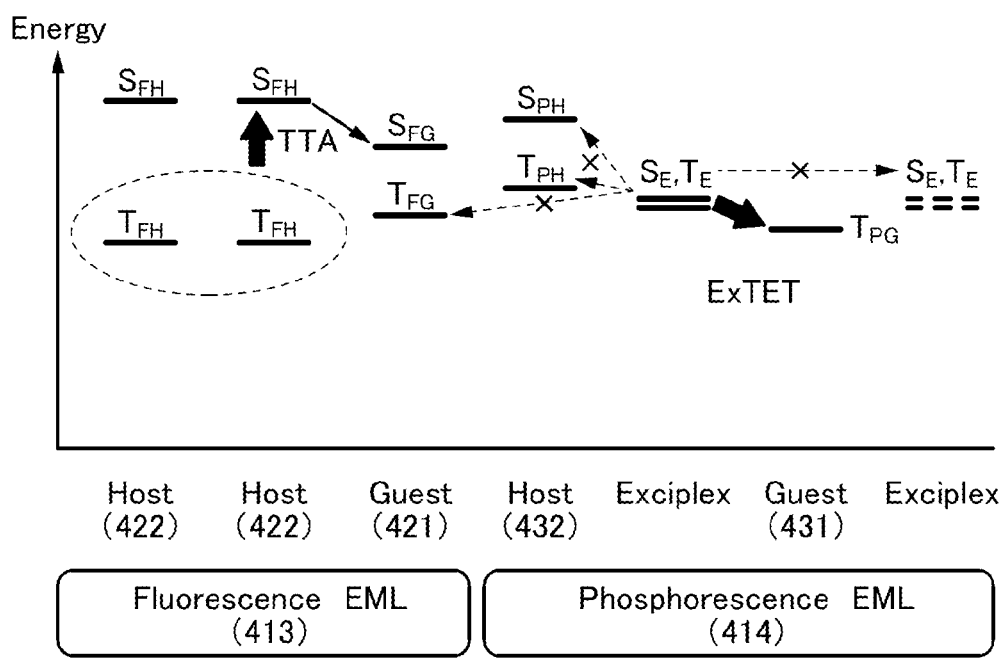
FIG. 31 shows a correlation of energy levels in light-emitting layers.

FIG. 31 shows a correlation of energy levels in the case where TTA is utilized in the light-emitting layer 413 and ExTET is utilized in the light-emitting layer 414. The following explains what terms and signs in FIG. 31 represent: Fluorescence EML: the fluorescent light-emitting layer (the light-emitting layer 413); Phosphorescence EML: the phosphorescent light-emitting layer (the light-emitting layer 414);

$S_{FH}$: the level of the lowest singlet excited state of the host material 422;

$T_{FH}$: the level of the lowest triplet excited state of the host material 422;

$S_{FG}$: the level of the lowest singlet excited state of the guest material 421 (the fluorescent material);

$T_{FG}$: the level of the lowest triplet excited state of the guest material 421 (the fluorescent material);

$S_{PH}$: the level of the lowest singlet excited state of the host material (the organic compound 432);

$T_{PH}$: the level of the lowest triplet excited state of the host material (the organic compound 432);

$T_{PG}$: the level of the lowest triplet excited state of the guest material 431 (the phosphorescent material);

$S_E$: the level of the lowest singlet excited state of the exciplex; and $T_E$: the level of the lowest triplet excited state of the exciplex.

As shown in FIG. 31, the exciplex exists only in an excited state; thus, exciton diffusion between the exciplexes is not likely to occur. In addition, because the excited levels of the exciplex ($S_E$ and $T_E$) are lower than the excited levels of the organic compound 432 (the host material of the phosphorescent material) of the light-emitting layer 414 ($S_{PH}$ and $T_{PH}$), energy diffusion from the exciplex to the organic compound 432 does not occur. That is, emission efficiency of the phosphorescent light-emitting layer (the light-emitting layer 414) can be maintained because an exciton diffusion distance of the exciplex is short in the phosphorescent light-emitting layer (the light-emitting layer 414). In addition, even when part of the triplet excitation energy of the exciplex of the phosphorescent light-emitting layer (the light-emitting layer 414) diffuses into the fluorescent light-emitting layer (the light-emitting layer 413) through the interface between the fluorescent light-emitting layer (the light-emitting layer 413) and the phosphorescent light-emitting layer (the light-emitting layer 414), energy loss can be reduced because the triplet excitation energy in the fluorescent light-emitting layer (the light-emitting layer 413) caused by the diffusion is used for light emission through TTA.

The light-emitting element 450 can have high emission efficiency because ExTET is utilized in the light-emitting layer 414 and TTA is utilized in the light-emitting layer 413 as described above so that energy loss is reduced. As in the light-emitting element 450, in the case where the light-emitting layer 413 and the light-emitting layer 414 are in contact with each other, the number of EL layers 400 as well as the energy loss can be reduced. Therefore, a light-emitting element with low manufacturing cost can be obtained.

Note that the light-emitting layer 413 and the light-emitting layer 414 are not necessarily in contact with each other. In that case, it is possible to prevent energy transfer by the Dexter mechanism (particularly triplet energy transfer) from the organic compound 432 in an excited state or the guest material 431 (the phosphorescent material) in an excited state which is generated in the light-emitting layer 414 to the host material 422 or the guest material 421 (the fluorescent material) in the light-emitting layer 413. Therefore, the thickness of a layer provided between the light-emitting layer 413 and the light-emitting layer 414 may be several nanometers.

The layer provided between the light-emitting layer 413 and the light-emitting layer 414 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the organic compound 432) of the light-emitting layer 414. This facilitates the manufacture of the light-emitting element and reduces the drive voltage. Furthermore, the hole-transport material and the electron-transport material may form an exciplex, which effectively prevents exciton diffusion. Specifically, it is possible to prevent energy transfer from the host material (the organic compound 432) in an excited state or the guest material 431 (the phosphorescent material) in an excited state of the light-emitting layer 414 to the host material 422 or the guest material 421 (the fluorescent material) of the light-emitting layer 413.

In the light-emitting element 450, a carrier recombination region is preferably distributed to some extent. Therefore, it is preferred that the light-emitting layer 413 or the light-emitting layer 414 have an appropriate degree of carrier-trapping property. It is particularly preferred that the guest material 431 (the phosphorescent material) in the light-emitting layer 414 have an electron-trapping property.

Note that light emitted from the light-emitting layer 413 preferably has a peak on the shorter wavelength side than light emitted from the light-emitting layer 414. The luminance of a light-emitting element using the phosphorescent material emitting light with a short wavelength tends to degrade quickly. In view of the above, fluorescence with a short wavelength is used, so that a light-emitting element with less degradation of luminance can be provided.

Furthermore, the light-emitting layer 413 and the light-emitting layer 414 are made to emit light with different emission wavelengths, so that the light-emitting element can be a multicolor light-emitting element. In that case, the emission spectrum is formed by combining light having different emission peaks, and thus has at least two peaks.

The above structure is suitable for obtaining white light emission. When the light-emitting layer 413 and the light-emitting layer 414 emit light of complementary colors, white light emission can be obtained.

In addition, white light emission with a high color rendering property that is formed of three primary colors or four or more colors can be obtained by using a plurality of light-emitting substances emitting light with different wavelengths for the light-emitting layer 413. In that case, the light-emitting layer 413 may be divided into layers and each of the divided layers may contain a different light-emitting substance from the others.

Next, materials that can be used for the light-emitting layer 413 and the light-emitting layer 414 will be described.

<Material that can be Used for Light-Emitting Layer 413>

In the light-emitting layer 413, the host material 422 is present in the highest proportion by weight, and the guest material 421 (the fluorescent material) is dispersed in the host material 422. The $S_1$ level of the host material 422 is preferably higher than the $S_1$ level of the guest material 421 (the fluorescent material) while the $T_1$ level of the host material 422 is preferably lower than the $T_1$ level of the guest material 421 (the fluorescent material).

An anthracene derivative or a tetracene derivative is preferably used as the host material 422. This is because these derivatives each have a high $S_1$ level and a low $T_1$ level. Specific examples include 9-phenyl-3-[4-(10-phenyl-9-anthryl)phenyl]-9H-carbazole (PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Besides, 5,12-diphenyltetracene, 5,12-bis(biphenyl-2-yl)tetracene, and the like can be given.

Examples of the guest material 421 (the fluorescent material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-diphenylpyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), and the like.

<Material that can be Used for Light-Emitting Layer 414>

In the light-emitting layer 414, the host material (the organic compound 432) is present in the highest proportion in weight ratio, and the guest material 431 (the phosphorescent material) is dispersed in the host material (the organic compound 432). The $T_1$ level of the host material (the organic compound 432) of the light-emitting layer 414 is preferably higher than the $T_1$ level of the guest material 421 (the fluorescent material) of the light-emitting layer 413.

Examples of the host material (the organic compound 432) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine, a carbazole derivative, and the like.

As the guest material 431 (the phosphorescent material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

As the organic compound 433 (the assist material), a substance which can form an exciplex together with the organic compound 432 is preferably used. In that case, it is preferable that the organic compound 432, the organic compound 433, and the guest material 431 (the phosphorescent material) be selected such that the emission peak of the exciplex overlaps with an adsorption band, specifically an adsorption band on the longest wavelength side, of a triplet metal to ligand charge transfer (MLCT) transition of the phosphorescent material. This makes it possible to provide a light-emitting element with drastically improved emission efficiency. However, if a material exhibiting thermally activated delayed fluorescence (TADF) is used instead of the phosphorescent light-emitting material, it is preferable that an adsorption band on the longest wavelength side be an absorption band of a singlet.

As the light-emitting material included in the light-emitting layer 414, any material can be used as long as the material can convert the triplet excitation energy into light emission. As an example of the material that can convert the triplet excitation energy into light emission, a TADF material is given in addition to a phosphorescent material. Therefore, it is acceptable that the "phosphorescent material" in the description is replaced with the "TADF material". Note that the TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV.

There is no limitation on the emission colors of the light-emitting material included in the light-emitting layer 413 and the light-emitting material included in the light-emitting layer 414, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material included in the light-emitting layer 413 is preferably shorter than that of the light-emitting material included in the light-emitting layer 414.

Note that the light-emitting layer 413 and the light-emitting layer 414 can be formed by an evaporation method (including a vacuum evaporation method), an inkjet method, a coating method, gravure printing, or the like.

Note that the structure described in this embodiment can be combined as appropriate with any of the structures described in the other embodiments.

Embodiment 3

In this embodiment, a light-emitting device of one embodiment of the present invention is described with reference to FIGS. 32A and 32B, FIGS. 33A and 33B, FIG. 34, FIGS. 35A and 35B, FIG. 36, FIG. 37, FIG. 38, FIG. 39, and FIG. 40.
<Structural Example 1 of Light-Emitting Device>

Figure 32A:
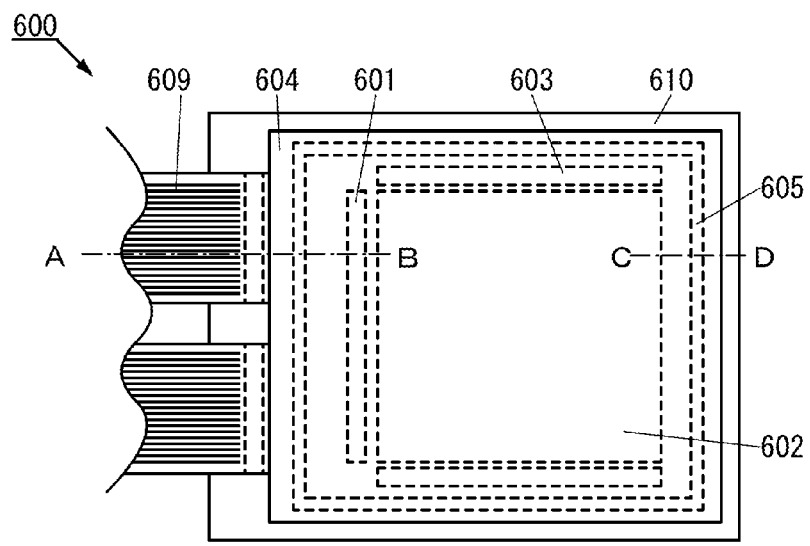
FIGS. 32A and 32B are a top view and a cross-sectional view, respectively, illustrating a light-emitting device of one embodiment of the present invention.
Figure 32B:
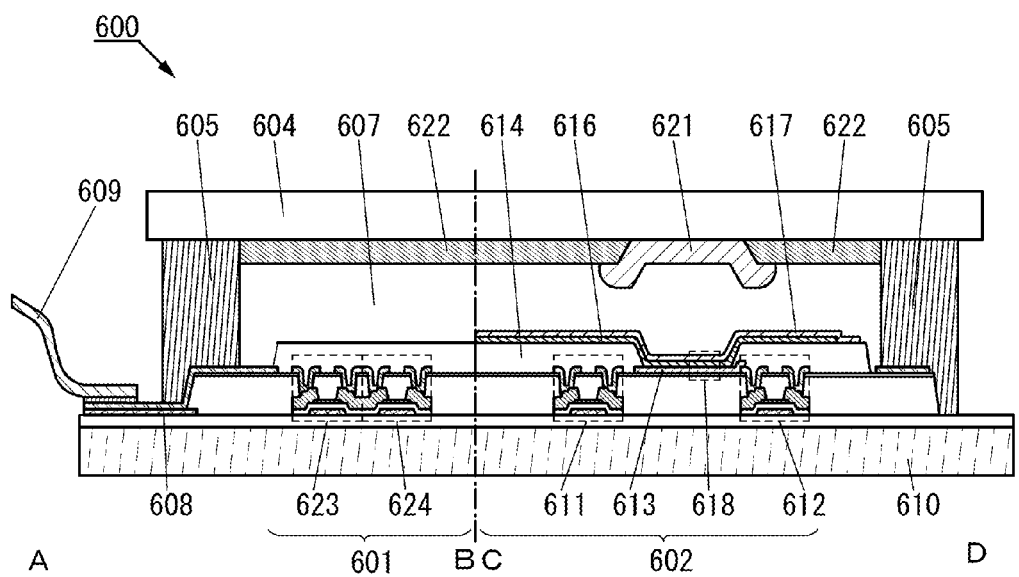

FIG. 32A is a top view illustrating a light-emitting device 600 and FIG. 32B is a cross-sectional view taken along the dashed-dotted line A-B and the dashed-dotted line C-D in FIG. 32A. The light-emitting device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission of a light-emitting element.

The light-emitting device 600 also includes an element substrate 610, a sealing substrate 604, a sealing member 605, a region 607 surrounded by the sealing member 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is shown here, the FPC 609 may be provided with a printed wiring board (PWB).

As the signal side driver circuit 601, a CMOS circuit in which an n-channel transistor 623 and a p-channel transistor 624 are combined is formed. As the signal line driver circuit portion 601 or the scan line driver circuit portion 603, a CMOS circuit, a PMOS circuit, an NMOS circuit, or the like can be used. Although a driver in which a driver circuit portion is formed over a substrate and a pixel are formed over the same surface in the light-emitting device of one embodiment of the present invention, a driver circuit portion need not be necessarily formed over the substrate and can be formed outside.

The pixel portion 602 includes a switching transistor 611, a current control transistor 612, and a lower electrode 613 electrically connected to a drain of the current control transistor 612. It is to be noted that a partition wall 614 is formed to cover end portions of the lower electrode 613. As the partition wall 614, for example, a positive type photosensitive acrylic resin film can be used.

In order to obtain favorable coverage by a film which is formed over the partition wall 614, the partition wall 614 is formed to have a curved surface with curvature at its upper or lower end portion. For example, in the case of using a positive photosensitive acrylic as a material of the partition wall 614, it is preferred that only the upper end portion of the partition wall 614 has a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of the transistor. A structure including an n-channel transistor and a p-channel transistor, a structure including only an n-channel transistor, or a structure including only a p-channel transistor may be used. Furthermore, there is no particular limitation on the crystallinity of a semiconductor film used for the transistor. For example, either an amorphous semiconductor film or a crystalline semiconductor film may be used. Examples of a semiconductor material include Group 14 semiconductors (e.g., silicon and gallium), compound semiconductors (including oxide semiconductors), and organic semiconductors. For example, an oxide semiconductor that has an energy gap of 2 eV or more, preferably 2.5 eV or more, further preferably 3 eV or more is preferably used for the transistors, so that the off-state current of the transistors can be reduced. Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)).

An EL layer 616 and an upper electrode 617 are formed over the upper electrode 613. Here, the lower electrode 613 serves as an anode and the upper electrode 617 serves as a cathode.

In addition, the EL layer 616 is formed by various methods such as an evaporation method with an evaporation mask, an ink-jet method, or a spin coating method. As another material included in the EL layer 616, a low molecular compound or a high molecular compound (including oligomer or dendrimer) may be used.

Note that the light-emitting element 618 is formed with the lower electrode 613, the EL layer 616, and the upper electrode 617. The light-emitting element 618 preferably has the structure described in Embodiment 1. In the case where the pixel portion includes a plurality of light-emitting elements, the pixel portion may include both the light-emitting element described in Embodiment 1 and a light-emitting element having a different structure.

When the sealing substrate 604 and the element substrate 610 are attached to each other with the sealing member 605, the light-emitting element 618 is provided in the region 607 surrounded by the element substrate 610, the sealing substrate 604, and the sealing member 605. The region 607 is filled with a filler. In some cases, the region 607 is filled with an inert gas (nitrogen, argon, or the like) or filled with an ultraviolet curable resin or a thermosetting resin which can be used for the sealing member 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and the desiccant be provided in the recessed portion, in which case deterioration due to influence of moisture can be inhibited.

An optical element 621 is provided below the sealing substrate 604 to overlap the light-emitting element 618. A light-blocking layer 622 is provided below the sealing substrate 604. The structures of the optical element 621 and the light-blocking layer 622 can be the same as those of the optical element and the light-blocking layer in Embodiment 1, respectively.

An epoxy-based resin or glass frit is preferably used for the sealing member 605. The material preferably allows as little moisture and oxygen as possible to penetrate. As the sealing substrate 604, a glass substrate, a quartz substrate, or a plastic substrate formed of fiber reinforced plastic (FRP), polyvinyl fluoride) (PVF), polyester, acrylic, or the like can be used.

In the above-described manner, the light-emitting device including the light-emitting element and the optical element which are described in Embodiment 1 can be obtained.

<Structural Example 2 of Light-Emitting Device>

Figure 34:
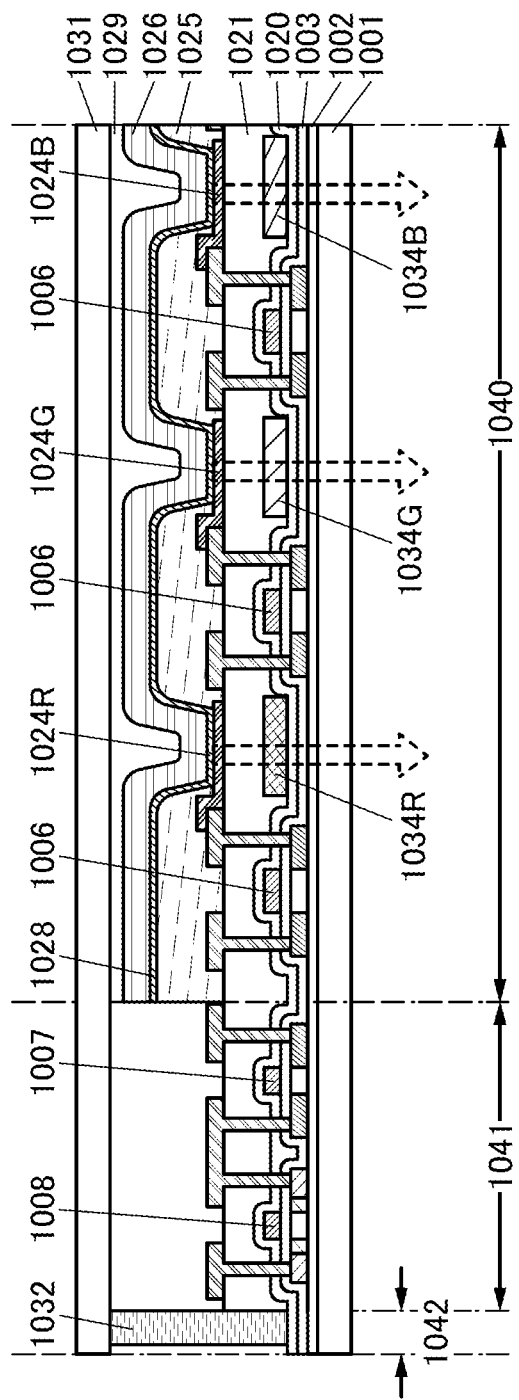
FIG. 34 is a cross-sectional view illustrating a light-emitting device of one embodiment of the present invention.

Next, another example of the light-emitting device is described with reference to FIGS. 33A and 33B and FIG. 34. Note that FIGS. 33A and 33B and FIG. 34 are each a cross-sectional view of a light-emitting device of one embodiment of the present invention.

In FIG. 33A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition 1025, an EL layer 1028, an upper electrode 1026 of the light-emitting elements, a sealing layer 1029, a sealing substrate 1031, a sealing member 1032, and the like are illustrated.

In FIG. 33A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 33A, red light, green light, and blue light transmit the coloring layers, and thus an image can be displayed with the use of pixels of three colors.

FIG. 33B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

FIG. 34 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in the structure, the coloring layers may be provided between the substrate 1001 and the sealing substrate 1031.

<Structural Example 3 of Light-Emitting Device>

Figure 36:
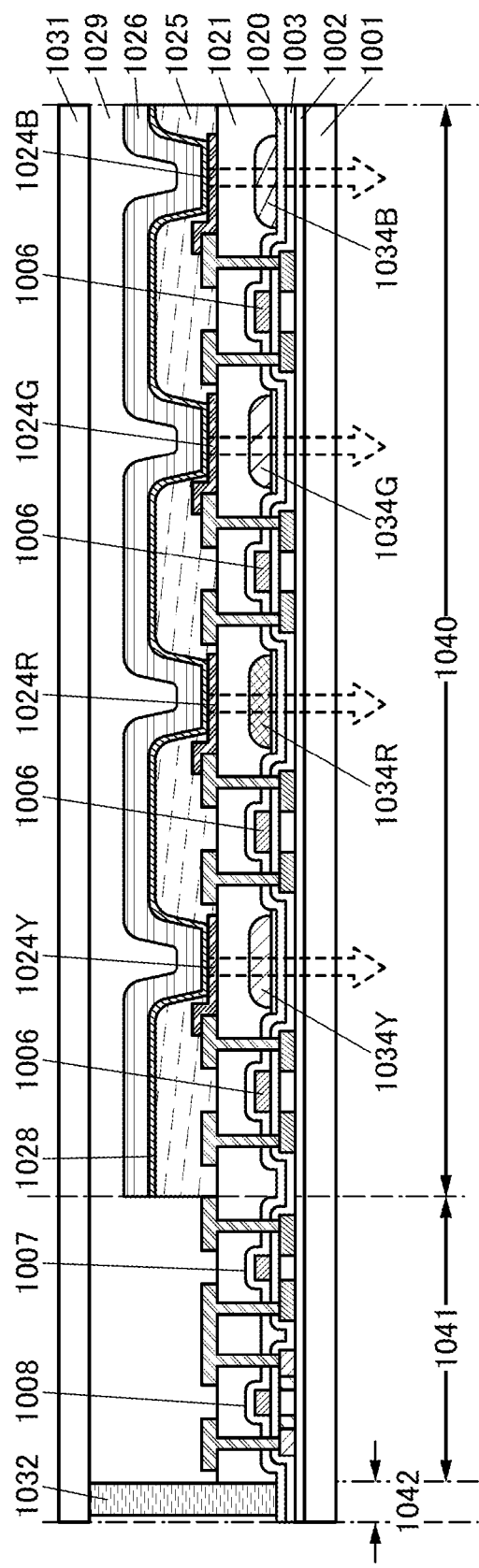
FIG. 36 is a cross-sectional view illustrating a light-emitting device of one embodiment of the present invention.

Next, another example of the light-emitting device is described with reference to FIGS. 35A and 35B and FIG. 36. Note that FIGS. 35A and 35B and FIG. 36 are each a cross-sectional view of a light-emitting device of one embodiment of the present invention.

In FIG. 35A, as examples of the optical elements, coloring layers (the red coloring layer 1034R, the green coloring layer 1034G, the blue coloring layer 1034B, and a yellow coloring layer 1034Y) are provided on the transparent base material 1033. Further, the light-blocking layer 1035 may be provided. The transparent base material 1033 provided with the coloring layers and the light-blocking layer is positioned and fixed to the substrate 1001. Note that the coloring layers and the light-blocking layer are covered with the overcoat layer 1036. In the structure in FIG. 35A, red light, blue light, green light, and yellow light transmit the coloring layers, and thus an image can be displayed with the use of pixels of four colors.

FIG. 35B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

FIG. 35B illustrates an example in which the coloring layers are provided between the gate insulating film 1003 and the first interlayer insulating film 1020; however, the position of the coloring layers is not limited thereto. As shown in FIG. 36, the coloring layers (the red coloring layer 1034R, the green coloring layer 1034G, the blue coloring layer 1034B, and the yellow coloring layer 1034Y) may be provided between the first interlayer insulating film 1020 and the second interlayer insulating film 1021.

The above-described light-emitting devices have a structure in which light is extracted from the substrate 1001 side where the transistors are formed (a bottom emission structure), but may have a structure in which light is extracted from the sealing substrate 1031 side (a top emission structure).

<Structural Example 4 of Light-Emitting Device>

Figure 37:
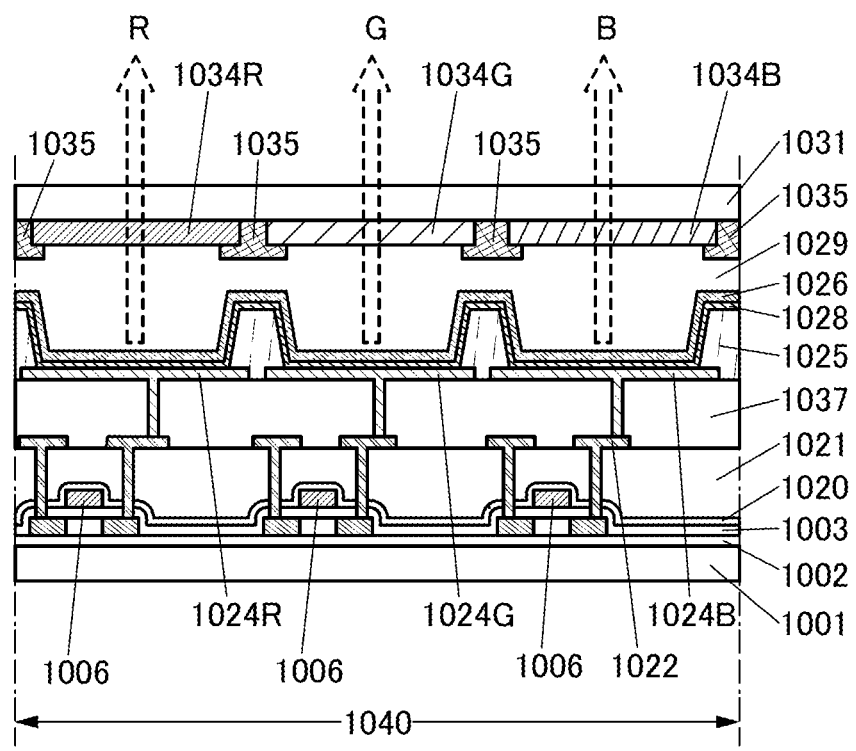
FIG. 37 is a cross-sectional view illustrating a light-emitting device of one embodiment of the present invention.
Figure 38:
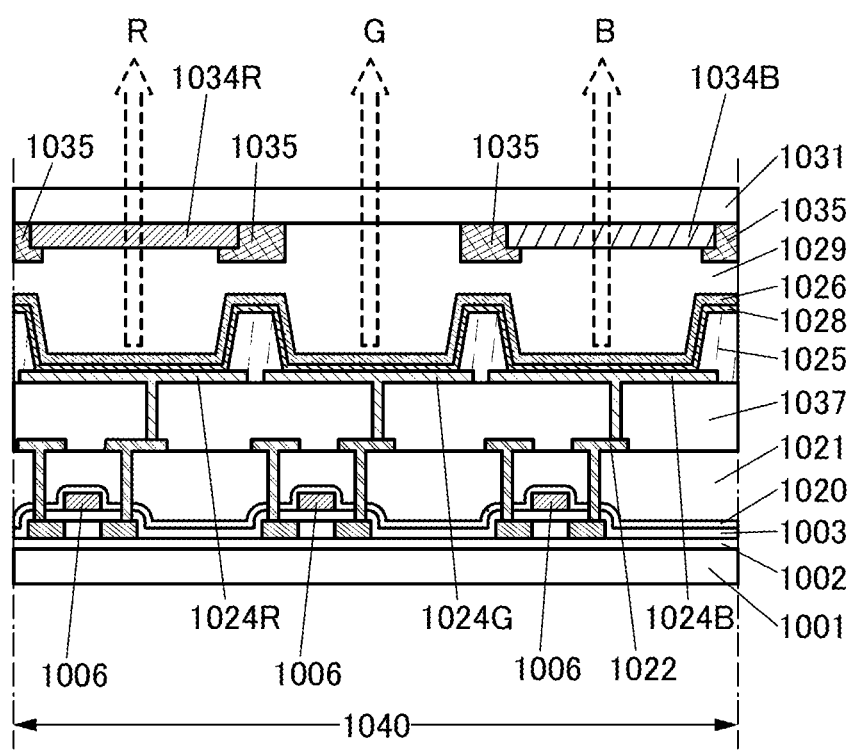
FIG. 38 is a cross-sectional view illustrating a light-emitting device of one embodiment of the present invention.

FIGS. 37 and 38 are each an example of a cross-sectional view of a light-emitting device having a top emission structure. Note that FIGS. 37 and 38 are each a cross-sectional view illustrating the light-emitting device of one embodiment of the present invention, and the driver circuit portion 1041, the peripheral portion 1042, and the like, which are shown in FIGS. 33A and 33B, are not illustrated therein.

In this case, as the substrate 1001, a substrate that does not transmit light can be used. The process up to the step of forming of a connection electrode which connects the transistor and the anode of the light-emitting element is performed in a manner similar to that of the light-emitting device having a bottom emission structure. Then, a third interlayer insulating film 1037 is formed to cover an electrode 1022. This insulating film may function for planarization. The third interlayer insulating film 1037 can be formed by using a material similar to that of the second interlayer insulating film, or can be formed by using any other known materials.

The lower electrodes 1024R, 1024G, and 1024B of the light-emitting elements each serve as an anode here, but may serve as a cathode. Further, in the case of a light-emitting device having a top emission structure as illustrated in FIG. 37, the lower electrodes 1024R, 1024G, and 1024B are preferably reflective electrodes. The EL layer 1028 can have a structure similar to that of the EL layer in Embodiment 1. The upper electrode 1026 is provided over the EL layer 1028. The upper electrode 1026 may be a semi-transmissive and semi-reflective electrode, and a microcavity structure may be used between the upper electrode 1026 and the lower electrodes 1024R, 1024G, and 1024B so as to increase the intensity of light having a specific wavelength.

In the case of a top emission structure as illustrated in FIG. 37, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is preferably used as the sealing substrate 1031.

FIG. 37 shows the structure provided with the light-emitting elements and the coloring layers for the light-emitting elements as an example; however, the structure is not limited thereto. For example, as shown in FIG. 38, a structure including the red coloring layer 1034R and the blue coloring layer 1034B but not including a green coloring layer may be employed to achieve full color display with the three colors of red, green, and blue. The structure as shown in FIG. 37 where the light-emitting elements are provided with the coloring layers is effective to suppress reflection of outside light. In contrast, the structure as shown in FIG. 38 where the light-emitting elements are provided with the red coloring layer and the green coloring layer and without the blue coloring layer is effective to reduce power consumption because of small energy loss of light emitted from the light-emitting elements.

<Structural Example 5 of Light-Emitting Device>

Figure 39:
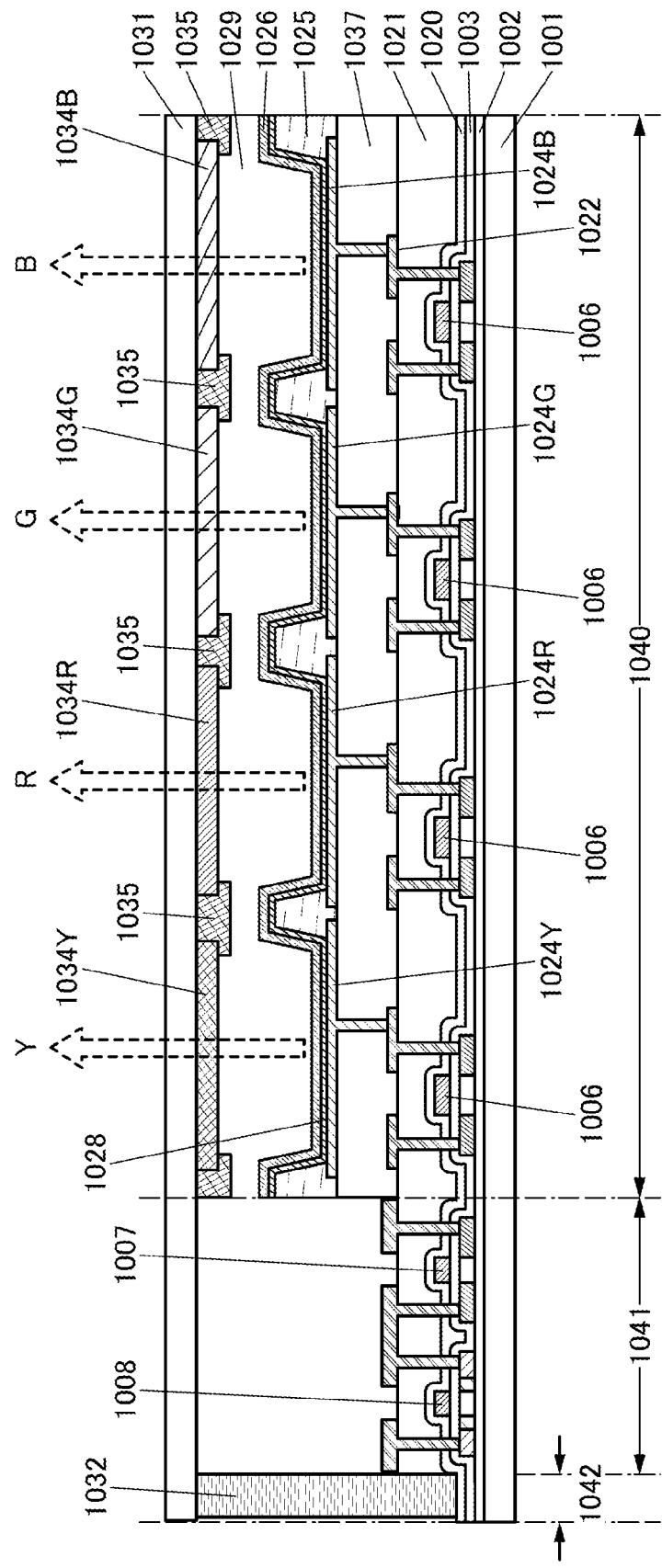
FIG. 39 is a cross-sectional view illustrating a light-emitting device of one embodiment of the present invention.
Figure 40:
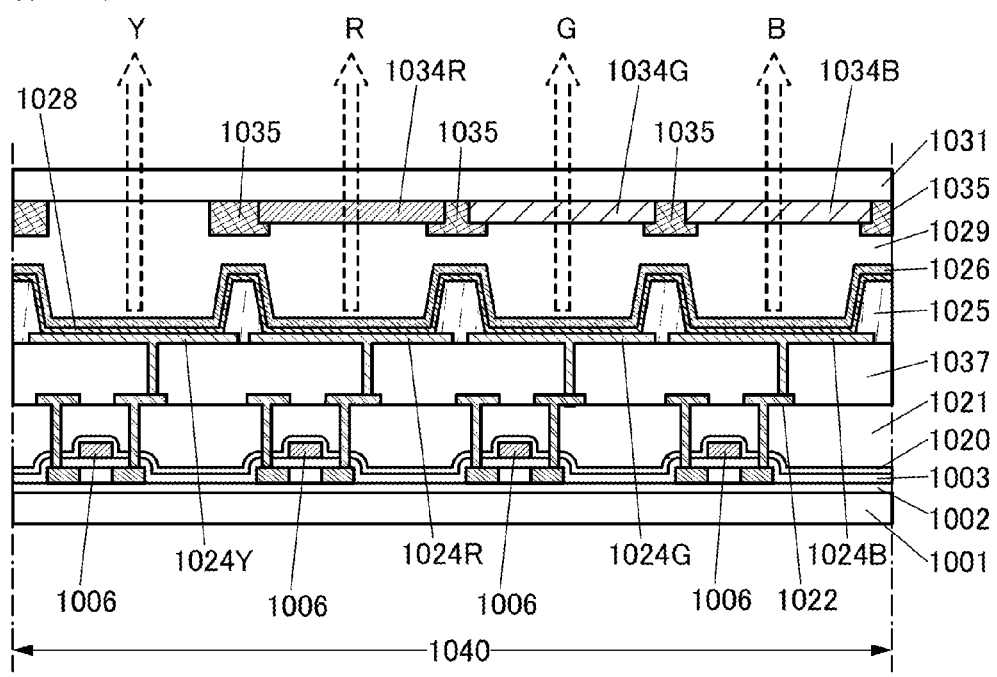
FIG. 40 is a cross-sectional view illustrating a light-emitting device of one embodiment of the present invention.

FIGS. 39 and 40 are each another example of a cross-sectional view of a light-emitting device having a top emission structure. FIGS. 39 and 40 are each a cross-sectional view illustrating a light-emitting device of one embodiment of the present invention. Note that the driver circuit portion 1041, the peripheral portion 1042, and the like, which are shown in FIGS. 35A and 35B, are not illustrated in FIG. 40.

The lower electrodes 1024Y, 1024R, 1024G, and 1024B of the light-emitting elements each serve as an anode here, but may serve as a cathode. Further, in the case of a light-emitting device having a top emission structure as illustrated in FIG. 39, the lower electrodes 1024Y, 1024R, 1024G, and 1024B are preferably reflective electrodes. The EL layer 1028 can have a structure similar to that of the EL layer in Embodiment 1. The upper electrode 1026 is provided over the EL layer 1028. It is preferable that the upper electrode 1026 be a semi-transmissive and semi-reflective electrode and that a microcavity structure be used between the upper electrode 1026 and the lower electrodes 1024Y, 1024R, 1024G, and 1024B so as to increase the intensity of light having a specific wavelength.

In the case of a top emission structure as illustrated in FIG. 39, sealing can be performed with the sealing substrate 1031 on which the coloring layers (the red coloring layer 1034R, the green coloring layer 1034G, the blue coloring layer 1034B, and the yellow coloring layer 1034Y) are provided. The sealing substrate 1031 may be provided with the light-blocking layer 1035 which is positioned between pixels. Note that a light-transmitting substrate is preferably used as the sealing substrate 1031.

FIG. 39 shows the structure provided with the light-emitting elements and the coloring layers for the light-emitting elements as an example; however, the structure is not limited thereto. For example, as shown in FIG. 40, a structure including the red coloring layer 1034R, the green coloring layer 1034G, and the blue coloring layer 1034B but not including a yellow coloring layer may be employed to achieve full color display with the four colors of red, green, blue, and yellow. The structure as shown in FIG. 39 where the light-emitting elements are provided with the coloring layers is effective to suppress reflection of outside light. In contrast, the structure as shown in FIG. 40 where the light-emitting elements are provided with the red coloring layer, the green coloring layer, and the green coloring layer and without the blue yellow coloring layer is effective to reduce power consumption because of small energy loss of light emitted from the light-emitting elements.

The structure described in this embodiment can be combined with any of the structures in this embodiment and the other embodiments.

Embodiment 4

In this embodiment, a display device including a light-emitting device of one embodiment of the present invention will be described with reference to FIGS. 41A and 41B.

Figure 41A:
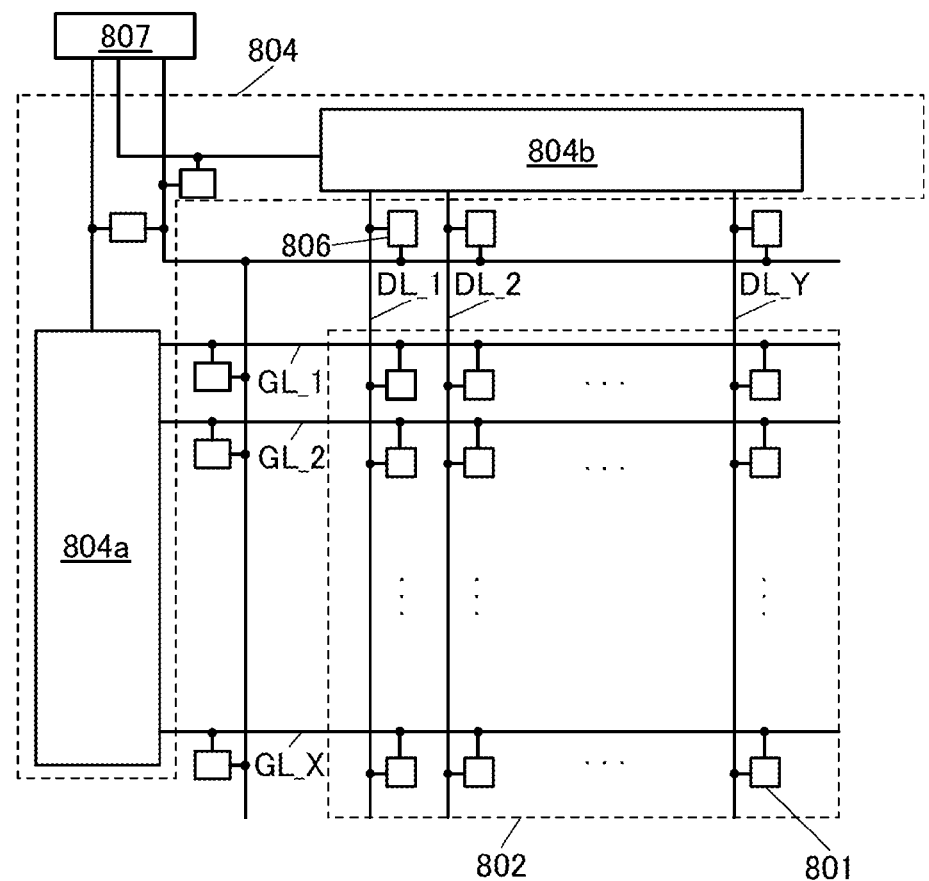
FIGS. 41A and 41B are a block diagram and a circuit diagram, respectively, illustrating a display device of one embodiment of the present invention.
Figure 41B:
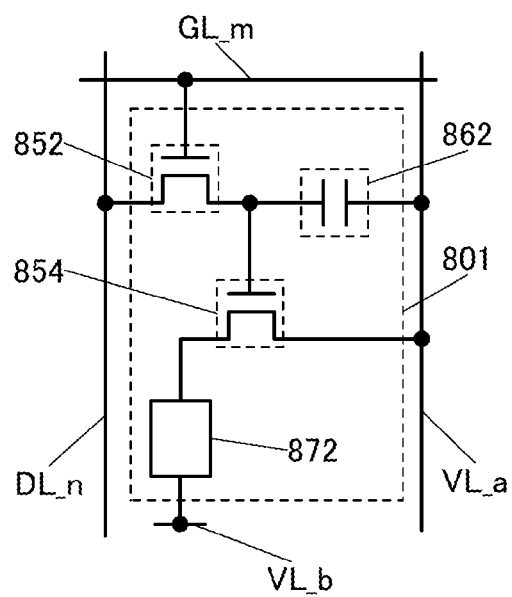

FIG. 41A is a block diagram illustrating the display device of one embodiment of the present invention, and FIG. 41B is a circuit diagram illustrating a pixel circuit of the display device of one embodiment of the present invention.

<Display Device>

The display device illustrated in FIG. 41A includes a region including pixels of display elements (hereinafter the region is referred to as a pixel portion 802), a circuit portion provided outside the pixel portion 802 and including a circuit for driving the pixels (hereinafter the portion is referred to as a driver circuit portion 804), circuits having a function of protecting elements (hereinafter the circuits are referred to as protection circuits 806), and a terminal portion 807. Note that the protection circuits 806 are not necessarily provided.

A part or the whole of the driver circuit portion 804 is preferably formed over a substrate over which the pixel portion 802 is formed. Thus, the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes circuits for driving a plurality of display elements arranged in X rows (X is a natural number of 2 or more) and Y columns (Y is a natural number of 2 or more) (hereinafter, such circuits are referred to as pixel circuits 801). The driver circuit portion 804 includes driver circuits such as a circuit for supplying a signal (scan signal) to select a pixel (hereinafter the circuit is referred to as a scan line driver circuit 804*a*) and a circuit for supplying a signal (data signal) to drive a display element in a pixel (hereinafter, the circuit is referred to as a signal line driver circuit 804*b*).

The scan line driver circuit 804*a* includes a shift register or the like. The scan line driver circuit 804*a* receives a signal for driving the shift register through the terminal portion 807 and outputs a signal. For example, the scan line driver circuit 804*a* receives a start pulse signal, a clock signal, or the like and outputs a pulse signal. The scan line driver circuit 804*a* has a function of controlling the potentials of wirings supplied with scan signals (hereinafter, such wirings are referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Not limited thereto, the scan line driver circuit 804a can supply another signal.

The signal line driver circuit 804b includes a shift register or the like. The signal line driver circuit 804b receives a signal (video signal) from which a data signal is derived, as well as a signal for driving the shift register, through the terminal portion 807. The signal line driver circuit 804b has a function of generating a data signal to be written in the pixel circuits 801 based on the video signal. In addition, the signal line driver circuit 804b has a function of controlling output of a data signal in response to a pulse signal produced by input of a start pulse signal, a clock signal, or the like. Further, the signal line driver circuit 804b has a function of controlling the potentials of wirings supplied with data signals (hereinafter, such wirings are referred to as data lines DL_1 to DL_Y). Alternatively, the signal line driver circuit 804b has a function of supplying an initialization signal. Not limited thereto, the signal line driver circuit 804b can supply another signal.

Alternatively, the signal line driver circuit 804b is formed using a plurality of analog switches or the like, for example. The signal line driver circuit 804b can output, as the data signals, signals obtained by time-dividing the video signal by sequentially turning on the plurality of analog switches. The signal line driver circuit 804b may include a shift register or the like.

A pulse signal and a data signal are input, through one of the plurality of scan lines GL supplied with scan signals and one of the plurality of data lines DL supplied with data signals, respectively, to each of the plurality of the pixel circuits 801. Writing and holding of the data signal in each of the plurality of pixel circuits 801 are controlled by the scan line driver circuit 804a. For example, to the pixel circuit 801 in the m-th row and the n-th column (m is a natural number of less than or equal to X, and n is a natural number of less than or equal to 1), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 41A is connected to, for example, the scan line GL between the scan line driver circuit 804a and the pixel circuits 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be electrically connected to a wiring between the signal line driver circuit 804b and the terminal portion 807. Note that the terminal portion 807 means a portion having terminals for inputting power, control signals, and video signals to the display device from external circuits.

The protection circuit 806 is a circuit which electrically conducts a wiring connected to the protection circuit to another wiring when a potential out of a certain range is supplied to the wiring connected to the protection circuit.

As illustrated in FIG. 41A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, the protection circuit 806 may be configured to be connected to the scan line driver circuit 804a or the protection circuit 806 may be configured to be connected to the signal line driver circuit 804b. Alternatively, the protection circuit 806 may be configured to be connected to the terminal portion 807.

In FIG. 41A, an example in which the driver circuit portion 804 includes the scan line driver circuit 804a and the signal line driver circuit 804b is shown; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structural Example of Pixel Circuit>

Each of the plurality of pixel circuits 801 in FIG. 41A can have the structure illustrated in FIG. 41B, for example.

The pixel circuit 801 shown in FIG. 41B includes transistors 852 and 854, a capacitor 862, and a light-emitting element 872.

One of a source electrode and a drain electrode of the transistor 852 is electrically connected to a wiring to which a data signal is supplied (hereinafter referred to as a signal line DL_n). A gate electrode of the transistor 852 is electrically connected to a wiring to which a gate signal is supplied (hereinafter referred to as a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Further, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, the light-emitting element described in Embodiment 1 can be used.

A high power supply potential VDD is supplied to one of the potential supply line VL_a and the potential supply line VL_b, and a low power supply potential VSS is supplied to the other.

For example, in the display device including the pixel circuit 801 in FIG. 41B, the pixel circuits 801 are sequentially selected row by row by the scan line driver circuit 804a illustrated in FIG. 41A, whereby the transistor 852 is turned on and a data signal is written.

When the transistor 852 is turned off, the pixel circuits 801 in which the data has been written are brought into a holding state. Further, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

For example, in this specification and the like, an active matrix method in which an active element is included in a pixel or a passive matrix method in which an active element is not included in a pixel can be used.

In the active matrix method, as an active element (a non-linear element), not only a transistor but also various active elements (non-linear elements) can be used. For example, a metal insulator metal (MIM) or a thin film diode (TFD) can also be used. Since these elements can be formed with a smaller number of manufacturing steps, manufacturing costs can be reduced or yield can be improved. Alternatively, since the size of the element is small, the aperture ratio can be improved, leading to lower power consumption or higher luminance.

As a method other than the active matrix method, the passive matrix method in which an active element (a non-linear element) is not used can also be used. Since an active element (a non-linear element) is not used, the number of manufacturing steps is small, so that manufacturing costs can be reduced or yield can be improved. Alternatively, since an active element (a non-linear element) is not used, the aperture ratio can be improved, leading to lower power consumption, higher luminance, or the like.

The structure described in this embodiment can be used in appropriate combination with the structure described in any of the other embodiments.

Embodiment 6

In this embodiment, a display module and electronic devices that include a light-emitting device of one embodiment of the present invention are described with reference to FIG. 42 and FIGS. 43A to 43G.

<Display Module>

Figure 42:
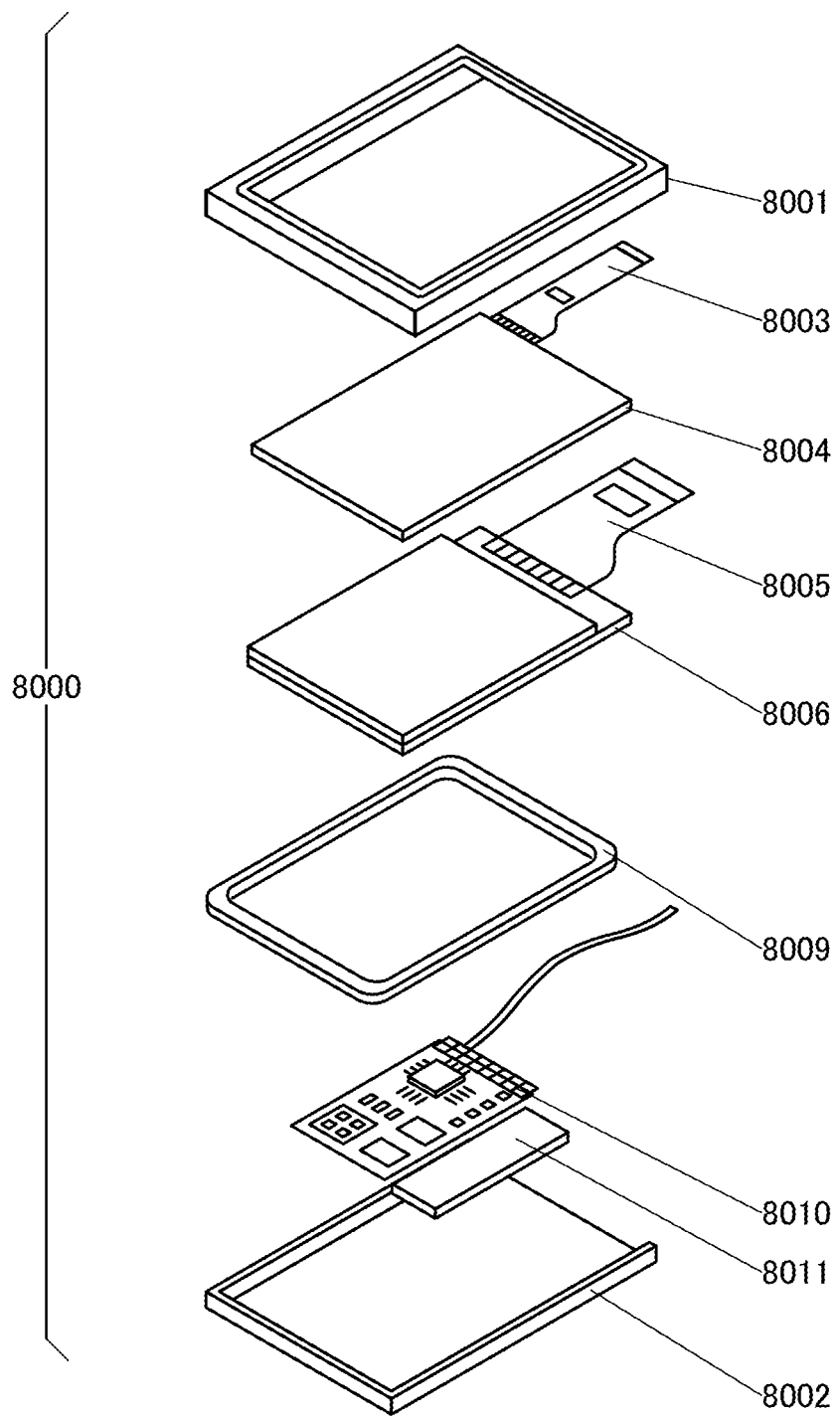
FIG. 42 is a perspective view illustrating a display module.

In a display module 8000 illustrated in FIG. 42, a touch panel 8004 connected to an FPC 8003, a display panel 8006 connected to an FPC 8005, a frame 8009, a printed board 8010, and a battery 8011 are provided between an upper cover 8001 and a lower cover 8002.

The light-emitting device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may overlap with the display panel 8006. Alternatively, a counter substrate (sealing substrate) of the display panel 8006 can have a touch panel function. Alternatively, a photosensor may be provided in each pixel of the display panel 8006 so as to function as an optical touch panel.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 43A to 43G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 43A to 43G can have a variety of functions. For example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 43A to 43G are not limited to those described above, and the electronic devices can have a variety of functions. Although not shown in FIGS. 43A to 43G, the electronic device may have a plurality of display portions. The electronic device may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices shown in FIGS. 43A to 43G will be described in detail.

Figure 43A:
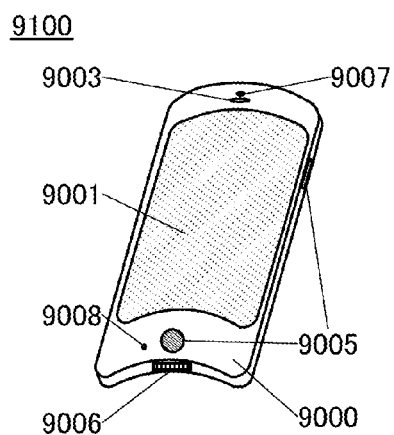
FIGS. 43A to 43G illustrate electronic devices.

FIG. 43A is a perspective view of a portable information terminal 9100. A display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 43D:
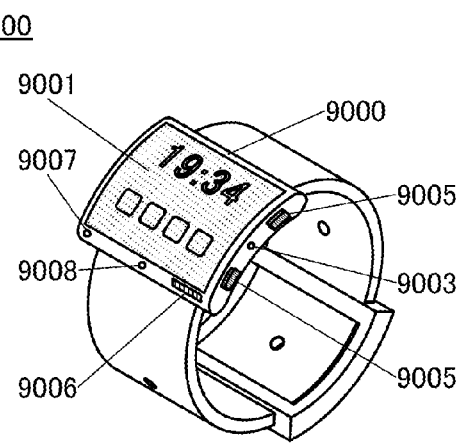
Figure 43B:
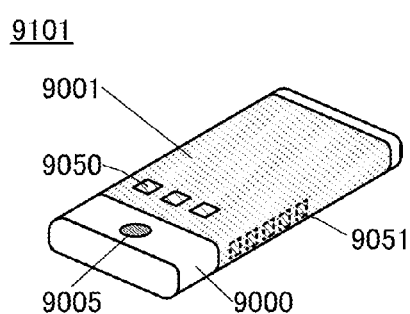

FIG. 43B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 43B, can be positioned in the portable information terminal 9101 as in the portable information terminal 9100 shown in FIG. 43A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 43E:
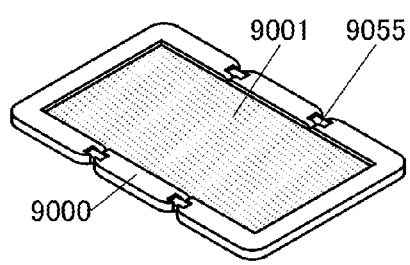
Figure 43C:
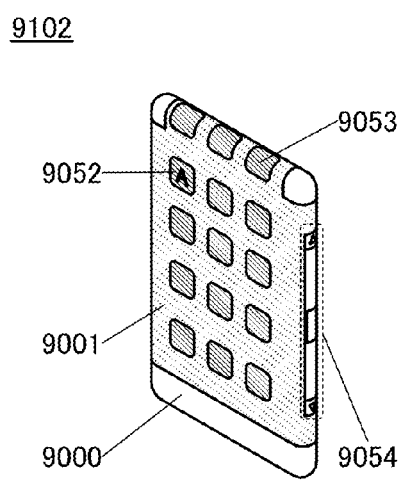

FIG. 43C is a perspective view of a portable information terminal 9102. The portable information terminal 9102 has a function of displaying information on three or more surfaces of the display portion 9001. Here, information 9052, 9053, and 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 43D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 43F:
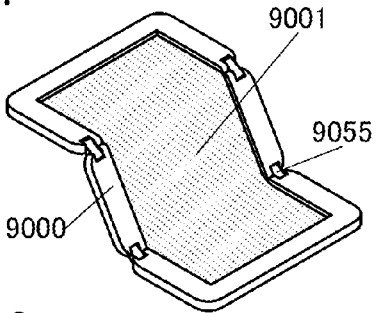
Figure 43G:
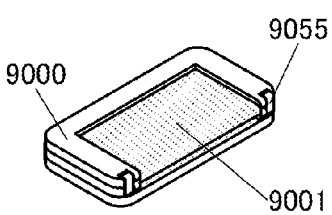

FIGS. 43E, 43F, and 43G are perspective views of a foldable portable information terminal 9201 that is opened, that is shifted from opened to folded or from folded to opened, and that is folded, respectively. The folded portable information terminal 9201 is highly portable, and the opened portable information terminal 9201 is highly browsable due to a seamless large display region. The display portion 9001 of the portable information terminal 9201 is supported by three housings joined together by hinges 9055. By folding the portable information terminal 9201 at a connection portion between two housings 9000 with the hinges 9055, the portable information terminal 9201 can be reversibly changed in shape from opened to folded. For example, the portable information terminal 9201 can be bent with a radius of curvature of greater than or equal to 1 mm and less than or equal to 150 mm.

Electronic devices described in this embodiment are characterized by having a display portion for displaying some sort of information. Note that the light-emitting device of one embodiment of the present invention can also be used for an electronic device which does not have a display portion. The display portion of the electronic device of this embodiment may be non-flexible and display on a flat surface without limitation to the flexible mode capable of displaying along the curved surface or the foldable mode.

The structure described in this embodiment can be used in appropriate combination with the structure described in any of the other embodiments.

Embodiment 6

In this embodiment, examples of lighting devices each using the light-emitting device of one embodiment of the present invention are described with reference to FIG. 44.

Figure 44:
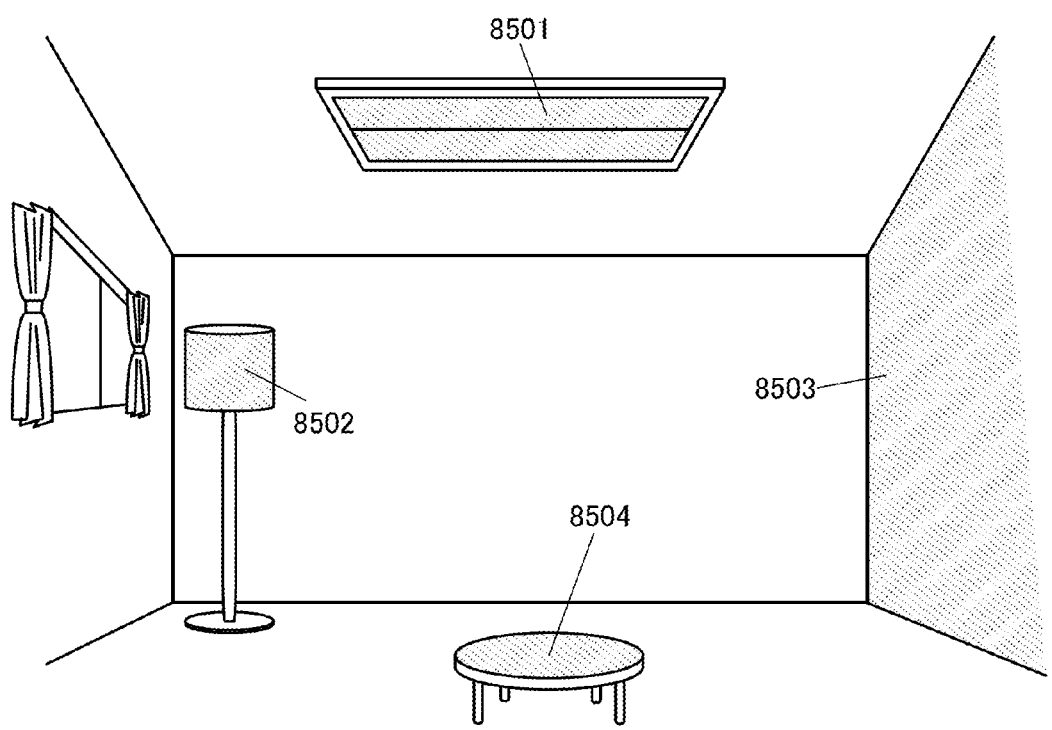
FIG. 44 illustrates lighting devices.

FIG. 44 illustrates an example in which the light-emitting device is used for an interior lighting device 8501. Note that since the area of the light-emitting device can be increased, a lighting device having a large area can also be formed. In addition, a lighting device 8502 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8503. Touch sensors may be provided in the lighting devices 8501, 8502, and 8503 to control the power on/off of the lighting devices.

Moreover, when the light-emitting device is used at a surface of a table, a lighting device 8504 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

Embodiment 7

In this embodiment, electronic devices in each of which an input device is attached to the light-emitting element of one embodiment of the present invention or the light-emitting device of one embodiment of the present invention are described with reference to FIGS. 45A and 45B, FIGS. 46A and 46B, FIGS. 47A and 47B, FIGS. 48A and 48B, and FIG. 49.

<Touch Panel>

Figure 45A:
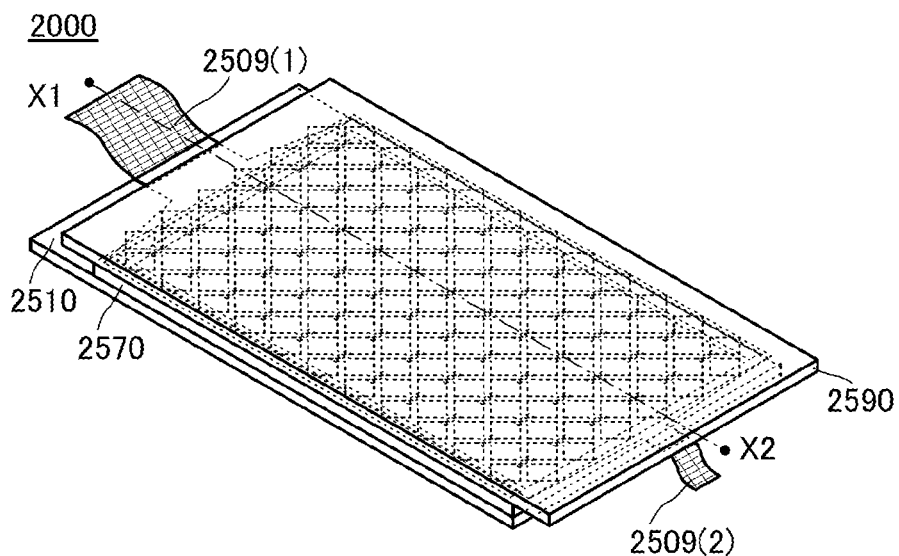
FIGS. 45A and 45B are perspective views illustrating an example of a touch panel.
Figure 45B:
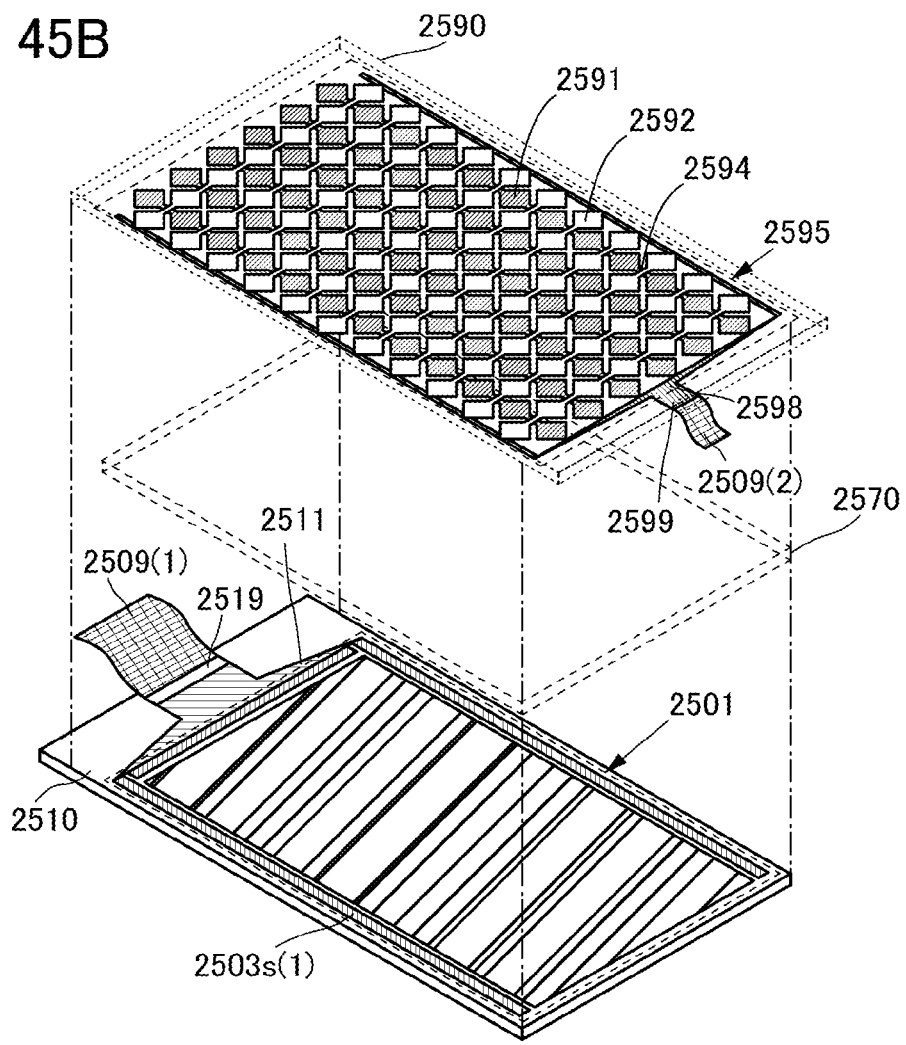

FIGS. 45A and 45B are perspective views of a touch panel 2000. Note that FIGS. 45A and 45B illustrate typical components of the touch panel 2000 for simplicity.

The touch panel 2000 includes a display portion 2501 and a touch sensor 2595 (see FIG. 45B). Furthermore, the touch panel 2000 includes a substrate 2510, a substrate 2570, and a substrate 2590. Note that the substrate 2510, the substrate 2570, and the substrate 2590 each have flexibility.

The display portion 2501 includes a plurality of pixels over the substrate 2510, and a plurality of wirings 2511 through which signals are supplied to the pixels. The plurality of wirings 2511 are led to a peripheral portion of the substrate 2510, and part of the plurality of wirings 2511 form a terminal 2519. The terminal 2519 is electrically connected to an FPC 2509(1). A signal from the signal line driver circuit 2503s(1) can be supplied to the plurality of pixels through the plurality of wirings 2511.

The substrate 2590 includes the touch sensor 2595 and a plurality of wirings 2598 electrically connected to the touch sensor 2595. The plurality of wirings 2598 is led to a peripheral portion of the substrate 2590, and part of the plurality of wirings 2598 forms a terminal. The terminal is electrically connected to an FPC 2509(2). Note that in FIG. 45B, electrodes, wirings, and the like of the touch sensor 2595 that are provided on the back side of the substrate 2590 (the side facing the substrate 2510) are shown by solid lines for clarity.

As the touch sensor 2595, for example, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

An example of using a projected capacitive touch sensor is described with reference to FIG. 45B.

Note that any of a variety of sensors that can sense the closeness or the contact of a sensing target such as a finger can be used.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 45A and 45B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing unevenness in transmittance. As a result, unevenness in luminance of light from the touch sensor 2595 can be reduced.

Note that the shapes of the electrodes 2591 and the electrodes 2592 are not limited to the above-mentioned shapes and can be any of a variety of shapes. For example, the plurality of electrodes 2591 may be provided so that space between the electrodes 2591 are reduced as much as possible, and a plurality of electrodes 2592 may be provided with an insulating layer sandwiched between the electrodes 2591 and the electrodes 2592 and may be spaced apart from each other to form a region not overlapping with the electrodes 2591. In that case, it is preferable to provide, between the two adjacent electrodes 2592, a dummy electrode which is electrically insulated from these electrodes, whereby the area of a region having a different transmittance can be reduced.

Figure 46A:
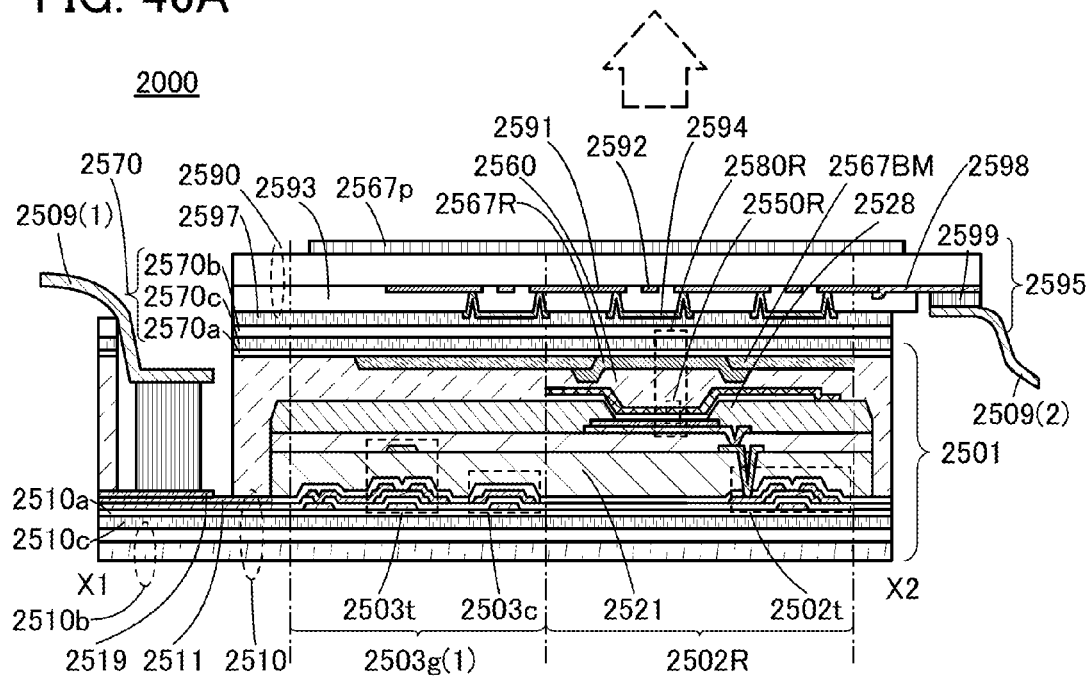
FIGS. 46A and 46B are cross-sectional views illustrating an example of a touch panel.
Figure 46B:
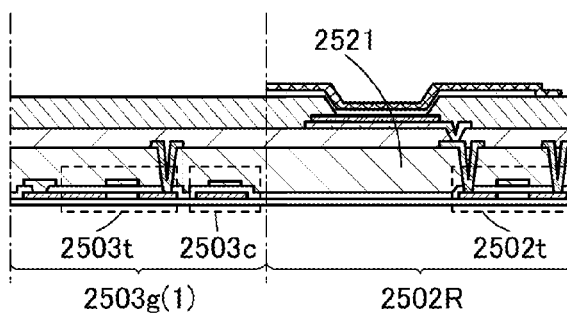

Next, the touch panel 2000 will be described in detail with reference to FIGS. 46A and 46B. FIGS. 46A and 46B are cross-sectional views taken along dashed-dotted line X1-X2 in FIG. 45A.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

An adhesive layer 2597 is provided below the wiring 2594. The adhesive layer 2597 attaches the substrate 2590 to the substrate 2570 so that the touch sensor 2595 overlaps the display portion 2501.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

For example, the electrodes 2591 and the electrodes 2592 may be formed by depositing a light-transmitting conductive material on the substrate 2590 by a sputtering method and then removing an unnecessary portion using any of various pattern formation techniques such as photolithography.

Examples of a material for the insulating layer 2593 include resins such as acrylic and an epoxy resin, a resin having a siloxane bond, and inorganic insulating materials such as silicon oxide, silicon oxynitride, and aluminum oxide.

Furthermore, openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than those of the electrodes 2591 and 2592 can be favorably used as the wiring 2594 because electric resistance can be reduced.

The electrodes 2592 extend in one direction, and the plurality of electrodes 2592 is provided in the form of stripes. The wiring 2594 intersects with the electrode 2592.

One electrode 2592 is provided between the pair of electrodes 2591. The wiring 2594 electrically connects the pair of electrodes 2591.

Note that the plurality of electrodes 2591 is not necessarily arranged in the direction orthogonal to one electrode 2592 and may be arranged to intersect with one electrode 2592 at an angle of greater than 0 degrees and less than 90 degrees.

One wiring 2598 is electrically connected to any of the electrodes 2591 and 2592. Part of the wiring 2598 serves as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer covering the insulating layer 2593 and the wiring 2594 may be provided to protect the touch sensor 2595.

Furthermore, a connection layer 2599 electrically connects the wiring 2598 to the FPC 2509(2).

As the connection layer 2599, any of various anisotropic conductive films (ACF), anisotropic conductive pastes (ACP), or the like can be used.

The adhesive layer 2597 has a light-transmitting property. For example, a thermosetting resin or an ultraviolet curable resin can be used; specifically, a resin such as an acrylic-based resin, an urethane-based resin, an epoxy-based resin, or a siloxane-based resin can be used.

The display portion 2501 includes a plurality of pixels arranged in a matrix. Each of the pixels includes a display element and a pixel circuit for driving the display element.

In the description below, an example of using an organic EL element that emits white light as a display element will be described; however, the display element is not limited to such element. For example, organic EL elements that emit light of different colors may be included so that the light of different colors can be emitted from adjacent pixels.

For the substrate 2510 and the substrate 2570, for example, a flexible material having a vapor permeability of $1 \times 10^{-5}$ $g \cdot m^{-2} \cdot day^{-1}$ or lower, preferably $1 \times 10^{-6}$ $g \cdot m^{-2} \cdot day^{-1}$ or lower can be favorably used. Note that materials whose thermal expansion coefficients are substantially equal to each other are preferably used for the substrate 2510 and the substrate 2570 respectively. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

A sealing layer 2560 preferably has a higher refractive index than the air. In the case where light is extracted to the sealing layer 2560 side as shown in FIGS. 46A and 46B, the sealing layer 2560 serves as an optical adhesive layer.

The display portion 2501 includes a pixel 2502R. The pixel 2502R includes a light-emitting module 2580R.

The pixel 2502R includes a light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode.

In the case where the sealing layer 2560 is provided on the light extraction side, the sealing layer 2560 is in contact with the light-emitting element 2550R and the coloring layer 2567R.

The coloring layer 2567R overlaps with the light-emitting element 2550R. Accordingly, part of light emitted from the light-emitting element 2550R passes through the coloring layer 2567R and is emitted to the outside of the light-emitting module 2580R as indicated by an arrow in FIG. 46A.

The display portion 2501 includes a light-blocking layer 2567BM on the light extraction side. The light-blocking layer 2567BM is provided so as to surround the coloring layer 2567R.

The display portion 2501 includes an anti-reflective layer 2567p in a region overlapping with pixels. As the anti-reflective layer 2567p, a circular polarizing plate can be used, for example.

An insulating layer 2521 is provided in the display portion 2501. The insulating layer 2521 covers the transistor 2502t. With the insulating layer 2521, unevenness caused by the pixel circuit is planarized. The insulating layer 2521 may serve also as a layer for preventing diffusion of impurities. This can prevent a reduction in the reliability of the transistor 2502t or the like due to diffusion of impurities.

The light-emitting element 2550R is formed above the insulating layer 2521. A partition 2528 is provided so as to cover end portions of the lower electrode in the light-emitting element 2550R. Note that a spacer for controlling the distance between the substrate 2510 and the substrate 2570 may be provided over the partition 2528.

A scan line driver circuit 2503g(1) includes a transistor 2503t and a capacitor 2503c. Note that the driver circuit and the pixel circuits can be formed in the same process over the same substrate.

Over the substrate 2510, the wirings 2511 through which a signal can be supplied are provided. Over the wirings 2511, the terminal 2519 is provided. The FPC 2509(1) is electrically connected to the terminal 2519. The FPC 2509(1) has a function of supplying signals such as a pixel signal and a synchronization signal. Note that a printed wiring board (PWB) may be attached to the FPC 2509(1).

For the display portion 2501, transistors with a variety of structures can be used. In the example of FIG. 46A, a bottom-gate transistor is used. In each of the transistor 2502t and the transistor 2503t illustrated in FIG. 46A, a semiconductor layer including an oxide semiconductor can be used for a channel region. Alternatively, in each of the transistor 2502t and the transistor 2503t, a semiconductor layer including amorphous silicon can be used for a channel region. Further alternatively, in each of the transistor 2502t and the transistor 2503t, a semiconductor layer including polycrystalline silicon that is obtained by crystallization process such as laser annealing can be used for a channel region.

FIG. 46B illustrates a structure in the case of using a top-gate transistor in the display portion 2501.

In the case of a top-gate transistor, a semiconductor layer including polycrystalline silicon, a single crystal silicon film that is transferred from a single crystal silicon substrate, or the like may be used for a channel region as well as the above semiconductor layers that can be used for a bottom-gate transistor.

Next, a touch panel having a different structure from that illustrated in FIGS. 46A and 46B will be described with reference to FIGS. 47A and 47B.

Figure 47A:
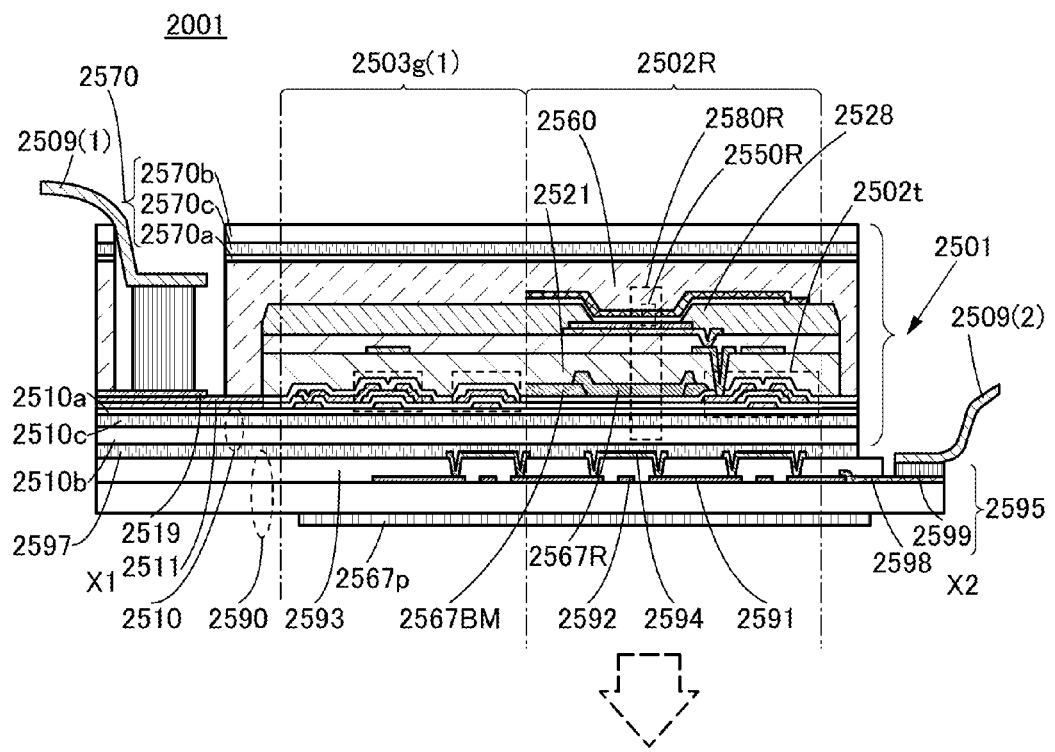
FIGS. 47A and 47B are cross-sectional views showing an example of a touch panel.
Figure 47B:
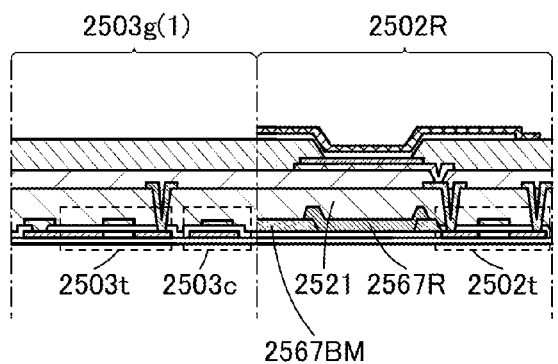

FIGS. 47A and 47B are cross-sectional views of a touch panel 2001. In the touch panel 2001 illustrated in FIGS. 47A and 47B, the position of the touch sensor 2595 relative to the display portion 2501 is different from that in the touch panel 2000 illustrated in FIGS. 46A and 46B. Different structures will be described in detail below, and the above description of the touch panel 2000 can be referred to for the other similar structures.

The coloring layer 2567R overlaps with the light-emitting element 2550R. The light-emitting element 2550R illustrated in FIG. 47A emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 47A.

The display portion 2501 includes the light-blocking layer 2567BM on the light extraction side. The light-shielding layer 2567BM is provided so as to surround the coloring layer 2567R.

The touch sensor 2595 is provided on the substrate 2510 side of the display portion 2501 (see FIG. 47A).

The display portion 2501 and the touch sensor 2595 are attached to each other with the adhesive layer 2597 provided between the substrate 2510 and the substrate 2590.

For the display portion 2501, transistors with a variety of structures can be used. In the example of FIG. 47A, a bottom-gate transistor is used. In the example of FIG. 47B, a top-gate transistor is used.

<Driving Method of Touch Panel>

Then, an example of a driving method of the touch panel will be described with reference to FIGS. 48A and 48B.

Figure 48A:
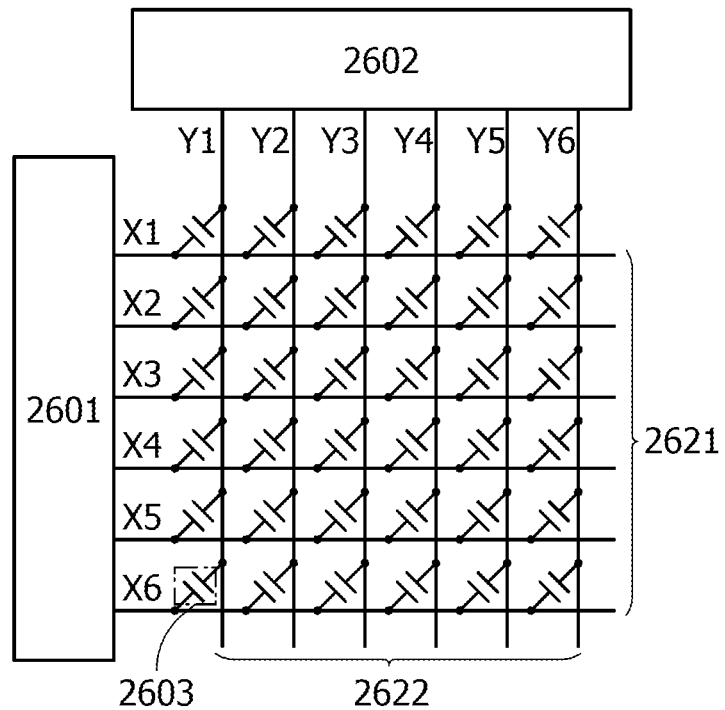
FIGS. 48A and 48B are a block diagram and a timing chart of a touch sensor.

FIG. 48A is a block diagram illustrating the structure of a mutual capacitive touch sensor. FIG. 48A illustrates a pulse voltage output circuit 2601 and a current sensing circuit 2602. Note that in the example of FIG. 48A, six wirings X1 to X6 represent electrodes 2621 to which a pulse voltage is supplied, and six wirings Y1 to Y6 represent electrodes 2622 that sense a change in current. FIG. 48A also illustrates a capacitor 2603 that is formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for detection of current values.

Figure 48B:
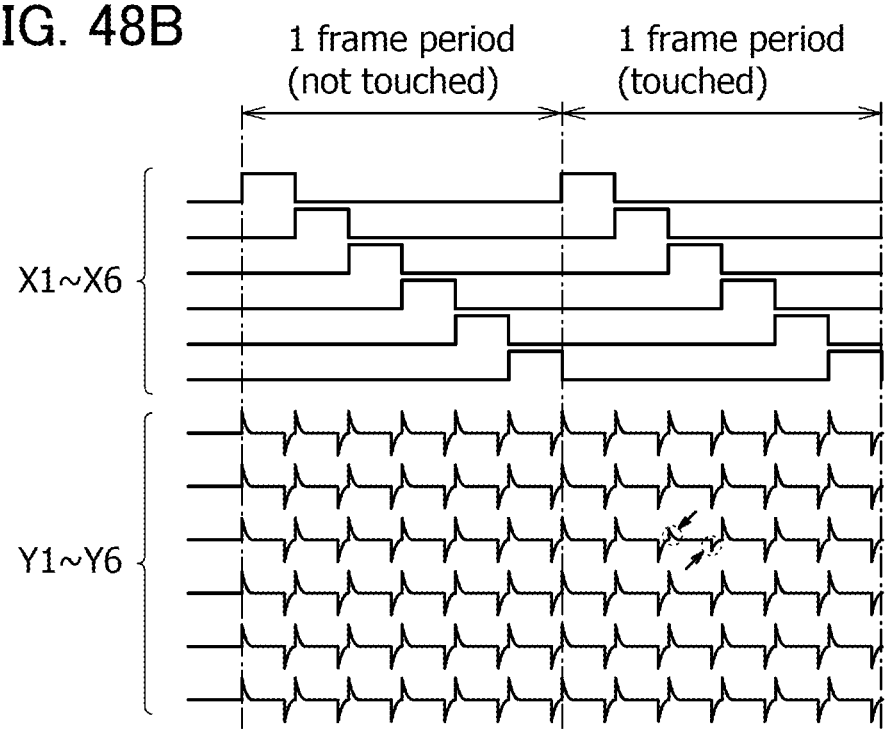

FIG. 48B is a timing chart showing input and output waveforms in the mutual capacitive touch sensor illustrated in FIG. 48A. In FIG. 48B, sensing of a sensing target is performed in all the rows and columns in one frame period. FIG. 48B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.
<Sensor Circuit>

Figure 49:
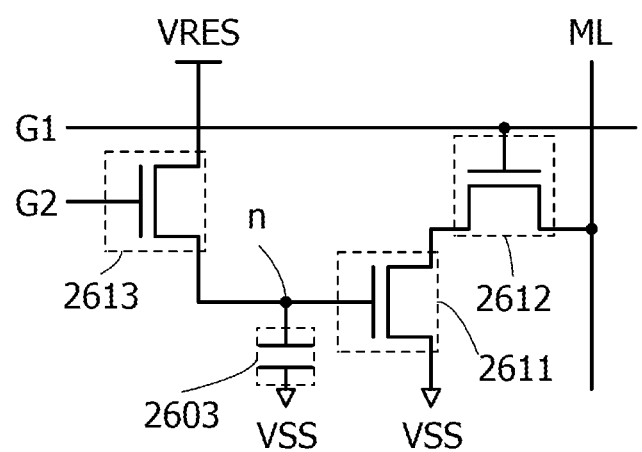
FIG. 49 is a circuit diagram of a touch sensor.

Although FIG. 48A is a passive matrix touch sensor in which only the capacitor 2603 is provided at the intersection of wirings as a touch sensor, an active matrix touch sensor including a transistor and a capacitor may be used. FIG. 49 is a sensor circuit included in an active matrix touch sensor.

The sensor circuit illustrated in FIG. 49 includes the capacitor 2603, a transistor 2611, a transistor 2612, and a transistor 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G2 is input to a gate of the transistor 2612, and a wiring ML is electrically connected to the other of the source and the drain of the transistor 2612. The voltage VSS is applied to the other electrode of the capacitor 2603.

Next, the operation of the sensor circuit illustrated in FIG. 49 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

At least part of this embodiment can be implemented in combination with any of the embodiments described in this specification as appropriate.

EXAMPLE

Figure 50:
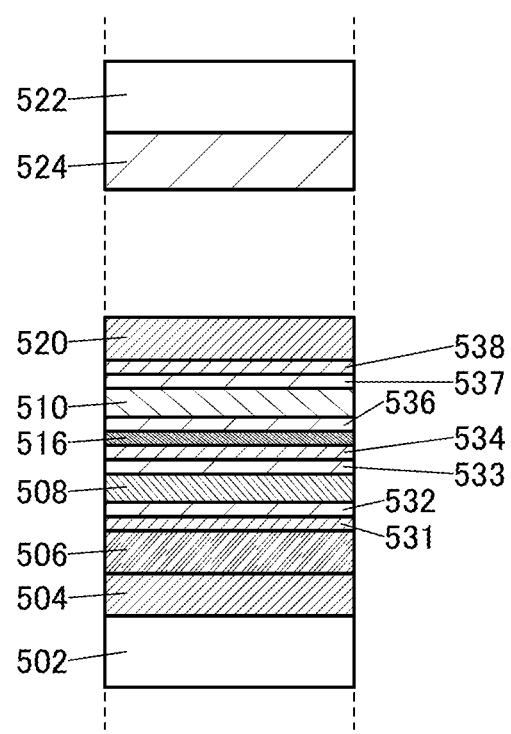
FIG. 50 is a cross-sectional view illustrating a light-emitting element of Example.

This example describes fabrication examples of light-emitting elements (light-emitting elements 1 to 6) each of which is one embodiment of the present invention and a light-emitting element for comparison (comparative light-emitting element 7). FIG. 50 is a schematic cross-sectional view of the light-emitting element fabricated in this example. Tables 3 to 6 show the details of the element structures of the light-emitting elements fabricated in this example. Furthermore, the materials described in Embodiment 1 and the following compounds were used.

[Chemical Formula 3]

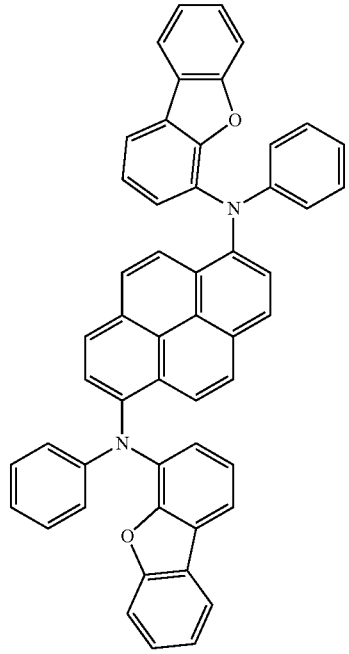

1,6FrAPrn-II

TABLE 3

|  | Layer | Reference numeral | Thickness (nm) | Material | Weight ratio *1) |
|---|---|---|---|---|---|
| Light-emitting element 1 | Optical element | 524 | — | CF(Red) | — |
|  | Upper electrode | 520 | 70 | ITO | — |
|  |  |  | 15 | Ag:Mg | 0.5:0.05 |
|  | Electron-injection layer | 538 | 1 | LiF | — |
|  | Electron-transport layer | 537 | 20 | Bphen | — |
|  |  |  | 15 | 2mDBTBPDBq-II | — |
|  | Light-emitting layer | 510 | 40 | 2mDBTBPDBq-II:PCBBiF:Ir(mpmppm)$_2$(acac) | 0.8:0.2:0.06 |
|  | Hole-transport layer | 536 | 20 | BPAFLP | — |
|  | Charge-generation layer | 516 | 12.5 | DBT3P-II:MoO$_3$ | 2:1 |
|  | Electron-injection layer | 534 | 2 | CuPc | — |
|  |  |  | 0.1 | Li$_2$O | — |
|  | Electron-transport layer | 533 | 15 | Bphen | — |
|  |  |  | 5 | cgDBCzPA | — |
|  | Light-emitting layer | 508 | 25 | cgDBCzPA:1,6FrAPrn-II | 1:0.05 |
|  | Hole-transport layer | 532 | 10 | PCPPn | — |
|  | Hole-injection layer | 531 | 27.5 | PCPPn:MoO$_3$ | 2:1 |
|  | Transparent conductive film | 506 | 80 | ITSO | — |
|  | Lower electrode | 504 | 100 | APC | — |
| Light-emitting element 2 | Optical element | 524 | — | CF(Green) | — |
|  | Upper electrode | 520 | 70 | ITO | — |
|  |  |  | 15 | Ag:Mg | 0.5:0.05 |
|  | Electron-injection layer | 538 | 1 | LiF | — |
|  | Electron-transport layer | 537 | 20 | Bphen | — |
|  |  |  | 15 | 2mDBTBPDBq-II | — |
|  | Light-emitting layer | 510 | 40 | 2mDBTBPDBq-II:PCBBiF:Ir(mpmppm)$_2$(acac) | 0.8:0.2:0.06 |
|  | Hole-transport layer | 536 | 20 | BPAFLP | — |
|  | Charge-generation layer | 516 | 12.5 | DBT3P-II:MoO$_3$ | 2:1 |
|  | Electron-injection layer | 534 | 2 | CuPc | — |
|  |  |  | 0.1 | Li$_2$O | — |
|  | Electron-transport layer | 533 | 15 | Bphen | — |
|  |  |  | 5 | cgDBCzPA | — |
|  | Light-emitting layer | 508 | 25 | cgDBCzPA:1,6FrAPrn-II | 1:0.05 |
|  | Hole-transport layer | 532 | 10 | PCPPn | — |
|  | Hole-injection layer | 531 | 35 | PCPPn:MoO$_3$ | 2:1 |
|  | Transparent conductive film | 506 | 30 | ITSO | — |
|  | Lower electrode | 504 | 100 | APC | — |

*1) Volume ratio is provided as the ratio of "Ag:Mg".

TABLE 4

|  | Layer | Reference numeral | Thickness (nm) | Material | Weight ratio *1) |
|---|---|---|---|---|---|
| Light-emitting element 3 | Optical element | 524 | — | CF(Blue-1) | — |
|  | Upper electrode | 520 | 70 | ITO | — |
|  |  |  | 15 | Ag:Mg | 0.5:0.05 |
|  | Electron-injection layer | 538 | 1 | LiF | — |
|  | Electron-transport layer | 537 | 20 | Bphen | — |
|  |  |  | 15 | 2mDBTBPDBq-II | — |
|  | Light-emitting layer | 510 | 40 | 2mDBTBPDBq-II:PCBBiF:Ir(mpmppm)$_2$(acac) | 0.8:0.2:0.06 |
|  | Hole-transport layer | 536 | 20 | BPAFLP | — |
|  | Charge-generation layer | 516 | 12.5 | DBT3P-II:MoO$_3$ | 2:1 |
|  | Electron-injection layer | 534 | 2 | CuPc | — |
|  |  |  | 0.1 | Li$_2$O | — |
|  | Electron-transport layer | 533 | 15 | Bphen | — |
|  |  |  | 5 | cgDBCzPA | — |
|  | Light-emitting layer | 508 | 25 | cgDBCzPA:1,6FrAPrn-II | 1:0.05 |
|  | Hole-transport layer | 532 | 10 | PCPPn | — |
|  | Hole-injection layer | 531 | 50 | PCPPn:MoO$_3$ | 2:1 |
|  | Transparent conductive film | 506 | 80 | ITSO | — |
|  | Lower electrode | 504 | 100 | APC | — |
| Light-emitting element 4 | Optical element | 524 | — | CF(Green) | — |
|  | Upper electrode | 520 | 70 | ITO | — |
|  |  |  | 15 | Ag:Mg | 0.5:0.05 |
|  | Electron-injection layer | 538 | 1 | LiF | — |
|  | Electron-transport layer | 537 | 20 | Bphen | — |
|  |  |  | 15 | 2mDBTBPDBq-II | — |
|  | Light-emitting layer | 510 | 40 | 2mDBTBPDBq-II:PCBBiF:Ir(mpmppm)$_2$(acac) | 0.8:0.2:0.06 |
|  | Hole-transport layer | 536 | 20 | BPAFLP | — |
|  | Charge-generation layer | 516 | 12.5 | DBT3P-II:MoO$_3$ | 2:1 |

TABLE 4-continued

| Layer | Reference numeral | Thickness (nm) | Material | Weight ratio *1) |
|---|---|---|---|---|
| Electron-injection layer | 534 | 2 | CuPc | — |
| | | 0.1 | Li2O | — |
| Electron-transport layer | 533 | 15 | Bphen | — |
| | | 5 | cgDBCzPA | — |
| Light-emitting layer | 508 | 25 | cgDBCzPA:1,6FrAPrn-II | 1:0.05 |
| Hole-transport layer | 532 | 10 | PCPPn | — |
| Hole-injection layer | 531 | 50 | PCPPn:MoO$_3$ | 2:1 |
| Transparent conductive film | 506 | 80 | ITSO | — |
| Lower electrode | 504 | 100 | APC | — |

*1) Volume ratio is provided as the ratio of "Ag:Mg".

TABLE 5

| | Layer | Reference numeral | Thickness (nm) | Material | Weight ratio *1) |
|---|---|---|---|---|---|
| Light-emitting element 5 | Optical element | 524 | — | CF(Yellow) | — |
| | Upper electrode | 520 | 70 | ITO | — |
| | | | 15 | Ag:Mg | 0.5:0.05 |
| | Electron-injection layer | 538 | 1 | LiF | — |
| | Electron-transport layer | 537 | 20 | Bphen | — |
| | | | 15 | 2mDBTBPDBq-II | — |
| | Light-emitting layer | 510 | 40 | 2mDBTBPDBq-II:PCBBiF:Ir(mpmppm)$_2$(acac) | 0.8:0.2:0.06 |
| | Hole-transport layer | 536 | 20 | BPAFLP | — |
| | Charge-generation layer | 516 | 12.5 | DBT3P-II:MoO$_3$ | 2:1 |
| | Electron-injection layer | 534 | 2 | CuPc | — |
| | | | 0.1 | Li$_2$O | — |
| | Electron-transport layer | 533 | 15 | Bphen | — |
| | | | 5 | cgDBCzPA | — |
| | Light-emitting layer | 508 | 25 | cgDBCzPA:1,6FrAPrn-II | 1:0.05 |
| | Hole-transport layer | 532 | 10 | PCPPn | — |
| | Hole-injection layer | 531 | 50 | PCPPn:MoO$_3$ | 2:1 |
| | Transparent conductive film | 506 | 30 | ITSO | — |
| | Lower electrode | 504 | 100 | APC | — |
| Light-emitting element 6 | Optical element | 524 | — | CF(Green) | — |
| | Upper electrode | 520 | 70 | ITO | — |
| | | | 15 | Ag:Mg | 0.5:0.05 |
| | Electron-injection layer | 538 | 1 | LiF | — |
| | Electron-transport layer | 537 | 20 | Bphen | — |
| | | | 15 | 2mDBTBPDBq-II | — |
| | Light-emitting layer | 510 | 40 | 2mDBTBPDBq-II:PCBBiF:Ir(mpmppm)$_2$(acac) | 0.8:0.2:0.06 |
| | Hole-transport layer | 536 | 20 | BPAFLP | — |
| | Charge-generation layer | 516 | 12.5 | DBT3P-II:MoO$_3$ | 2:1 |
| | Electron-injection layer | 534 | 2 | CuPc | — |
| | | | 0.1 | Li2O | — |
| | Electron-transport layer | 533 | 15 | Bphen | — |
| | | | 5 | cgDBCzPA | — |
| | Light-emitting layer | 508 | 25 | cgDBCzPA:1,6FrAPrn-II | 1:0.05 |
| | Hole-transport layer | 532 | 10 | PCPPn | — |
| | Hole-injection layer | 531 | 50 | PCPPn:MoO$_3$ | 2:1 |
| | Transparent conductive film | 506 | 30 | ITSO | — |
| | Lower electrode | 504 | 100 | APC | — |

*1) Volume ratio is provided as the ratio of "Ag:Mg".

TABLE 6

| | Layer | Reference numeral | Thickness (nm) | Material | Weight ratio *1) |
|---|---|---|---|---|---|
| Light-emitting element 7 | Optical element | 524 | — | CF(Blue-3) | — |
| | Upper electrode | 520 | 70 | ITO | — |
| | | | 15 | Ag:Mg | 0.5:0.05 |
| | Electron-injection layer | 538 | 1 | LiF | — |
| | Electron-transport layer | 537 | 20 | Bphen | — |
| | | | 15 | 2mDBTBPDBq-II | — |
| | Light-emitting layer | 510 | 40 | 2mDBTBPDBq-II:PCBBiF:Ir(mpmppm)$_2$(acac) | 0.8:0.2:0.06 |
| | Hole-transport layer | 536 | 20 | BPAFLP | — |
| | Charge-generation layer | 516 | 12.5 | DBT3P-II:MoO$_3$ | 2:1 |

TABLE 6-continued

| Layer | Reference numeral | Thickness (nm) | Material | Weight ratio *1) |
|---|---|---|---|---|
| Electron-injection layer | 534 | 2 | CuPc | — |
|  |  | 0.1 | Li$_2$O | — |
| Electron-transport layer | 533 | 15 | Bphen | — |
|  |  | 5 | cgDBCzPA | — |
| Light-emitting layer | 508 | 25 | cgDBCzPA:1,6FrAPrn-II | 1:0.05 |
| Hole-transport layer | 532 | 10 | PCPPn | — |
| Hole-injection layer | 531 | 50 | PCPPn:MoO$_3$ | 2:1 |
| Transparent conductive film | 506 | 80 | ITSO | — |
| Lower electrode | 504 | 100 | APC | — |

*1) Volume ratio is provided as the ratio of "Ag:Mg".

<1-1. Fabrication of Light-Emitting Element 1>

As a lower electrode 504, an APC film was formed to a thickness of 100 nm over a substrate 502.

As a transparent conductive film 506, an ITSO film was formed to a thickness of 80 nm over the lower electrode 504. Note that the electrode area of the lower electrode 504 was 4 mm$^2$ (2 mm×2 mm).

As a hole-injection layer 531, PCPPn and MoO$_3$ were deposited over the transparent conductive film 506 by co-evaporation such that the deposited layer has a weight ratio of PCPPn:MoO$_3$=2:1 and a thickness of 27.5 nm.

As a hole-transport layer 532, PCPPn was deposited by evaporation to a thickness of 10 nm over the hole-injection layer 531.

As a light-emitting layer 508, cgDBCzPA and N,N'-bis(dibenzofuran-4-yl)-N,N'-diphenyl-pyrene-1,6-diamine (1,6FrAPrn-II) were deposited over the hole-transport layer 532 by co-evaporation such that the deposited layer has a weight ratio of cgDBCzPA:1,6FrAPrn-II=1:0.05 and a thickness of 25 nm. Note that cgDBCzPA served as a host material and 1,6FrAPrn-II served as a fluorescent material (a guest material) in the light-emitting layer 508.

As an electron-transport layer 533, cgDBCzPA and Bphen were sequentially deposited over the light-emitting layer 508 by evaporation to a thickness of 5 nm and 15 nm, respectively.

As an electron-injection layer 534, Li$_2$O and CuPc were deposited by evaporation to a thickness of 0.1 nm and 2 nm, respectively.

As a charge-generation layer 516 also serving as a hole-injection layer, DBT3P-II and MoO$_3$ were deposited by co-evaporation such that the deposited layer has a weight ratio of DBT3P-II:MoO$_3$=2:1 and a thickness of 12.5 nm.

As a hole-transport layer 536, BPAFLP was deposited by evaporation to a thickness of 20 nm.

As a light-emitting layer 510, 2mDBTBPDBq-II, PCBBiF, and Ir(mpmppm)$_2$(acac) were deposited over the hole-transport layer 536 by co-evaporation such that the deposited layer has a weight ratio of 2mDBTBPDBq-II:PCBBiF:Ir(mpmppm)$_2$(acac)=0.8:0.2:0.06 and a thickness of 40 nm. Note that in the light-emitting layer 510, 2mDBTBPDBq-II served as a host material, PCBBiF served as an assist material, and Ir(mpmppm)$_2$(acac) served as a guest material.

Next, as an electron-transport layer 537, 2mDBTBPDBq-II and Bphen were sequentially deposited over the light-emitting layer 510 by evaporation to a thickness of 15 nm and 20 nm, respectively.

As an electron-injection layer 538, LiF was formed to a thickness of 1 nm. As an upper electrode 520, an alloy film of Ag and Mg and an ITO film were formed to a thickness of 15 nm and 70 nm, respectively. The alloy film of Ag and Mg was deposited by evaporation in a volume ratio of Ag:Mg=0.5:0.05.

Through the above steps, the components over the substrate 502 were formed. It is to be noted that an evaporation method using resistive heating was employed for all the evaporation steps. The ITO film of the upper electrode 520 was formed by a sputtering method.

As an optical element 524, a red (Red) color filter was provided for a sealing substrate 522 of the light-emitting element 1 as shown in Table 3.

Next, the sealing substrate 522 was fixed to the substrate 502 using a sealing member in a glove box containing a nitrogen atmosphere. In this manner, the light-emitting element was sealed. Specifically, the sealing member was applied to surround the light-emitting element over the substrate 502, the substrate 502 and the sealing substrate 522 were bonded to each other, irradiation with 365-nm ultraviolet light at 6 J/cm$^2$ was performed from the sealing substrate 522 side, and heat treatment was performed at 80° C. for 1 hour. Through the above steps, the light-emitting element 1 was obtained.

<1-2. Fabrication of Light-Emitting Element 2>

The light-emitting element 2 was fabricated through the same steps as those for the above-mentioned light-emitting element 1 except steps mentioned below.

As the transparent conductive film 506, an ITSO film was formed to a thickness of 30 nm over the lower electrode 504. As the hole-injection layer 531, PCPPn and MoO$_3$ were deposited over the transparent conductive film 506 by co-evaporation such that the deposited layer has a weight ratio of PCPPn:MoO$_3$=2:1 and a thickness of 35 nm.

As the optical element 524, a green (Green) color filter was provided for the sealing substrate 522 of the light-emitting element 2 as shown in Table 3.

<1-3. Fabrication of Light-Emitting Element 3>

The light-emitting element 3 was fabricated through the same steps as those for the above-mentioned light-emitting element 1 except steps mentioned below.

As the transparent conductive film 506, an ITSO film was formed to a thickness of 80 nm over the lower electrode 504. As the hole-injection layer 531, PCPPn and MoO$_3$ were deposited on the transparent conductive film 506 by co-evaporation such that the deposited layer has a weight ratio of PCPPn:MoO$_3$=2:1 and a thickness of 50 nm.

As the optical element 524, a blue (Blue-1) color filter was provided for the sealing substrate 522 of the light-emitting element 3 as shown in Table 4.

<1-4. Fabrication of Light-Emitting Element 4>

The light-emitting element 4 was fabricated through the same steps as those for the above-mentioned light-emitting element 1 except steps mentioned below.

As the transparent conductive film 506, an ITSO film was formed to a thickness of 80 nm over the lower electrode 504. As the hole-injection layer 531, PCPPn and MoO$_3$ were deposited on the transparent conductive film 506 by co-evaporation such that the deposited layer has a weight ratio of PCPPn:MoO$_3$=2:1 and a thickness of 50 nm.

As the optical element 524, a blue (Blue-2) color filter was provided for the sealing substrate 522 of the light-emitting element 4 as shown in Table 4.

<1-5. Fabrication of Light-Emitting Element 5>

The light-emitting element 5 was fabricated through the same steps as those for the above-mentioned light-emitting element 1 except steps mentioned below.

As the transparent conductive film 506, an ITSO film was formed to a thickness of 30 nm over the lower electrode 504. As the hole-injection layer 531, PCPPn and $MoO_3$ were deposited on the transparent conductive film 506 by co-evaporation such that the deposited layer has a weight ratio of PCPPn:$MoO_3$=2:1 and a thickness of 50 nm.

As the optical element 524, a yellow (Yellow) color filter was provided for the sealing substrate 522 of the light-emitting element 5 as shown in Table 5.

<1-6. Fabrication of Light-Emitting Element 6>

The light-emitting element 6 was fabricated through the same steps as those for the above-mentioned light-emitting element 1 except steps mentioned below.

As the transparent conductive film 506, an ITSO film was formed to a thickness of 30 nm over the lower electrode 504. As the hole-injection layer 531, PCPPn and $MoO_3$ were deposited on the transparent conductive film 506 by co-evaporation such that the deposited layer has a weight ratio of PCPPn:$MoO_3$=2:1 and a thickness of 50 nm.

As shown in Table 5, the optical element 524 was not provided for the sealing substrate 522 of the light-emitting element 6. Note that a difference between the light-emitting element 5 and the light-emitting element 6 is the presence of the optical element 524.

<1-7. Fabrication of Comparative Light-Emitting Element 7>

The comparative light-emitting element 7 was fabricated through the same steps as those for the above-mentioned light-emitting element 1 except steps mentioned below.

As the transparent conductive film 506, an ITSO film was formed to a thickness of 80 nm over the lower electrode 504. As the hole-injection layer 531, PCPPn and $MoO_3$ were deposited on the transparent conductive film 506 by co-evaporation such that the deposited layer has a weight ratio of PCPPn:$MoO_3$=2:1 and a thickness of 50 nm.

As the optical element 524, a blue (Blue-3) color filter was provided for the sealing substrate 522 of the comparative light-emitting element 7 as shown in Table 6.

<1-8. Characteristics of Light-Emitting Elements>

Figure 51A:
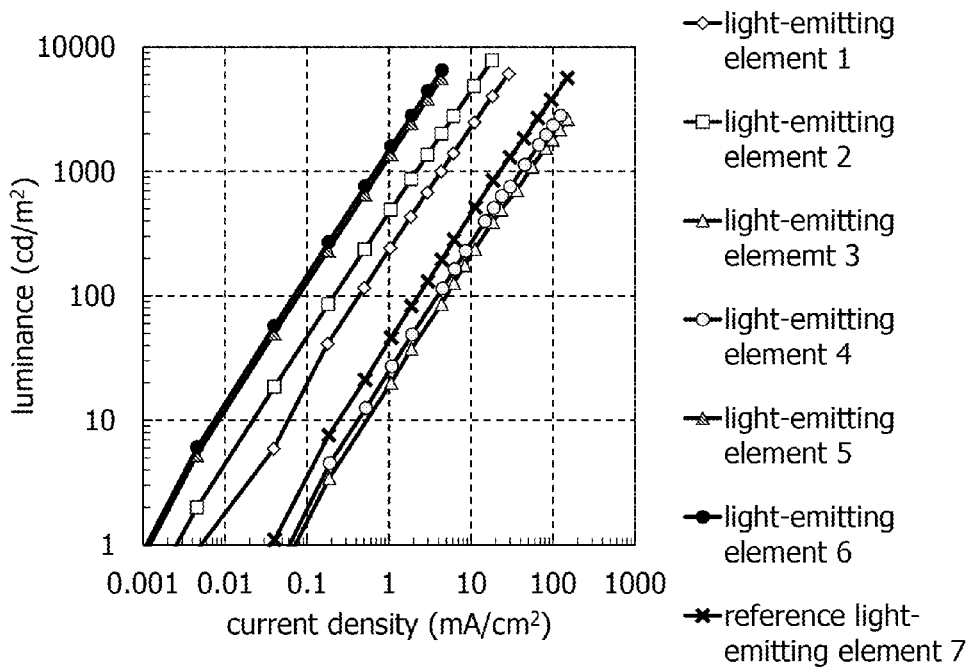
FIGS. 51A and 51B show luminance versus current density characteristics and luminance versus voltage characteristics of light-emitting elements of Example.
Figure 51B:
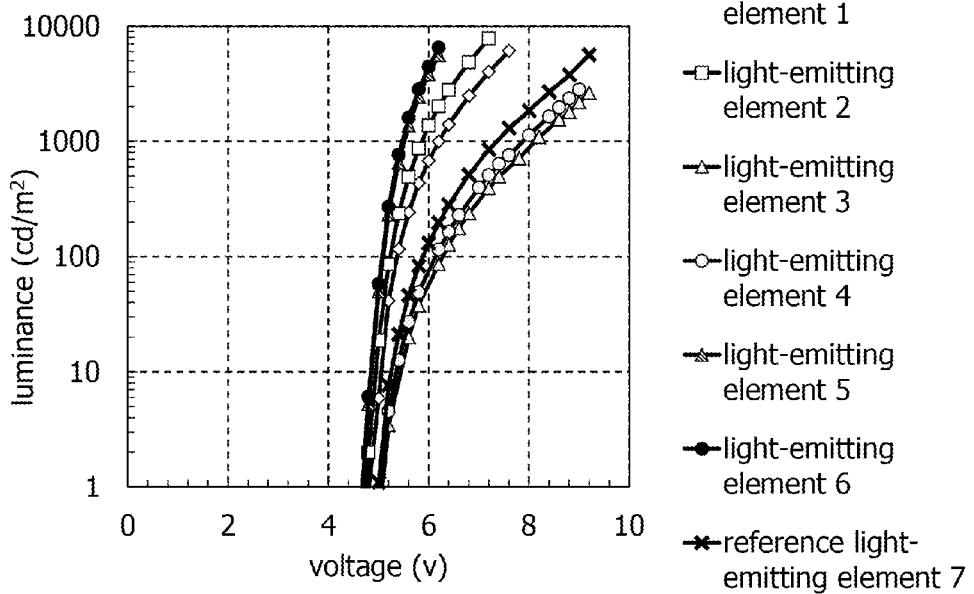
Figure 52A:
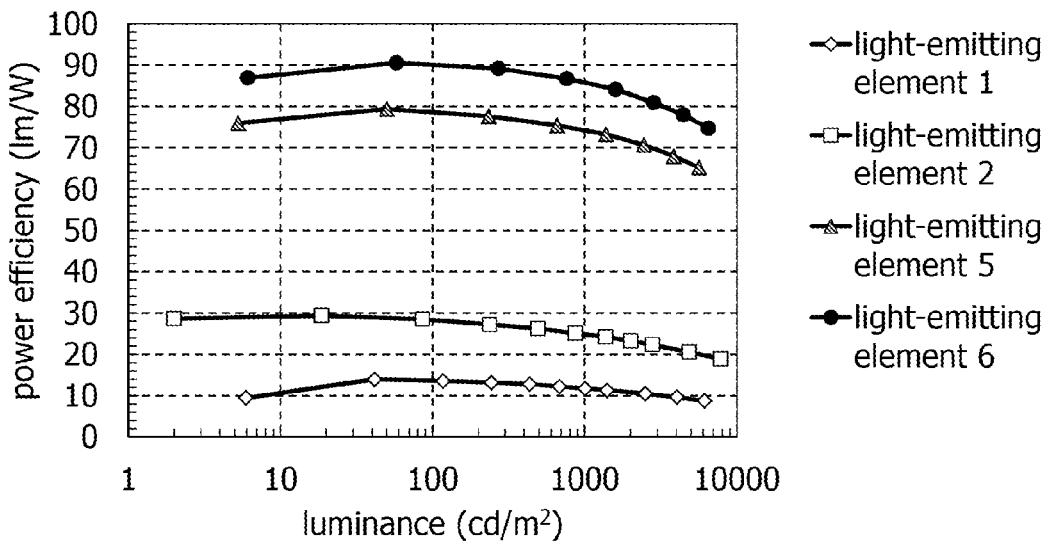
FIGS. 52A and 52B show power efficiency versus luminance characteristics of light-emitting elements of Example.
Figure 52B:
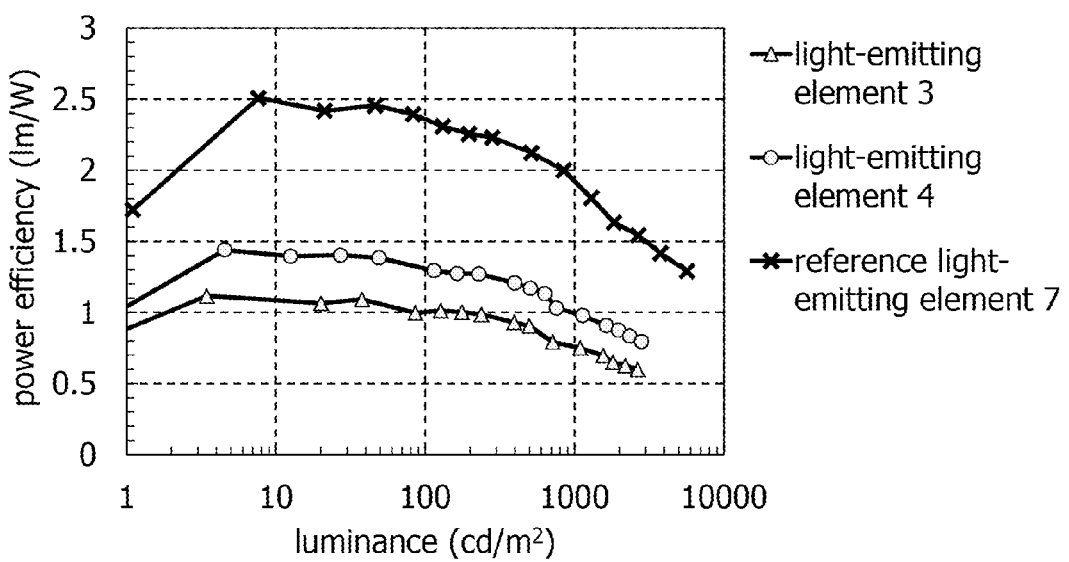
Figure 53A:
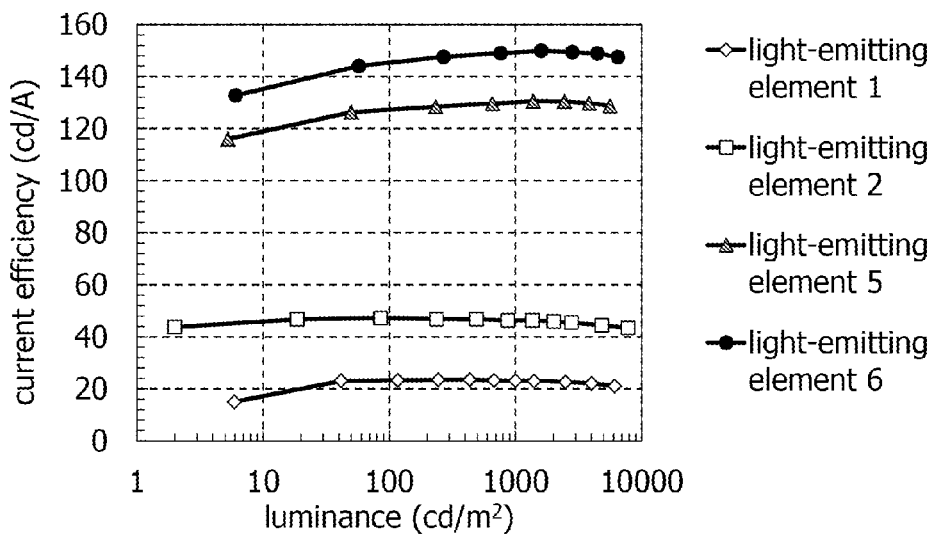
FIGS. 53A and 53B show current efficiency versus luminance characteristics of light-emitting elements of Example.
Figure 53B:
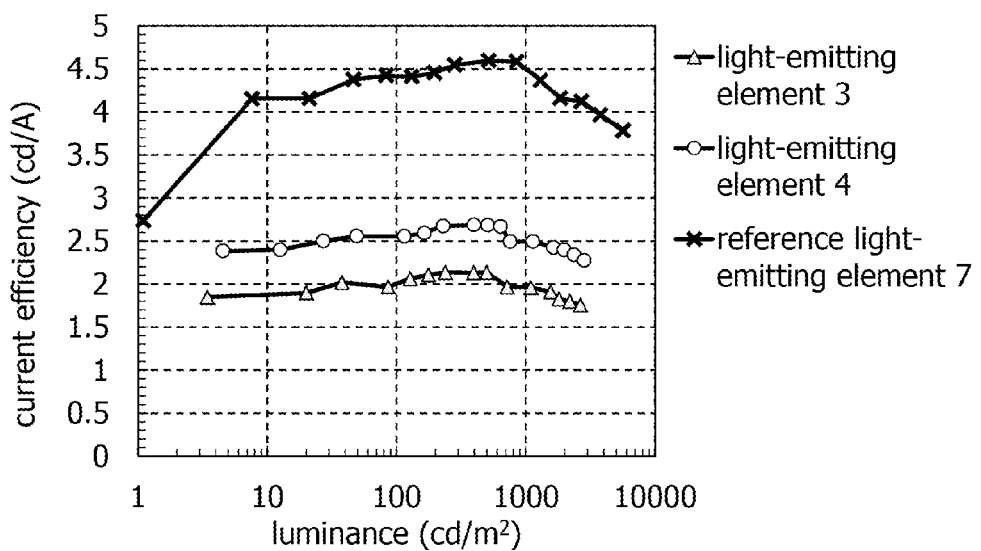

FIG. 51A and FIG. 51B show luminance versus current density characteristics and luminance versus voltage characteristics, respectively, of the light-emitting elements 1 to 6 and the comparative light-emitting element 7 which were fabricated. FIG. 52A shows power efficiency versus luminance characteristics of the light-emitting elements 1, 2, 5, and 6. FIG. 52B shows power efficiency versus luminance characteristics of the light-emitting elements 3 and 4 and the comparative light-emitting element 7. FIG. 53A shows current efficiency versus luminance characteristics of the light-emitting elements 1, 2, 5, and 6. FIG. 53B shows current efficiency versus luminance characteristics of the light-emitting elements 3 and 4 and the comparative light-emitting element 7. Note that the measurement for each light-emitting element was carried out at room temperature (in the atmosphere maintained at 25° C.).

Table 7 shows the element characteristics of the light-emitting elements 1 to 6 and the comparative light-emitting element 7 at around 1000 $cd/m^2$.

TABLE 7

| | Voltage (V) | Current (mA) | Current density ($mA/cm^2$) | Chromaticity (x, y) | Luminance ($cd/m^2$) | Current efficiency (cd/A) |
|---|---|---|---|---|---|---|
| Light-emitting element 1 | 6.2 | 0.17 | 4.3 | (0.66, 0.34) | 1000 | 23.2 |
| Light-emitting element 2 | 5.8 | 0.075 | 1.9 | (0.32, 0.67) | 867 | 46.3 |
| Light-emitting element 3 | 8.2 | 2.2 | 56 | (0.14, 0.036) | 1090 | 1.96 |
| Light-emitting element 4 | 7.6 | 1.2 | 30 | (0.15, 0.045) | 756 | 2.49 |
| Light-emitting element 5 | 5.4 | 0.020 | 0.51 | (0.39, 0.60) | 657 | 130 |
| Light-emitting element 6 | 5.4 | 0.020 | 0.51 | (0.39, 0.60) | 763 | 149 |
| Comparative light-emitting element 7 | 7.2 | 0.74 | 19 | (0.16, 0.067) | 851 | 4.58 |

Figure 54:
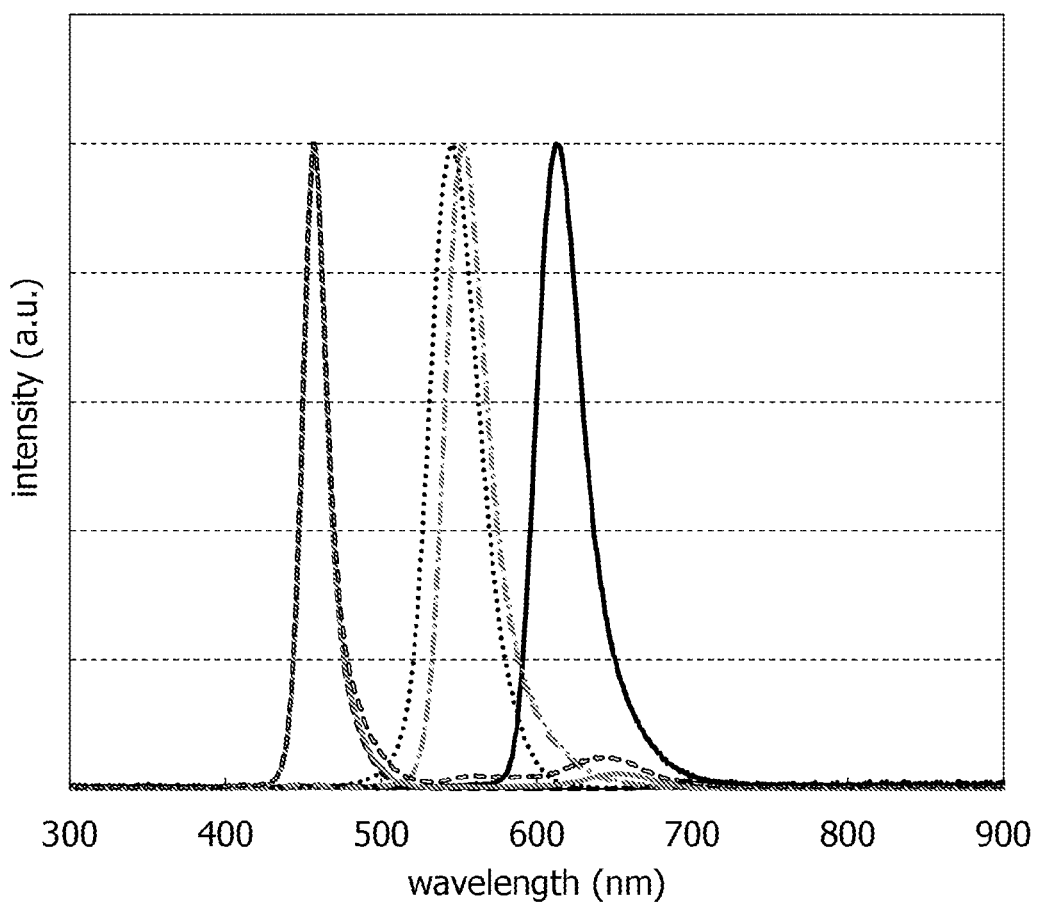
FIG. 54 shows electroluminescence spectra of light emitted from light-emitting elements of Example.

FIG. 54 shows electroluminescence spectra when a current at a current density of 2.5 $mA/cm^2$ was supplied to the light-emitting elements 1 to 6 and the comparative light-emitting element 7.

As shown in FIGS. 51A and 51B, FIGS. 52A and 52B, and FIGS. 53A and 53B and Table 7, the light-emitting element 1 emitted red light with high color purity and high emission efficiency. The light-emitting element 2 emitted green light with high color purity and high emission efficiency. The light-emitting elements 3 and 4 emitted blue light with high color purity and high emission efficiency. The light-emitting elements 5 and 6 emitted yellow light with high color purity and high emission efficiency.

As shown in FIG. 54, the light-emitting element 1 emitted red light with a narrow spectral line half-width and high color purity. Furthermore, the light-emitting element 2 emitted green light with a narrow spectral line half-width and high color purity. Furthermore, the light-emitting elements 3 and 4 emitted blue light with a narrow spectral line half-width and high color purity. Furthermore, the light-emitting elements 5 and 6 emitted yellow light with a narrow spectral line half-width and high color purity. Although the comparative light-emitting element 7 emitted blue light with a narrow spectral line half-width, color purity of the light was low because an emission spectrum of the light had a local maximum value in a red region from 530 nm to 680 nm.

Note that the chromaticity of monochromatic light having a wavelength of 530 nm is (x, y)=(0.155, 0.806), and the chromaticity of monochromatic light having a wavelength of 680 nm is (x, y)=(0.733, 0.267). The chromaticity of blue, e.g., the chromaticity of blue in the National Television System Committee (NTSC) color gamut is (x, y)=(0.140, 0.080). That is, chromaticity coordinates (x,y) of light with a wavelength of greater than or equal to 530 nm and less than or equal to 680 nm are larger than those of blue. Therefore, in the case where a certain amount of light with a wavelength of greater than or equal to 530 nm and less than or equal to 680 nm is mixed with blue light, at least one of chromaticity coordinates x and y is increased, leading to a reduction in color purity. In view of this, the intensity of light with a wavelength of greater than or equal to 530 nm and less than or equal to 680 nm is desirably low in order to obtain blue light emission with high color purity.

Figure 55:
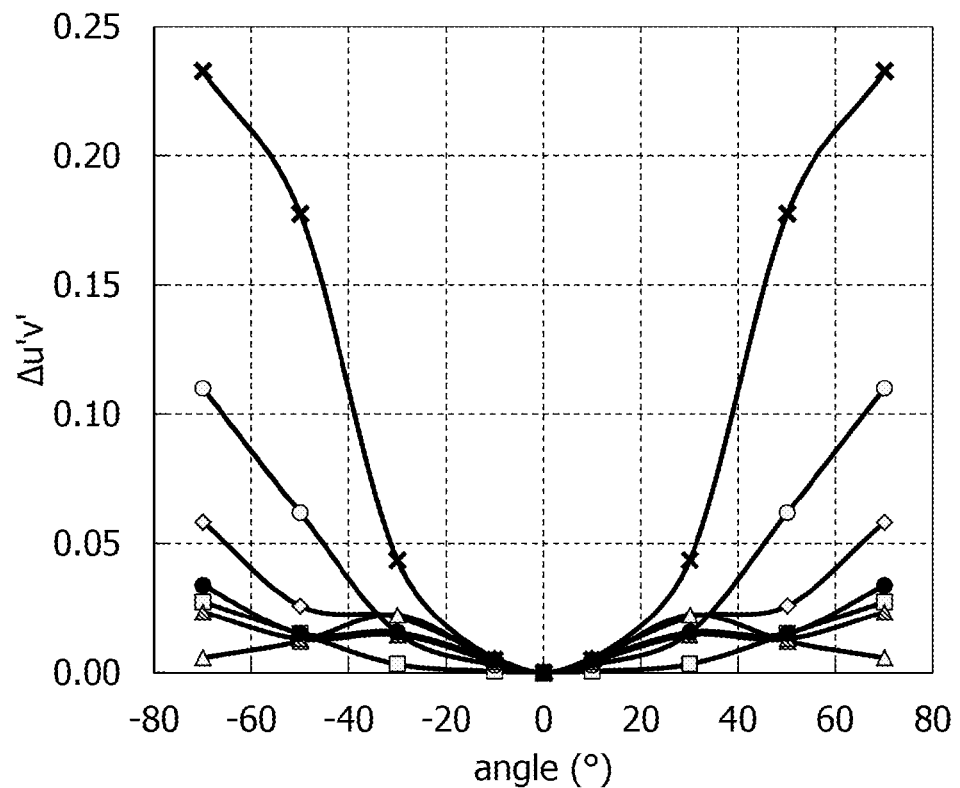
FIG. 55 illustrates the chromaticity differences Δu'v' of light-emitting elements of Example.
Figure 56A:
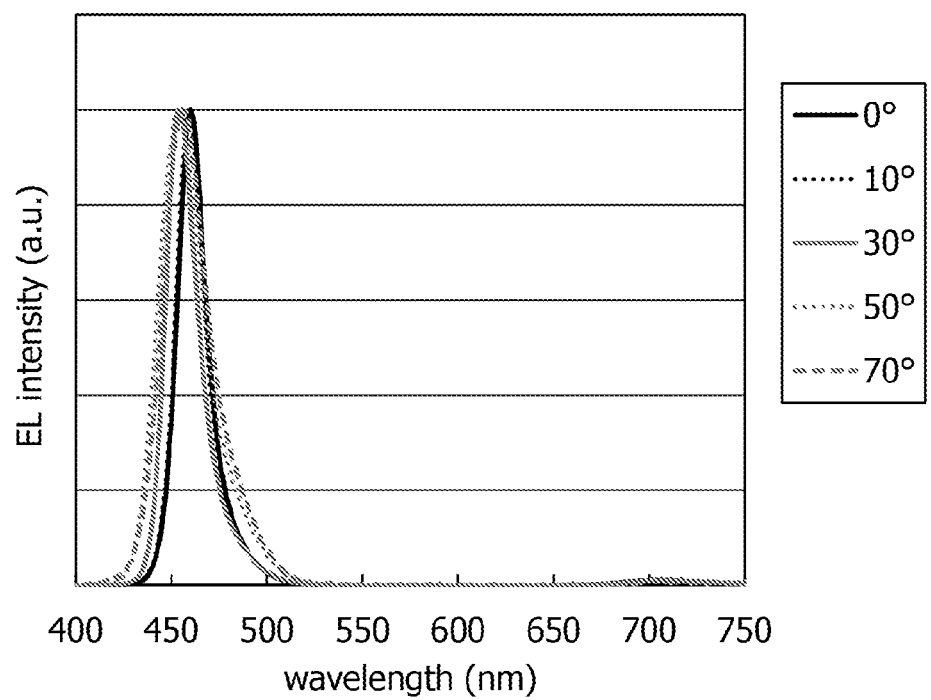
FIGS. 56A and 56B are each measurement results of electroluminescence spectra of light extracted at angles of 0°, 10°, 30°, 50°, and 70° to the normal vector of a light-emitting element of Example.
Figure 56B:
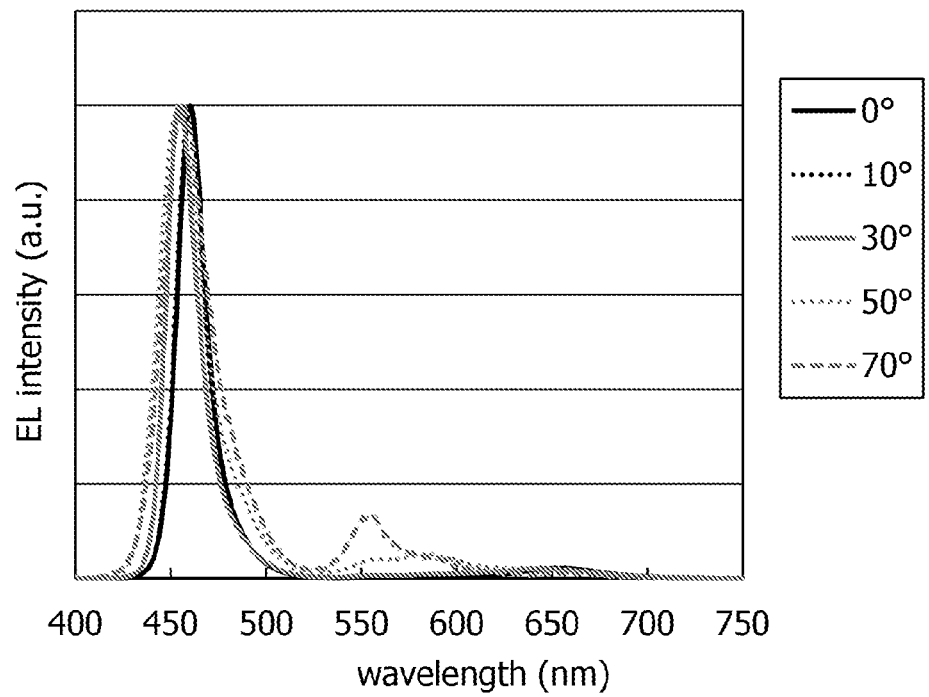
Figure 57:
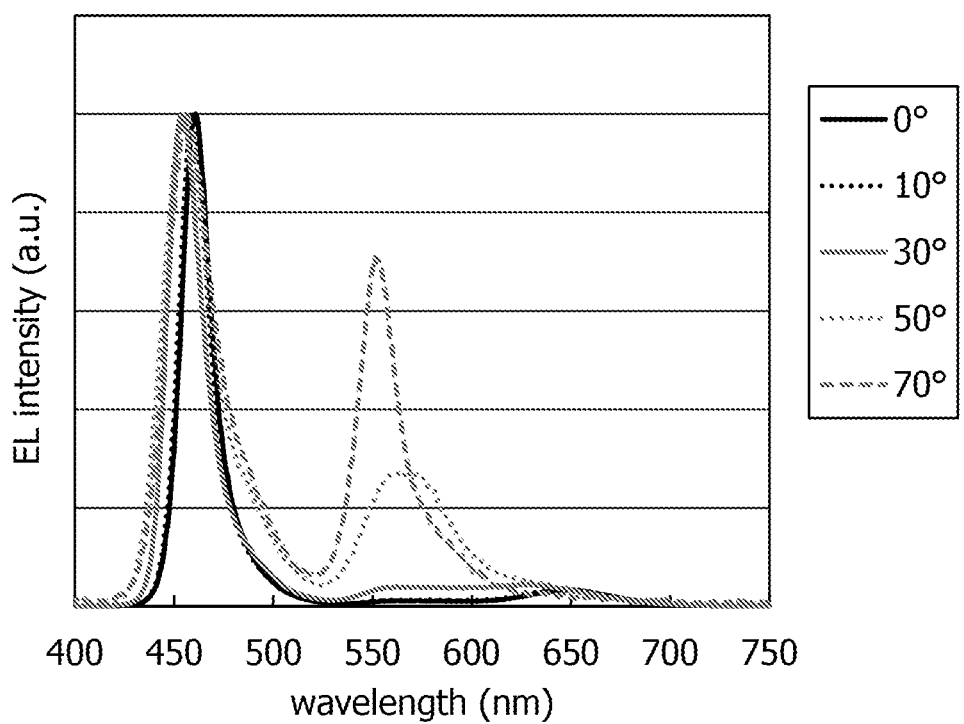
FIG. 57 shows measurement results of electroluminescence spectra of light extracted at angles of 0°, 10°, 30°, 50°, and 70° to the normal vector of a light-emitting element of Example.

FIG. 55 and Table 8 show the results of calculating a chromaticity difference Δu'v' between light in the oblique direction and light in the front direction to evaluate viewing angle dependence of chromaticity of each of the light-emitting elements 1 to 6 and the comparative light-emitting element 7. FIG. 56A shows measured emission spectra of light emitted from the light-emitting element 3 in the front direction and the oblique directions. FIG. 56B shows measured emission spectra of light emitted from the light-emitting element 4 in the front direction and the oblique directions. FIG. 57 shows measured emission spectra of light emitted from the comparative light-emitting element 7 in the front direction and the oblique directions. Table 9 shows the wavelengths of the third local maximum values and the fourth local maximum values of the emission spectra shown in FIG. 56A, and the like. Table 10 shows the wavelengths of the third local maximum values and the fourth local maximum values of the emission spectra shown in FIG. 56B, and the like. Table 11 shows the wavelengths of the third local maximum values and the fourth local maximum values of the emission spectra shown in FIG. 57, and the like.

TABLE 8

| | Viewing angle dependence of chromaticity (Δu'v') | | | | |
|---|---|---|---|---|---|
| | Δu'v'(0°) | Δu'v'(10°) | Δu'v'(30°) | Δu'v'(50°) | Δu'v'(70°) |
| Light-emitting element 1 | 0.00 | 0.0056 | 0.021 | 0.026 | 0.058 |
| Light-emitting element 2 | 0.00 | 0.00058 | 0.0033 | 0.015 | 0.027 |
| Light-emitting element 3 | 0.00 | 0.0042 | 0.022 | 0.012 | 0.0057 |
| Light-emitting element 4 | 0.00 | 0.0029 | 0.015 | 0.062 | 0.11 |
| Light-emitting element 5 | 0.00 | 0.0042 | 0.015 | 0.013 | 0.023 |
| Light-emitting element 6 | 0.00 | 0.0050 | 0.016 | 0.015 | 0.034 |
| Comparative light-emitting element 7 | 0.00 | 0.0049 | 0.043 | 0.18 | 0.23 |

TABLE 9

| Angle (°) *1) | Wavelength of third local maximum value (nm) | Wavelength of fourth local maximum value (nm) | Intensity of fourth local maximum value *2) | Intensity ratio of fourth local maximum value to third local maximum value (%) |
|---|---|---|---|---|
| 0 | 460 | 709 | 0.011 | 1.1 |
| 10 | 459 | 704 | 0.011 | 1.1 |
| 30 | 454 | 701 | 0.010 | 1.0 |
| 50 | 454 | 714 | 0.015 | 1.5 |
| 70 | 456 | 919 | 0.014 | 1.4 |

TABLE 10

| Angle (°) *1) | Wavelength of third local maximum value (nm) | Wavelength of fourth local maximum value (nm) | Intensity of fourth local maximum value *2) | Intensity ratio of fourth local maximum value to third local maximum value (%) |
|---|---|---|---|---|
| 0 | 460 | 653 | 0.023 | 2.3 |
| 10 | 460 | 653 | 0.022 | 2.2 |
| 30 | 455 | 643 | 0.021 | 2.1 |
| 50 | 454 | 582 | 0.053 | 5.3 |
| 70 | 456 | 555 | 0.134 | 13.4 |

TABLE 11

| Angle (°) *1) | Wavelength of third local maximum value (nm) | Wavelength of fourth local maximum value (nm) | Intensity of fourth local maximum value *2) | Intensity ratio of fourth local maximum value to third local maximum value (%) |
|---|---|---|---|---|
| 0 | 461 | 646 | 0.034 | 3.4 |
| 10 | 459 | 643 | 0.034 | 3.4 |
| 30 | 454 | 625 | 0.045 | 4.5 |
| 50 | 454 | 568 | 0.276 | 27.6 |
| 70 | 456 | 551 | 0.709 | 70.9 |

*1) The angle of extracted light with respect to the normal vector of the light emission surface.
*2) The intensity of the fourth local maximum value when the normalized third local maximum value is taken as 1.

Note that the chromaticity difference Δu'v' was calculated in the following manner. A current at a current density of 2.5 mA/cm² was supplied to each light-emitting element, and electroluminescence spectra were measured in the front direction and the oblique directions (at angles of 0° to 70°). Relative values of tristimulus values (X, Y, and Z) were calculated from the electroluminescence spectra using Formulae (5) to (7) below.

[Formula 5]

$$X = \sum_{380}^{780} S(\lambda)x(\lambda)\Delta\lambda \quad (5)$$

[Formula 6]

$$Y = \sum_{380}^{780} S(\lambda)y(\lambda)\Delta\lambda \quad (6)$$

[Formula 7]

$$Z = \sum_{380}^{780} S(\lambda)z(\lambda)\Delta\lambda \quad (7)$$

Note that in Formulae (5) to (7), S(λ) is an emission spectrum, x(λ), y(λ), and z(λ) are color matching functions in the XYZ color system, and λ is a wavelength.

Furthermore, chromaticity coordinates (u',v') in the CIE 1976 chromaticity system were calculated from the relative values of tristimulus values (X, Y, and Z) using Formulae (8) and (9) below.

[Formula 8]
$$u' = \frac{4X}{X + 15Y + 3Z} \quad (8)$$

[Formula 9]
$$v' = \frac{9Y}{X + 15Y + 3Z} \quad (9)$$

Furthermore, Δu'v'(θ₁), a chromaticity difference between 0° and the oblique direction in the obtained chromaticity (u', v'), was calculated using Formula (10) below.

[Formula 10]
$$\Delta u',v'(\theta_1) = ((u'(\theta_1) - u'(0°))^2 + (v'(\theta_1) - v'(0°))^2)^{0.5} \quad (10)$$

In Formula (10), u'(θ₁) is a chromaticity coordinate u' at angles of 0° to 70°, and v'(θ₁) is a chromaticity coordinate v' at angles of 0° to 70°. An angle θ₁ in the oblique direction is an angle with respect to the normal vector of a light emission surface whose normal direction is assumed to be 0°.

As shown in FIG. 55, the chromaticity difference Δu'v' at angles of 0° to 70° was less than 0.15 in the light-emitting elements 1 to 6, which means that the viewing angle dependence of chromaticity is small. In particular, Δu'v'(70°) of the light-emitting element 3 was 0.0057, which is an extremely small and excellent value. However, the chromaticity difference Δu'v'(70°) of the comparative light-emitting element 7 was as large as 0.23, which means that the viewing angle dependence of chromaticity is large.

Note that in the light-emitting elements 3 and 4 and the comparative light-emitting element 7, structures formed over the substrates 502 are the same whereas materials of the color filters each serving as the optical element 524 provided on the sealing substrate 522 side are different from each other. Specifically, the materials of the color filters used in the light-emitting elements 3 and 4 and the comparative light-emitting element 7 include regions whose transmittances with respect to light with a wavelength of greater than or equal to 530 nm and less than or equal to 680 nm are low in the order of the light-emitting element 3 (Blue-1)<the light-emitting element 4 (Blue-2)<the comparative light-emitting element 7 (Blue-3). The order of Δu'v'(70°), the chromaticity differences at 70°, was as follows: the light-emitting element 3 (Blue-1) <the light-emitting element 4 (Blue-2)<the comparative light-emitting element 7 (Blue-3). Therefore, the use of the optical element including the region having a low transmittance of light with a wavelength of greater than or equal to 530 nm and less than or equal to 680 nm can achieve an element with a small chromaticity difference Δu'v' and small viewing angle dependence of chromaticity.

As shown in FIGS. 56A and 56B, FIG. 57, and Tables 9 to 11, the intensity ratio of the fourth local maximum value to the third local maximum value in each of the light-emitting elements 3 and 4 was sufficiently small, i.e., lower than or equal to 15% at angles of 0° to 70°. This indicates that each of the light-emitting elements 3 and 4 had small viewing angle dependence. In particular, the intensity ratio of the fourth local maximum value to the third local maximum value in the light-emitting element 3 was lower than or equal to 3%, which was an extremely small and excellent value. In contrast, the intensity ratio of the fourth local maximum value to the third local maximum value in the comparative light-emitting element 7 exceeded 15% at angles of 50° and 70°. This indicates that the comparative light-emitting element 7 had large viewing angle dependence of chromaticity. Consequently, using the optical element including the region having a low transmittance of light with a wavelength of greater than or equal to 530 nm and less than or equal to 680 nm can achieve an element with small viewing angle dependence.

As described above, using the structure of one embodiment of the present invention can achieve a light-emitting device with high color purity, small viewing angle dependence of chromaticity, and high emission efficiency.

The structure described above in this example can be combined with any of the structures described in the other embodiments as appropriate.

This application is based on Japanese Patent Application serial no. 2014-162237 filed with Japan Patent Office on Aug. 8, 2014 and Japanese Patent Application serial no. 2014-162234 filed with Japan Patent Office on Aug. 8, 2014, the entire contents of which are hereby incorporated by reference.

What is claimed is:

1. A light-emitting device comprising first to third light-emitting elements and first to third optical elements,
    wherein a spectrum of light emitted from the first light-emitting element through the first optical element has a first local maximum value in a wavelength range of greater than or equal to 600 nm and less than or equal to 740 nm,
    wherein a spectrum of light emitted from the second light-emitting element through the second optical element has a second local maximum value in a wavelength range of greater than or equal to 480 nm and less than 550 nm,
    wherein a spectrum of light emitted from the third light-emitting element through the third optical element in a range of greater than 0° and less than or equal to 70° with respect to a normal vector of the third light-emitting element has a third local maximum value in a wavelength range of greater than or equal to 400 nm and less than 480 nm and a fourth local maximum value located on a longer wavelength side than the third local maximum value, and
    wherein an intensity ratio of the fourth local maximum value to the third local maximum value is less than or equal to 15%.

2. The light-emitting device according to claim 1,
    wherein the first optical element has a region whose transmittance with respect to light with a wavelength of greater than or equal to 570 nm and less than or equal to 800 nm is greater than or equal to 50%,
    wherein the second optical element has a region whose transmittance with respect to light with a wavelength of greater than or equal to 480 nm and less than 570 nm is greater than or equal to 50%, and
    wherein the third optical element has a region whose transmittance with respect to light with a wavelength of greater than or equal to 400 nm and less than 480 nm is greater than or equal to 50% and a region whose transmittance with respect to light with a wavelength of greater than or equal to 530 nm and less than or equal to 680 nm is less than or equal to 20%.

3. The light-emitting device according to claim 1, wherein the first to third light-emitting elements each comprise:
- a lower electrode;
- a transparent conductive film over the lower electrode;
- a first light-emitting layer over the transparent conductive film;
- a second light-emitting layer over the first light-emitting layer; and
- an upper electrode over the second light-emitting layer.

4. The light-emitting device according to claim 3, further comprising a charge-generation layer between the first light-emitting layer and the second light-emitting layer.

5. The light-emitting device according to claim 3,
wherein the first light-emitting layer emits blue light, and
wherein the second light-emitting layer emits yellow light.

6. The light-emitting device according to claim 3, further comprising a third light-emitting layer between the second light-emitting layer and the upper electrode.

7. The light-emitting device according to claim 6, further comprising a charge-generation layer between the first light-emitting layer and the second light-emitting layer,
wherein the second light-emitting layer and the third light-emitting layer are in contact with each other.

8. The light-emitting device according to claim 6,
wherein the first light-emitting layer emits blue light,
wherein the second light-emitting layer emits green light, and
wherein the third light-emitting layer emits red light.

9. The light-emitting device according to claim 6,
wherein an optical path length between the lower electrode of the first light-emitting element and the third light-emitting layer is around $3\lambda/4$,
wherein an optical path length between the lower electrode of the second light-emitting element and the second light-emitting layer is around $3\lambda/4$, and
wherein an optical path length between the lower electrode of the third light-emitting element and the first light-emitting layer is around $3\lambda/4$.

10. The light-emitting device according to claim 3,
wherein the lower electrode is capable of reflecting visible light, and
wherein the upper electrode is capable of reflecting and transmitting visible light.

11. The light-emitting device according to claim 3, wherein the lower electrode contains silver.

12. The light-emitting device according to claim 3, wherein the transparent conductive film of the third light-emitting element has a larger thickness than the transparent conductive film of each of the first and second light-emitting elements.

13. The light-emitting device according to claim 3, wherein a distance between the first light-emitting layer and the lower electrode of the third light-emitting element is longer than a distance between the first light-emitting layer and the lower electrode of each of the first and second light-emitting elements.

14. An electronic device comprising:
the light-emitting device according to claim 1; and
a housing and/or a touch sensor.

15. A lighting device comprising:
the light-emitting device according to claim 1; and
a housing and/or a touch sensor.

16. A light-emitting device comprising first to fourth light-emitting elements and first to third optical elements,
wherein a spectrum of light emitted from the first light-emitting element through the first optical element has a first local maximum value in a wavelength range of greater than or equal to 600 nm and less than or equal to 740 nm,
wherein a spectrum of light emitted from the second light-emitting element through the second optical element has a second local maximum value in a wavelength range of greater than or equal to 480 nm and less than 550 nm,
wherein a spectrum of light emitted from the third light-emitting element through the third optical element in a range of greater than 0° and less than or equal to 70° with respect to a normal vector of the third light-emitting element has a third local maximum value in a wavelength range of greater than or equal to 400 nm and less than 480 nm and a fourth local maximum value located on a longer wavelength side than the third local maximum value,
wherein a spectrum of light emitted from the fourth light-emitting element has a fifth local maximum value in a wavelength range of greater than or equal to 550 nm and less than 600 nm, and
wherein an intensity ratio of the fourth local maximum value to the third local maximum value is less than or equal to 15%.

17. The light-emitting device according to claim 16, further comprising a fourth optical element, through which the light is emitted from the fourth light-emitting element.

18. The light-emitting device according to claim 16,
wherein the first optical element has a region whose transmittance with respect to light with a wavelength of greater than or equal to 570 nm and less than or equal to 800 nm is greater than or equal to 50%,
wherein the second optical element has a region whose transmittance with respect to light with a wavelength of greater than or equal to 480 nm and less than 570 nm is greater than or equal to 50%, and
wherein the third optical element has a region whose transmittance with respect to light with a wavelength of greater than or equal to 400 nm and less than 480 nm is greater than or equal to 50% and a region whose transmittance with respect to light with a wavelength of greater than or equal to 530 nm and less than or equal to 680 nm is less than or equal to 20%.

19. The light-emitting device according to claim 16, wherein the first to fourth light-emitting elements each comprise:
- a lower electrode;
- a transparent conductive film over the lower electrode;
- a first light-emitting layer over the transparent conductive film;
- a second light-emitting layer over the first light-emitting layer; and
- an upper electrode over the second light-emitting layer.

20. The light-emitting device according to claim 19, wherein the transparent conductive film of the third light-emitting element has a larger thickness than the transparent conductive film of each of the first, second, and fourth light-emitting elements.

21. The light-emitting device according to claim 19, wherein a distance between the first light-emitting layer and the lower electrode of the third light-emitting element is longer than a distance between the first light-emitting layer and the lower electrode of each of the first, second, and fourth light-emitting elements.

* * * * *